United States Patent
Ichikawa et al.

(10) Patent No.: US 8,295,093 B2
(45) Date of Patent: Oct. 23, 2012

(54) MULTI-DOT FLASH MEMORY

(75) Inventors: Takashi Ichikawa, Saitama (JP);
Hiroshi Watanabe, Yokohama (JP)

(73) Assignee: Kabishiki Kaisha Toshiba, Tokyo (JP)

( * ) Notice: Subject to any disclaimer, the term of this patent is extended or adjusted under 35 U.S.C. 154(b) by 281 days.

(21) Appl. No.: 12/765,478

(22) Filed: Apr. 22, 2010

(65) Prior Publication Data

US 2011/0038213 A1 Feb. 17, 2011

(30) Foreign Application Priority Data

Aug. 17, 2009 (JP) ................................. 2009-188637

(51) Int. Cl.
*G11C 11/34* (2006.01)
*G11C 16/04* (2006.01)

(52) U.S. Cl. ......... 365/185.18; 365/185.05; 365/185.22; 365/185.24; 365/185.29; 365/185.33

(58) Field of Classification Search ............. 365/185.05, 365/185.18, 185.22, 185.24, 185.29, 185.33
See application file for complete search history.

(56) References Cited

U.S. PATENT DOCUMENTS

| 2007/0247906 A1* | 10/2007 | Watanabe et al. ........ 365/185.14 |
| 2010/0214840 A1* | 8/2010 | Ichikawa et al. ......... 365/185.17 |
| 2011/0032762 A1 | 2/2011 | Watanabe et al. |

FOREIGN PATENT DOCUMENTS

| JP | 2003-243615 | 8/2003 |
| JP | 2004-241781 | 8/2004 |
| JP | 2005-175224 | 6/2005 |
| JP | 2005-252266 | 9/2005 |
| JP | 2006-32970 | 2/2006 |
| JP | 2006-140482 | 6/2006 |
| JP | 2006-269660 | 10/2006 |

OTHER PUBLICATIONS

U.S. Appl. No. 12/563,729, filed Sep. 21, 2009, Takashi Ichikawa, et al.
Fujio Masuoka, "Flash Memory Technology Handbook", Science Forum, (MNOS), Aug. 1993, pp. 199-205, 3-7.
Andrea Ghetti, et al., "3D Simulation study if gate coupling and gate cross-interference in advanced floating gate non-volatile memories", Solid-State Electronics, Elsevier, vol. 49, Issue 11, Nov. 2005, pp. 1805-1812.
Robert H. Dennard, et al., "Design of Ion-Implanted MOSFET's with Very Small Physical Dimensions", IEEE Journal of Solid-State Circuits, vol. 9, No. 5, 1974, pp. 256-268.
Sony CX-PAL, vol. 52, "Device having traveled in Space. Low-cost embedded non-volatile memory device technology "MONOS"", 4 pages.
Ryuji Ohba, et al., "Silicon Nitride Trap Memory with Double Tunnel Junction", Symposium on VLSI Technology Digest on Technical Papers, 2003, pp. 35-36.
M. Shima, et al., "Tetrahedral shaped recess channel HEMT with a floating quantum dot gate", IEDM Tech. Dig., Dec. 1998, pp. 437-440.

(Continued)

*Primary Examiner* — Ly D Pham
(74) *Attorney, Agent, or Firm* — Oblon, Spivak, McClelland, Maier & Neustadt, L.L.P.

(57) ABSTRACT

A multi-dot flash memory set potentials of bit lines being disposed at a left side of a selected floating gate to V2(1)>V2(2)>V2(3)> . . . and set potentials of bit lines being disposed at a right side of the selected floating gate to V1(1)<V1(2)<V1(3)< . . . . Where V2(1) is a plus potential and V1(1) is a minus potential. The potentials of the bit lines converge on 0V with being away from the selected floating gate.

20 Claims, 53 Drawing Sheets

OTHER PUBLICATIONS

Katsuhiko Nisihiguchi, et al., "Multilevel memory using an electrically formed single-electron box", Applied Physics Letters, vol. 85, No. 7, Aug. 16, 2004, pp. 1277,1279.

Touichiro Goto, et al., "Molecular-Mediated Single-Electron Devices Operating at Room Temperature", Japanese Journal of Applied Physics, vol. 45, No. 5A, 2006, pp. 4285-4289.

* cited by examiner

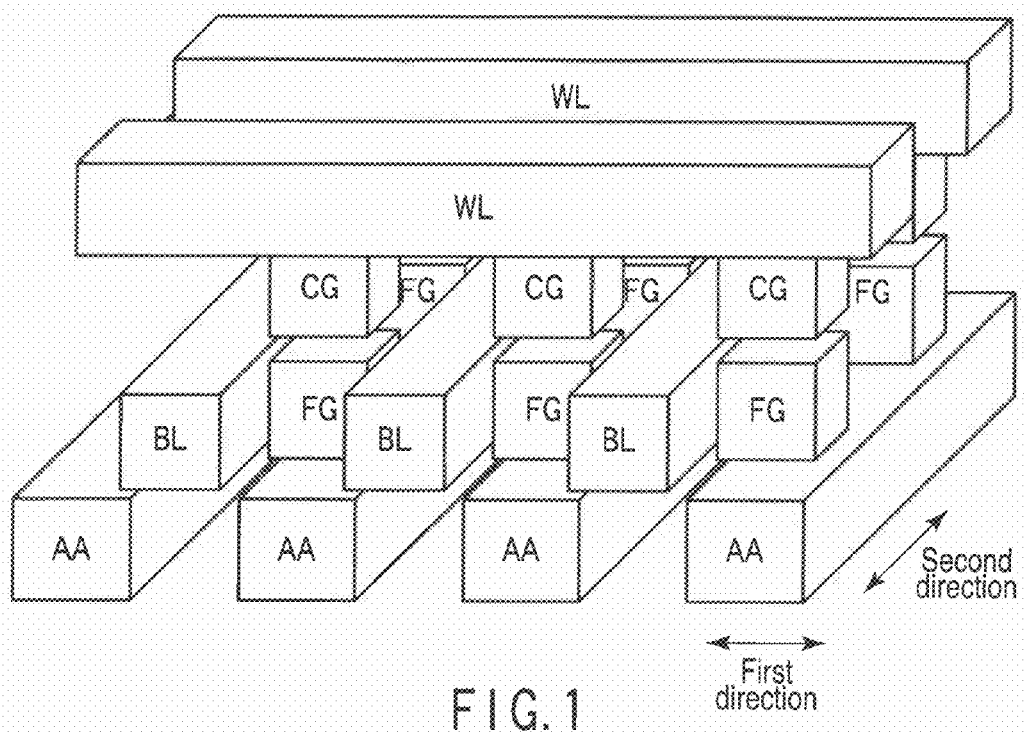
F I G. 1
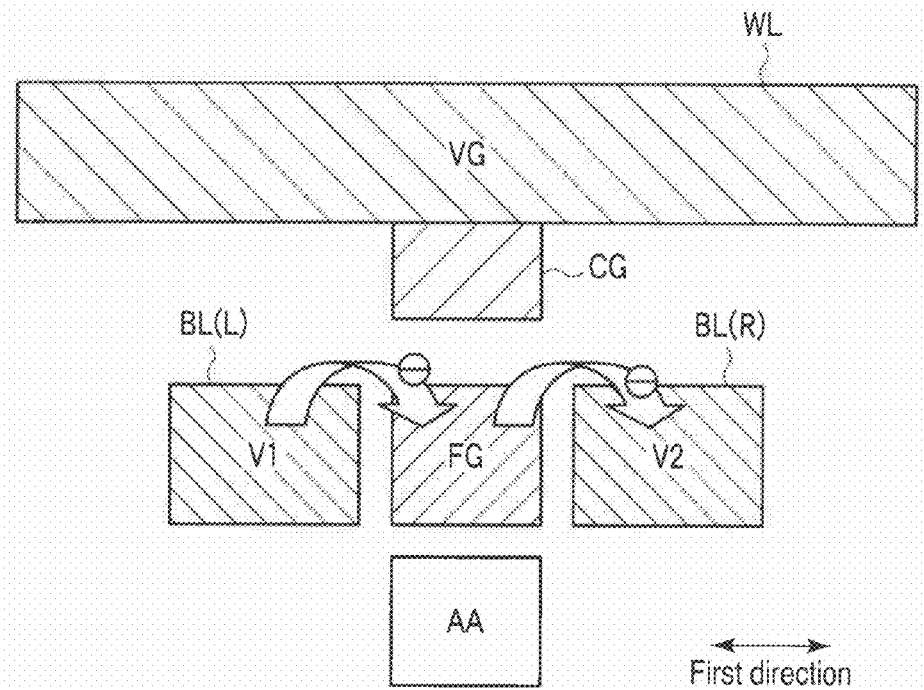
F I G. 2

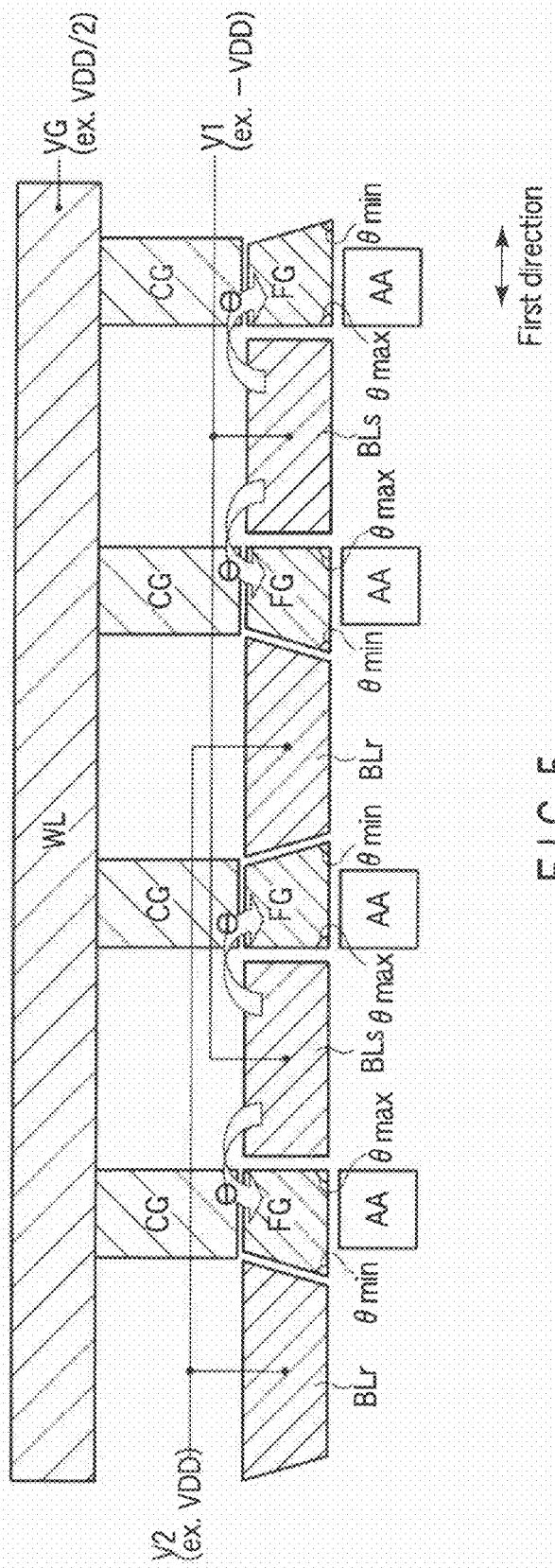
F I G. 5

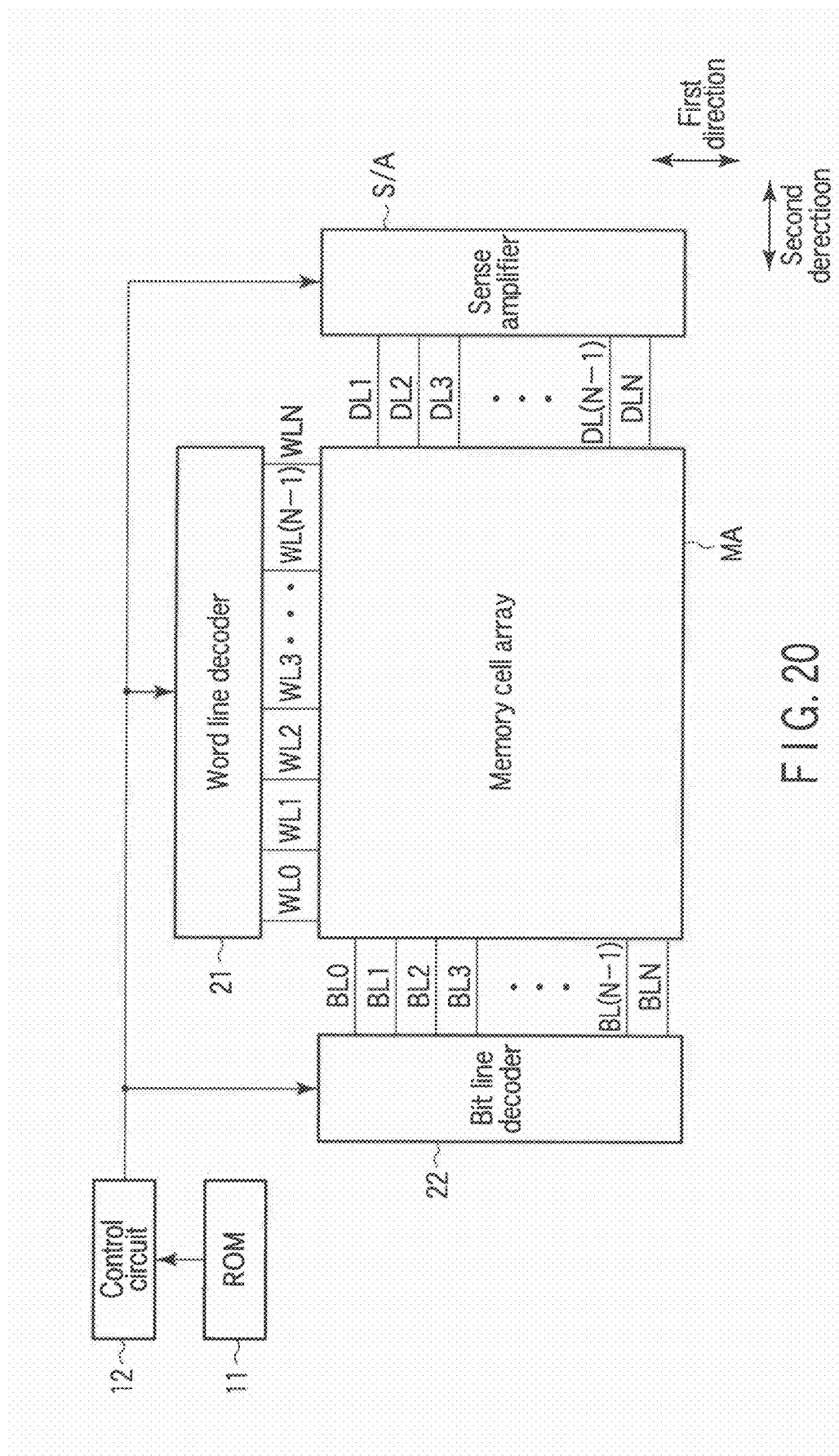
F I G. 20

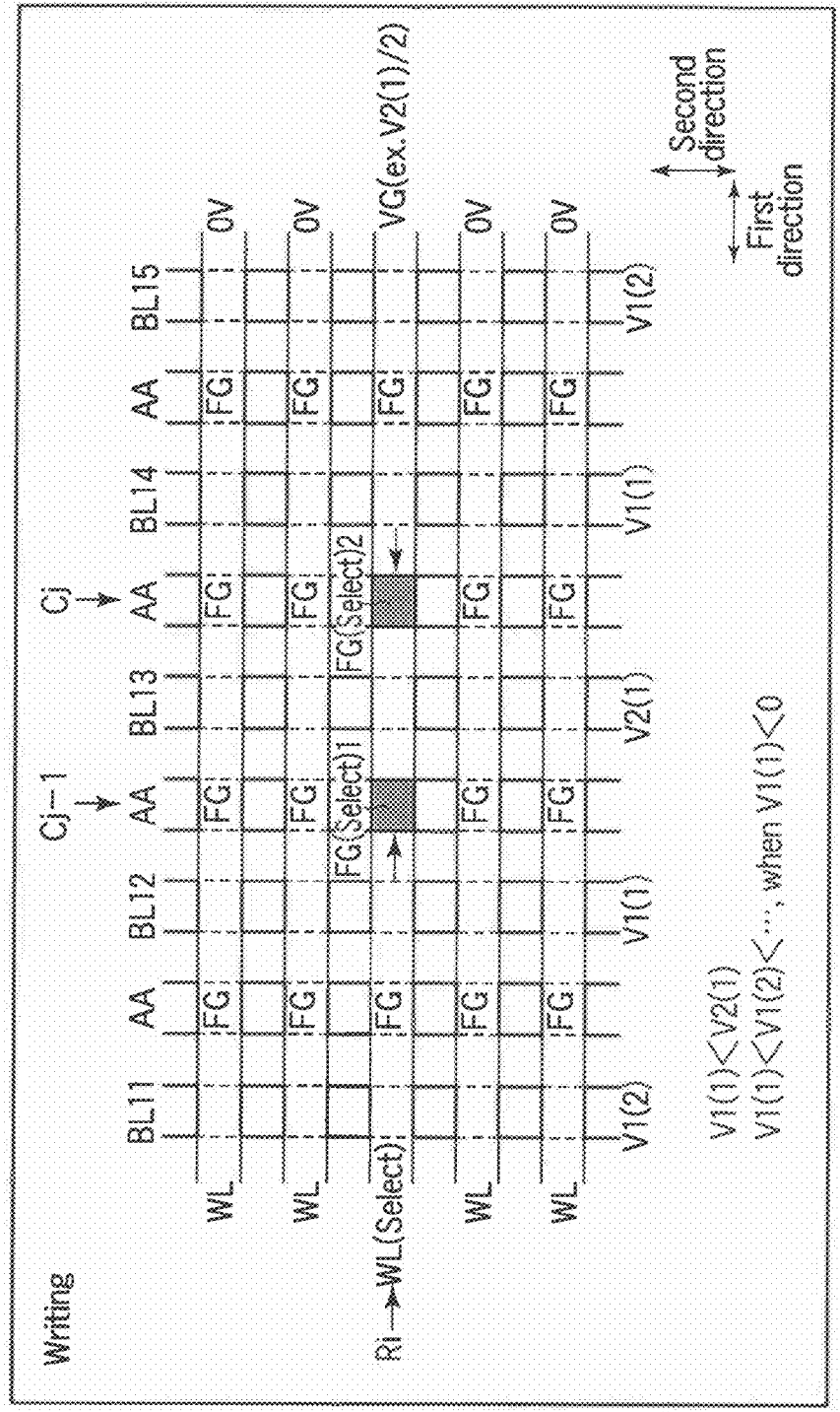
F I G. 26

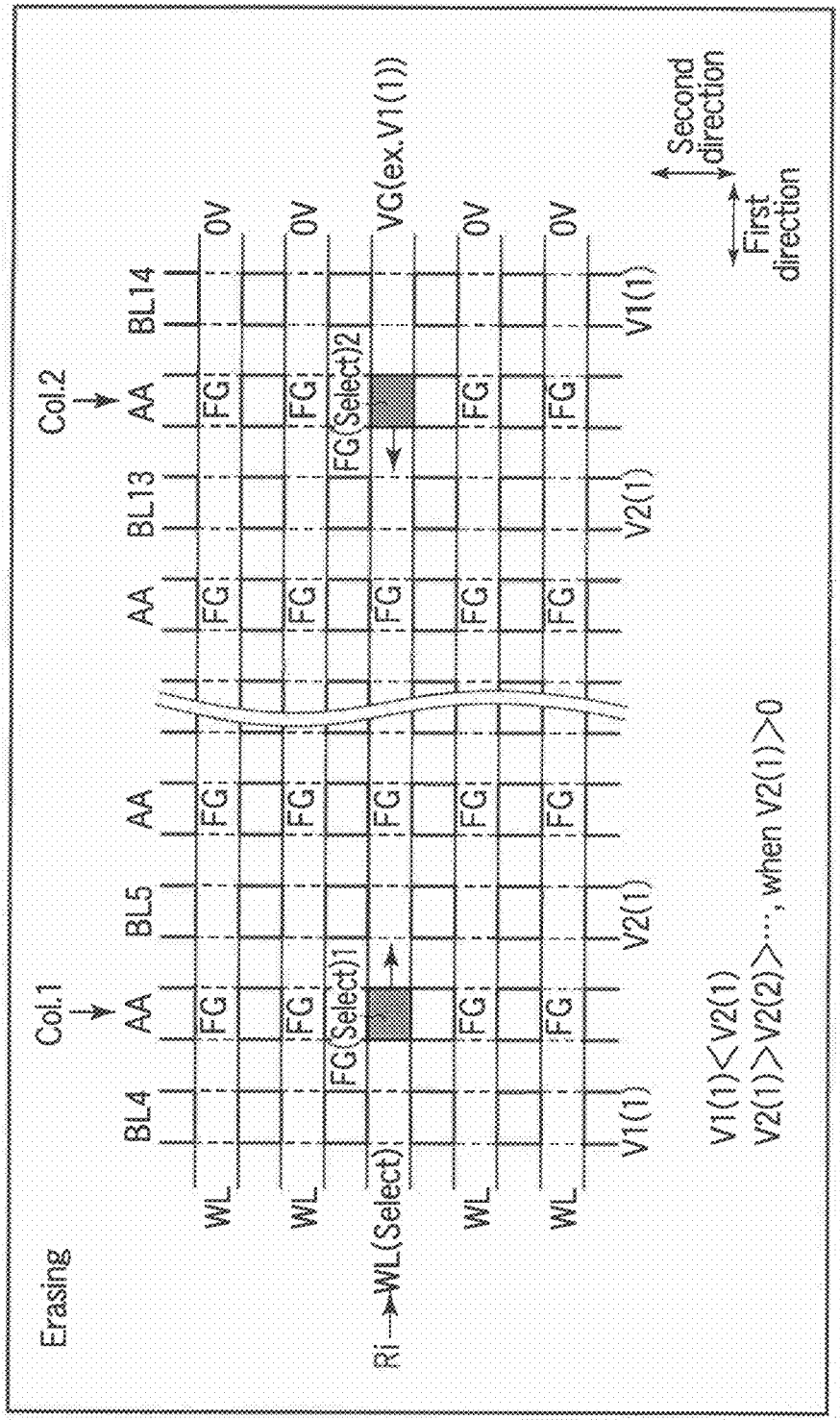
F I G. 29

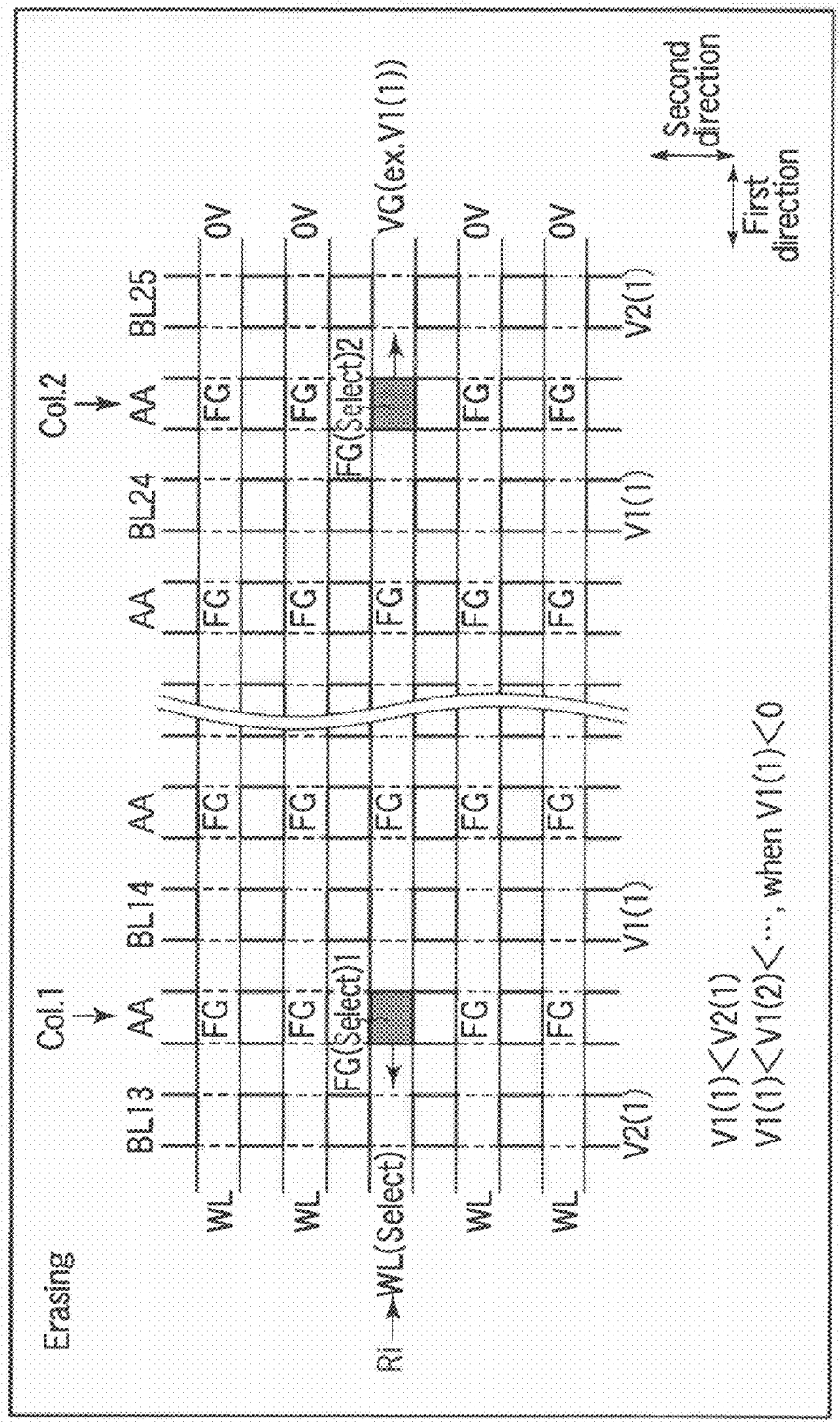
F I G. 34

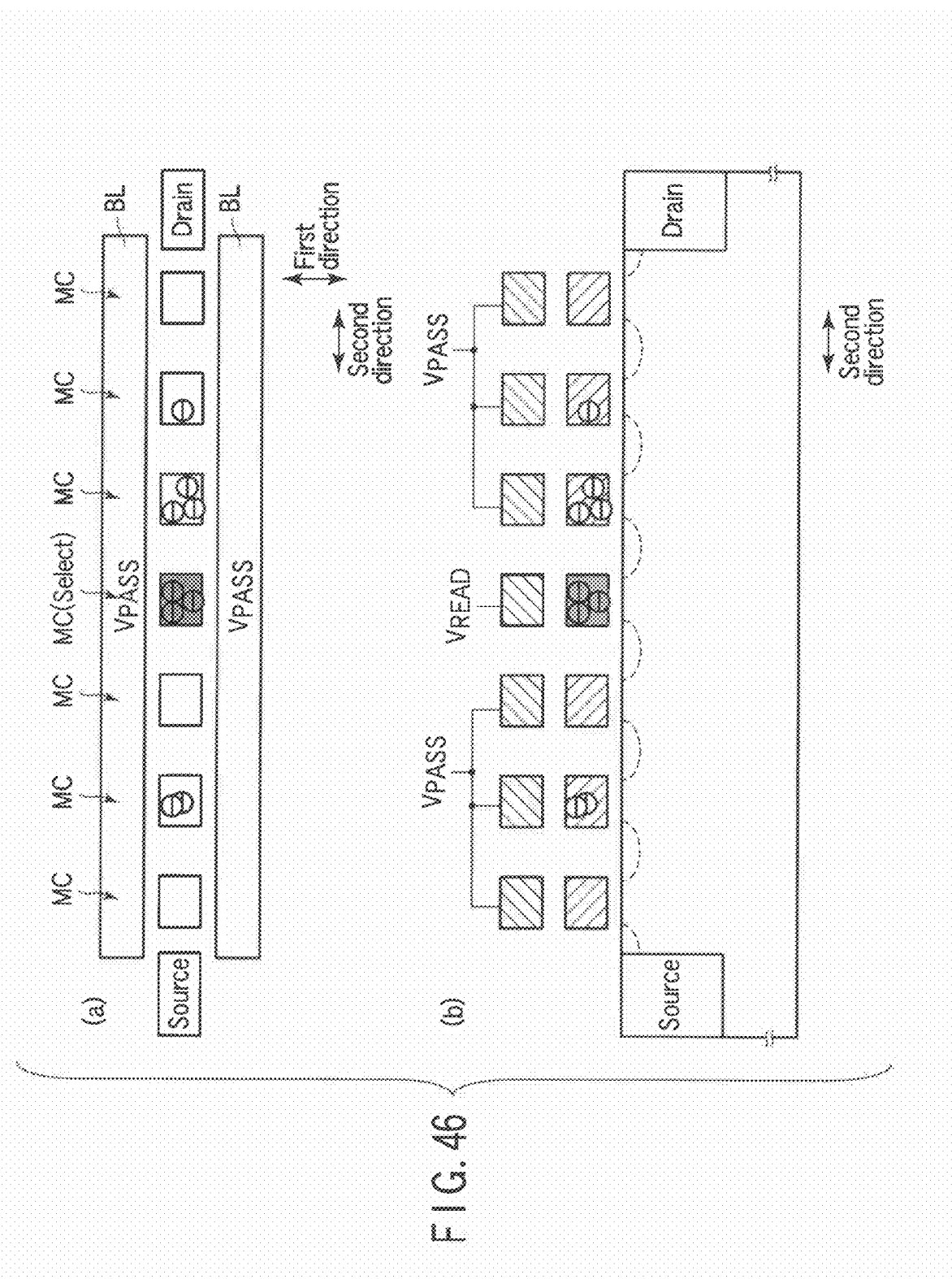
F I G. 46

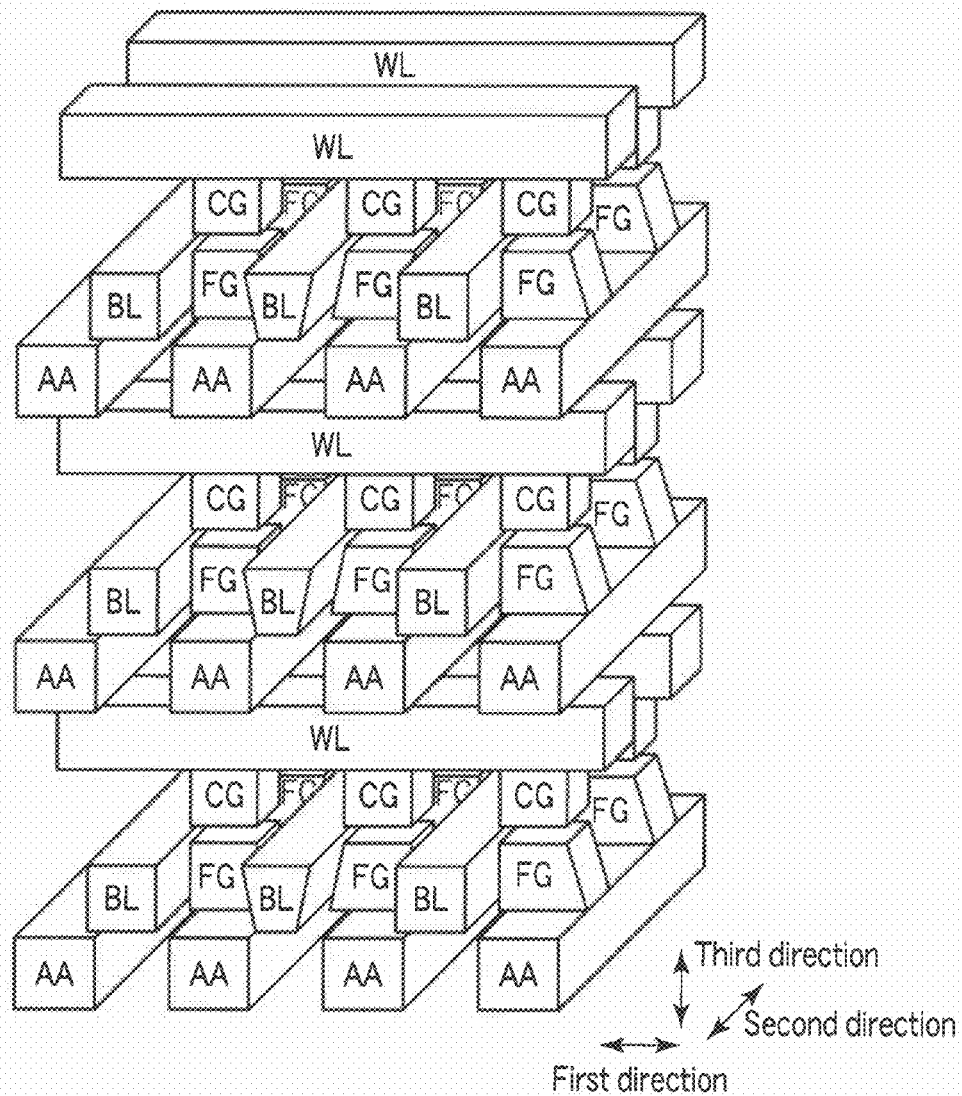
F I G. 50

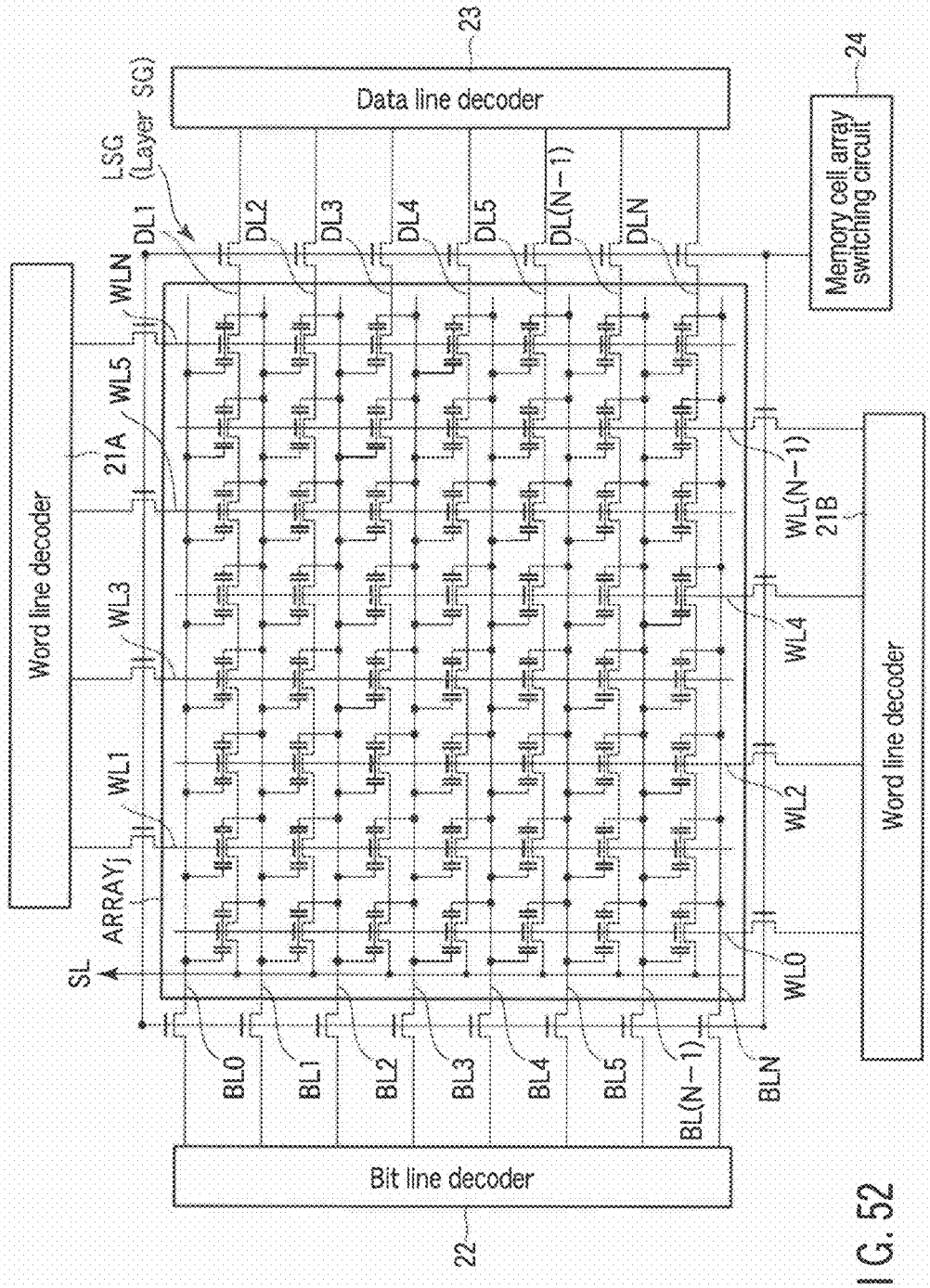
F I G. 52

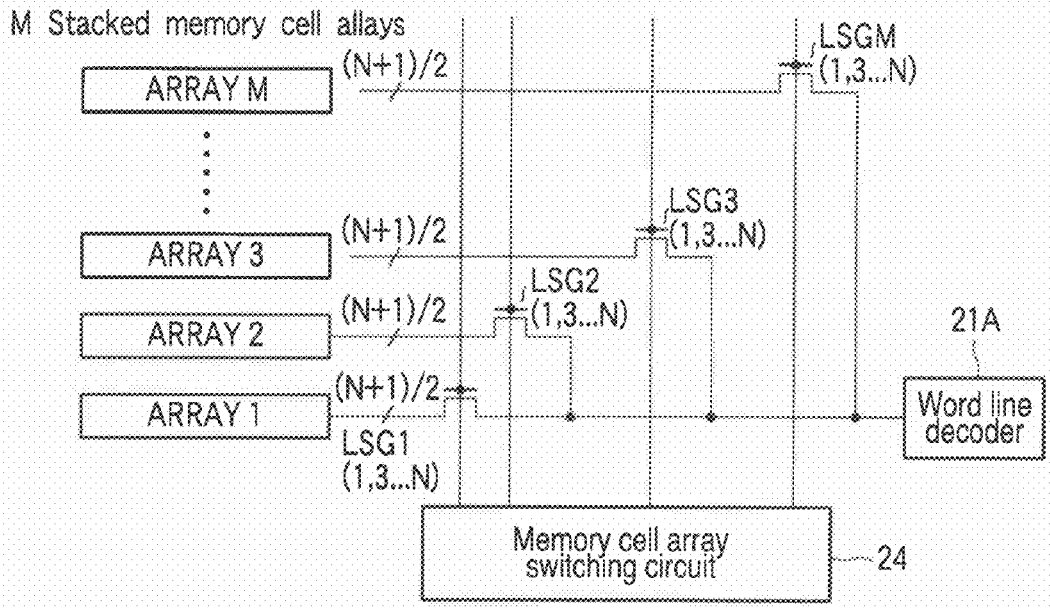
F I G. 55
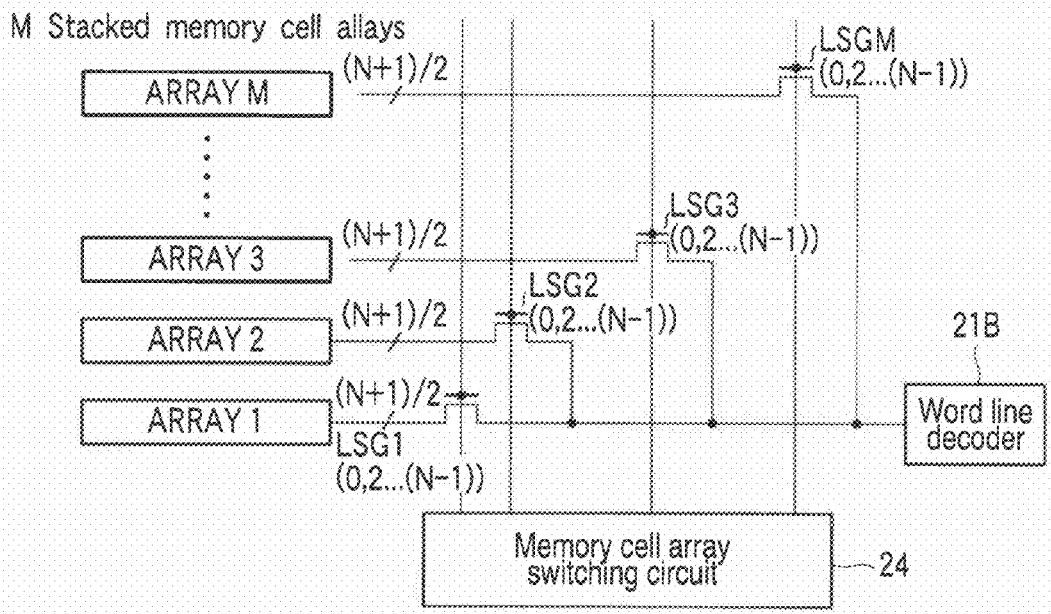
F I G. 56

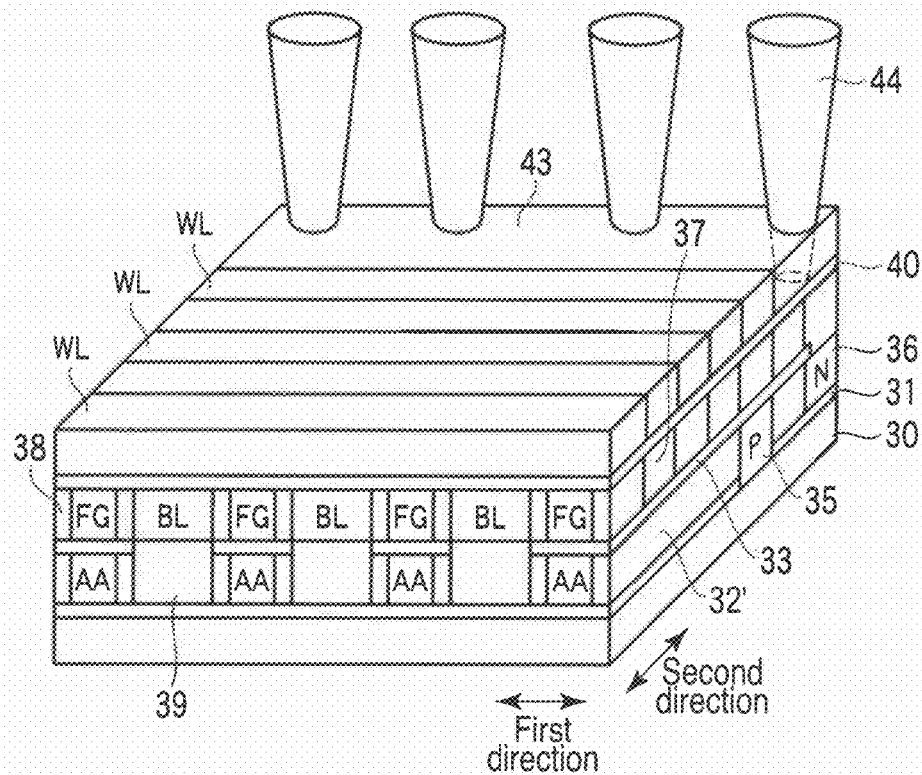
F I G. 60
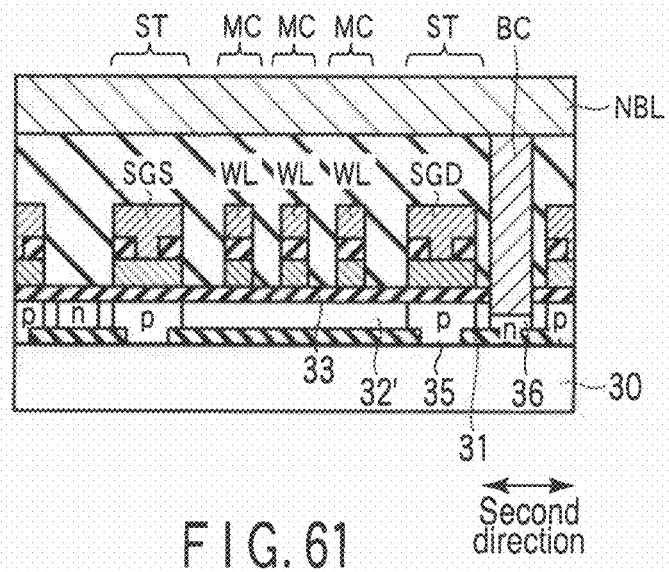
F I G. 61

MULTI-DOT FLASH MEMORY

CROSS-REFERENCE TO RELATED APPLICATION

This application is based upon and claims the benefit of priority from prior Japanese Patent Application No. 2009-188637, filed Aug. 17, 2009, the entire contents of which are incorporated herein by reference.

BACKGROUND

1. Field

The present invention relates to a control technique of writing/erasing of a multi-dot flash memory (MDF).

2. Related Art

A NAND flash memory which has been dominating file memory market has a serious problem of performance deterioration due to repetition of the writing/erasing, because a tunnel insulating film used at the time of writing/erasing is also used as a gate insulating film which determines the transistor characteristic of a cell. Such problem in reliability of the tunnel insulating film is disclosed in Fujio Masuoka, "Flash Memory Technology Handbook", publish on demand, released in August, 1993.

In addition, since the NAND flash memory cannot be written in at random, it is not suitable for high-speed large-volume data recording. Therefore, a large-capacity buffer memory is required to record a moving image in real time.

The well-known memory cell structures of the NAND flash memory are a floating gate type using a floating gate to retain a charge, and a local trap type using a charge accumulation layer composed of local traps highly contained in a nitride film, but whether they can be miniaturized to 30 nm or less is doubtful for the following reason.

First, the floating gate type largely used in the market at present has a serious problem of an interference effect between two adjacent floating gates (inter-cell interference), which prevents miniaturization.

This inter-cell interference is disclosed in Andrea Ghetti, Luca Bortesi and Loris Vendrame, "3D Simulation study of gate coupling and gate cross-interference in advanced floating gate non-volatile memories", Solid-State Electronics, vol. 49, Issue 11, November 2005, Pages 1805-1812, for example.

As the quickest method to solve the above problem, both a tunnel insulating film provided between a channel and a floating gate and an inter-electrode insulating film (IPD (Inter-Polysilicon Dielectric), for example) provided between the floating gate and a control gate are thinned, and lateral shrinkage and vertical shrinkage are implemented at the same time.

Although this method is subject to a scaling law (refer to R. H. Dennard et al., "Design of ion-implanted MOSFET's with very small physical dimensions", IEEE j. of SSC, vol. 9, no. 5, pp. 256-268, 1974, for example) and the most effective method, the writing/erasing have to be performed using the tunnel insulating film. As a result, a charge trap is generated on the side of the floating gate at the time of writing, and the charge trap is generated on the side of the substrate at the time of erasing.

Therefore, as for the memory cell, a difference (threshold window) between a threshold value in a write state and a threshold value in an erase state becomes small as the writing/erasing are repeated.

As described above, it is difficult to thin the tunnel insulating film due to the problem in reliability of the tunnel insulating film which is specific to the non-volatile memory. Therefore, the floating gate type NAND flash memory is miniaturized by strain scaling in which the lateral direction is only shrunk. This makes apparent the problem due to the inter-cell interference effect.

Meanwhile, since the local trap type has less inter-cell interference in terms of its structure, and a leak phenomenon of the tunnel insulating film is limited to the local trap concerning a leak path generated in the tunnel insulating film, it is also superior in leak resistance (refer to SONY CX-PAL Vol. 52, Device having traveled in space, Low-cost embedded non-volatile memory device technology "MONOS", for example).

In these respects, the local trap type memory cell has been expected as a favorable memory cell after the end of the miniaturization of the floating gate type memory cell.

The local trap type has the advantage that the energy of a tunnel electron is low and the charge trap is not likely to be generated in the insulating film because the tunnel insulating film is thin as compared with the floating gate type.

However, as the writing/erasing are repeated, the charge trap is generated in the tunnel insulating film in the local trap type also similar to the floating gate type. This trap causes the problem in reliability of the tunnel insulating film naturally.

In addition, further miniaturization in the local trap type causes an essential defect in which the number of the local traps in the charge accumulation layer is decreased and the charge amount which can be stored is also decreased. Thus, even when a very small amount of charge is removed from the local trap of the charge accumulation layer in the miniaturized memory cell, this considerably affects the threshold value of the memory cell.

For example, when it is assumed that a trap density of the charge accumulation layer is $1\times10^{12}$ cm$^{-2}$, the trap number of the charge accumulation layer is only four when a control gate has a planar size of 20 nm×20 nm. When only one trap among them is connected to the leak path, it means that 25% of the total charges are lost.

Such variation in the number of local traps makes the operation of the memory cell unstable.

Consequently, under the circumstances in which the number of the local traps in the charge accumulation layer (electron retention number) is decreased, and the threshold swing between the write state and the erase state of the memory cell becomes small, when the variation in the local trap number is taken into consideration, the threshold window cannot be secured and becomes extremely narrow and as a result, the read operation cannot be performed.

Under such circumstances, a next-generation memory such as a quantum dot memory has been proposed.

There are two prominent kinds of technologies.

One technology regards many varied quantum dots as one group considering that it is difficult to control the position of the single quantum dot and maintain the quality thereof.

For example, quantum dots are embedded in the tunnel insulating film to improve the writing characteristic. This technology is disclosed in R. Ohba, N. Sugiyama, J. Koga, and S. Fujita, "Silicon nitride memory with double tunnel junction", 2003 Symposium on VLST Technology Dig. Tech. Paper, for example. In addition, the quantum dot itself can be used instead of the local trap.

According to these technologies, although the conventional memory cell characteristic can be partially improved, the floating gate itself cannot be miniaturized to the level that shows a quantum dot property, and essential progress cannot be expected, since the quantum dots are embedded in one floating gate. Furthermore, since the reliability of the tunnel insulating film containing the quantum dot layer is lower than the reliability of the floating gate type tunnel insulating film because of the quantum dots, its production cost is also increased.

The other is a technology using the quantum dot as the floating gate.

Based on a vertical structure in which a regular tetrahedral trench is formed in a GaAs substrate, a floating gate of 10 nm is formed in a self-aligned manner in a valley part of the trench without any positional variation (refer to M. Shima, Y. Sakuma, T. Futatsugi, Y. Awano, and N. Yokoyama, "Tetrahedral shaped recess channel HEMT with a floating quantum dot gate," IEDM Tech. Dig., pp. 437-440, December 1998, for example).

For example, since data is stored by the presence of one electron, terabit-class scaling can be performed. However, since the size of the opening part of the trench is several microns actually, a cell area is considerably larger than that of the file memory using the silicon substrate.

That is, the key to the miniaturization of the cell lies in the miniaturization of the opening part. However, the miniaturization of the opening part of the trench is limited by the limitation of a thinned GaAs substrate because the source and drain are vertically arranged. In addition, since the GaAs substrate increases bit cost, it is not suitable for the file memory originally.

Meanwhile, many proposals have been already made for a memory principle using the quantum dots or silicon nano-dots (refer to Jpn. Pat. Appln. KOKAI Publication Nos. 2003-243615, 2004-241781, 2005-175224, 2005-252266, 2006-140482, 2006-269660, and 2006-32970, k. Nishiguchi, H. Inokawa, Y. Ono, A. Fujiwara, and Y. Takahashi, "Multilevel memory using an electrically formed single-electron box", APPLIED PHYSICS LETTERS, VOLUME 85, NUMBER 7, pp. 1277-1270, 16 Aug., 2004, and T. Goto et al., "Molecular-Mediated Single-Electron Devices Operating at Room Temperature", Japanese Journal of Applied Physics, Vol. 45, No, 5A, 2006, pp. 4285-4289, for example).

However, since these are proposed consistently for the memory principle, various problems have to be solved to complete the memory as the flash memory such as the NAND flash memory.

One of the above problems includes a memory cell array architecture.

Only after completing the memory cell array architecture, the amount of the charges (electrons or holes) stored in the floating gate can be controlled in unit of one or more, and a next generation multi-level memory in which two or more bits of data can be stored in one memory cell, that is, a random writable multi-dot flash memory that solves the problems in miniaturization and reliability can be established.

Thus, with the silicon technology, the new memory cell array architecture is expected to be developed in which the problem in reliability is solved by providing the gate insulating film and the tunnel insulating film separately, the floating gate can operate in the size showing the quantum dot behavior, and the random writing is possible.

A control technique of writing/erasing using a new memory cell array architecture of a multi-dot flash memory as a next generation-file memory is also important. Concretely speaking, a low power consumption of writing/erasing is fundamental to realize a next generation-file memory.

BRIEF SUMMARY (1) A multi-dot flash memory according to an aspect of the present invention comprises active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, bit lines provided between the floating gates, which extend to the second direction, and a control circuit which controls potentials of the bit lines in a writing/erasing.

The control circuit set a potential $V_{n+1}$ of (n+1)-th bit line from a selected floating gate as a target of the writing/erasing to a value within a range of $$\max\left\{\begin{array}{c} \dfrac{C_n V_n + C_{pg} V_{pg} + C_{AA} V_{AA} + Q_{min} - }{d_{n+1} Eth_{n+1}(C_n + C_{n+1} + C_{pg} + C_{AA})}, \\ \dfrac{(C_{n+1} + C_{pg} + C_{AA}) V_n - C_{pg} V_{pg} - C_{AA} V_{AA} - }{Q_{max} - d_n Eth_n(C_n + C_{n+1} + C_{pg} + C_{AA})}, \\ \dfrac{(C_{n+1} + C_n + C_{AA}) V_{pg} - C_n V_n - C_{AA} V_{AA} - }{Q_{max} - d_{pg} Eth_{pg}(C_n + C_{n+1} + C_{pg} + C_{AA})}, \\ \dfrac{(C_{n+1} + C_{pg} + C_n) V_{AA} - C_{pg} V_{pg} - C_n V_n - }{Q_{max} - d_{AA} Eth_{AA}(C_n + C_{n+1} + C_{pg} + C_{AA})} \end{array}\right\} < V_{n+1} < V_n$$

when a potential $V_n$ of n-th bit line from the selected floating gate is $V_n > 0$.

Where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA.

Where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG.

Where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

(2) A multi-dot flash memory according to an aspect of the present invention comprises active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, bit lines provided between the floating gates, which extend to the second direction, and a control circuit which controls potentials of the bit lines in a writing/erasing.

The control circuit set a potential $V_{n+1}$ of (n+1)-th bit line from a selected floating gate as a target of the writing/erasing to a value within a range of $$V_n < V_{n+1} < \min \begin{Bmatrix} \dfrac{C_n V_n + C_{pg} V_{pg} + C_{AA} V_{AA} + Q_{max} + d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{min} + d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{min} + d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{min} + d_{AA} Eth_{AA}(C_n + C_{n+1} + C_{pg} + C_{AA})}{C_{n+1}} \end{Bmatrix}$$

when a potential $V_n$ of n-th bit line from the selected floating gate is $V_n < 0$.

Where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA.

Where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG.

Where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

(3) A multi-dot flash memory according to an aspect of the present invention comprises active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, bit lines provided between the floating gates, which extend to the second direction, and a control circuit which controls potentials of the bit lines in a writing/erasing.

The control circuit set a potential $V_{n+1}$ of (n+1)-th bit line from one side of a selected floating gate as a target of the writing/erasing to a value within a range of $$V_{n+1} = \max \begin{Bmatrix} \dfrac{C_n V_n + C_{pg} V_{pg} + C_{AA} V_{AA} + Q_{min} - d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{max} - d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{max} - d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{max} - d_{AA} Eth_{AA}(C_n + C_{n+1} + C_{pg} + C_{AA})}{C_{n+1}}, \\ 0 \end{Bmatrix} + \Delta$$

when a potential $V_n$ of n-th bit line from one side of the selected floating gate is $V_n > 0$.

The control circuit set a potential $V_{n+1}$ of (n+1)-th bit line from the other side of the selected floating gate to a value within a range of $$V_{n+1} = \min \begin{pmatrix} \dfrac{C_n V_n + C_{pg} V_{pg} + C_{AA} V_{AA} + Q_{max} + d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{min} + d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{min} + d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{min} + d_{AA} Eth_{AA}(C_n + C_{n+1} + C_{pg} + C_{AA})}{C_{n+1}}, \\ 0 \end{pmatrix} - \Delta$$

when a potential $V_n$ of n-th bit line from the other side of the selected floating gate is $V_n < 0$.

The control circuit decides potentials of the bit lines sequentially from the bit line which is closest to the selected floating gate toward the bit line which is farthest from the selected floating gate.

Where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA.

Where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG.

Where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

Where $\Delta$ is a adjusting value which set a potential Vbit being applied to the bit lines to Vbit=K×Vmin (K is a natural number), and $0 \leq \Delta \leq V_{min}$.

(4) A multi-dot flash memory according to an aspect of the present invention comprises active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, bit lines provided between the floating gates, which extend to the second direction, and a control circuit which controls potentials of the bit lines in a writing/erasing, and which set the potentials of the bit lines to $V_{pass}$ in a verification after the writing/erasing.

The control circuit set a potential $V_{n+1}$ of (n+1)-th bit line from one side of a selected floating gate as a target of the writing/erasing to a value within a range of $$V_{n+1} = \max \begin{pmatrix} \dfrac{C_n V_n + C_{pg} V_{pg} + C_{AA} V_{AA} + Q_{min} - d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{max} - d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{max} - d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{max} - d_{AA} Eth_{AA}(C_n + C_{n+1} + C_{pg} + C_{AA})}{C_{n+1}}, \\ V_{pass} \end{pmatrix} + \Delta$$

when a potential $V_n$ of n-th bit line from one side of the selected floating gate is $V_n > V_{pass}$.

The control circuit set a potential $V_{n+1}$ of (n+1)-th bit line from the other side of the selected floating gate to a value within a range of $$V_{n+1} = \min \begin{pmatrix} \dfrac{C_n V_n + C_{pg} V_{pg} + C_{AA} V_{AA} + Q_{max} + d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{min} + d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{min} + d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{min} + d_{AA} Eth_{AA}(C_n + C_{n+1} + C_{pg} + C_{AA})}{C_{n+1}}, \\ V_{pass} \end{pmatrix} - \Delta$$

when a potential $V_n$ of n-th bit line from the other side of the selected floating gate is $V_n < V_{pass}$.

The control circuit decides potentials of the bit lines sequentially from the bit line which is closest to the selected floating gate toward the bit line which is farthest from the selected floating gate.

Where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA.

Where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG.

Where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

Where $\Delta$ is a adjusting value which set a potential Vbit being applied to the bit lines to Vbit=K×Vmin (K is a natural number), and $0 \leqq \Delta \leqq$ Vmin.

(5) A multi-dot flash memory according to an aspect of the present invention comprises active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, bit lines provided between the floating gates, which extend to the second direction, and a control circuit which controls potentials of the bit lines in a writing/erasing, and which set the potentials of the bit lines to $V_{pass}$ in a verification after the writing/erasing.

The control circuit set a potential $V_{n+1}$ of (n+1)-th bit line from a first or second floating gate as a target of the writing/erasing to a value within a range of $$V_{n+1} = \max \begin{cases} \dfrac{C_n V_n + C_{pg} V_{pg} + C_{AA} V_{AA} + Q_{min} - d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg}V_{pg} - C_{AA}V_{AA} - Q_{max} - d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA}V_{AA} - Q_{max} - d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg}V_{pg} - C_n V_n - Q_{max} - d_{AA} Eth_{AA}(C_n + C_{n+1} + C_{pg} + C_{AA})}{C_{n+1}}, \\ \dfrac{C_{n+2}V_{n+2} + C_{pg}V_{pg} + C_{AA}V_{AA} + Q_{min} - d_{n+1}Eth_{n+1}(C_{n+2} + C_{n+1} + C_{pg} + C_{AA})}{C_n + C_{pg} + C_{AA}}, \\ \dfrac{(C_{n+1} + C_{pg} + C_{AA})V_{n+2} - C_{pg}V_{pg} - C_{AA}V_{AA} - Q_{max} - d_{n+2}Eth_{n+2}(C_{n+2} + C_{n+1} + C_{pg} + C_{AA})}{C_{n+1}}, \\ \dfrac{(C_{n+1} + C_{n+2} + C_{AA})V_{pg} - C_{n+2}V_{n+2} - C_{AA}V_{AA} - Q_{max} - d_{pg}Eth_{pg}(C_{n+2} + C_{n+1} + C_{pg} + C_{AA})}{C_{n+1}}, \\ \dfrac{(C_{n+1} + C_{pg} + C_{n+2})V_{AA} - C_{pg}V_{pg} - C_{n+2}V_{n+2} - Q_{max} - d_{AA}Eth_{AA}(C_{n+2} + C_{n+1} + C_{pg} + C_{AA})}{C_{n+1}}, \\ V_{pass} \end{cases} + \Delta$$

when a potential $V_n$ of n-th bit line from the first floating gate among a half of the first floating gate side of the bit lines which is disposed between the first and second floating gates is $V_n > V_{pass}$, and a potential $V_n$ of n-th bit line from the second floating gate among a half of the second floating gate side of the bit lines which is disposed between the first and second floating gates is $V_n > V_{pass}$.

The control circuit set a potential $V_{n+1}$ of (n+1)-th bit line from a first or second floating gate as a target of the writing/erasing to a value within a range of $$V_{n+1} = \min \begin{cases} \dfrac{C_2 V_n + C_3 V_{pg} + C_4 V_C + Q_{max} + d_1(Eth_1 + Em_1)(C_1 + C_2 + C_3 + C_4)}{C_2 + C_3 + C_4}, \\ \dfrac{(C_1 + C_2 + C_4)V_n - C_3 V_{pg} - C_4 V_C - Q_{min} + d_2(Eth_2 + Em_2)(C_1 + C_2 + C_3 + C_3)}{C_1}, \\ \dfrac{C_2 V_{n+2} + C_3 V_{pg} + C_4 V_C + Q_{max} + d_1(Eth_1 + Em_1)(C_1 + C_2 + C_3 + C_4)}{C_2 + C_3 + C_4}, \\ \dfrac{(C_1 + C_3 + C_4)V_{n+2} - C_3 V_{pg} - C_4 V_C - Q_{min} + d_2(Eth_2 + Em_2)(C_1 + C_2 + C_3 + C_4)}{C_1}, \\ \dfrac{C_{n+2}V_{n+2} + C_{pg}V_{pg} + C_{AA}V_{AA} + Q_{max} + d_{n+1}Eth_{n+1}(C_{n+2} + C_{n+1} + C_{pg} + C_{AA})}{C_n + C_{pg} + C_{AA}}, \\ \dfrac{(C_{n+1} + C_{pg} + C_{AA})V_{n+2} - C_{pg}V_{pg} - C_{AA}V_{AA} - Q_{min} + d_{n+2}Eth_{n+2}(C_{n+2} + C_{n+1} + C_{pg} + C_{AA})}{C_{n+1}}, \\ \dfrac{(C_{n+1} + C_{n+2} + C_{AA})V_{pg} - C_{n+2}V_{n+2} - C_{AA}V_{AA} - Q_{min} + d_{pg}Eth_{pg}(C_{n+2} + C_{n+1} + C_{pg} + C_{AA})}{C_{n+1}}, \\ \dfrac{(C_{n+1} + C_{pg} + C_{n+2})V_{AA} - C_{pg}V_{pg} - C_{n+2}V_{n+2} - Q_{min} + d_{AA}Eth_{AA}(C_n + C_{n+1} + C_{pg} + C_{AA})}{C_{n+1}}, \\ V_{pass} \end{cases} - \Delta$$

when a potential $V_n$ of n-th bit line from the first floating gate among a half of the first floating gate side of the bit lines which is disposed between the first and second floating gates is $V_n < V_{pass}$, and a potential $V_n$ of n-th bit line from the second floating gate among a half of the second floating gate side of the bit lines which is disposed between the first and second floating gates is $V_n < V_{pass}$.

The control circuit decides potentials of the bit lines between the first and second floating gates sequentially from the bit line which is closest to the first or second floating gate, and $|V_{center} - V_{pass}|$ among absolute values which is obtained by subtracting $V_{pass}$ from the potentials of the bit lines between the first and second floating gates is a minimum value when the potential of the bit line which is disposed at a center of the bit lines between the first and second floating gates is $V_{center}$.

Where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA.

Where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG.

Where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

Where Δ is a adjusting value which set a potential Vbit being applied to the bit lines to Vbit=K×Vmin (K is a natural number), and $0 \leq \Delta \leq Vmin$.

BRIEF DESCRIPTION OF THE DRAWINGS

FIG. 1 is a diagram showing a memory cell array.
FIG. 2 is a diagram showing a movement of charges.
FIGS. 5 and 6 are diagrams, each showing a movement of charges.
FIG. 20 is a diagram showing a peripheral circuit.
FIG. 26 is a diagram showing a write operation.
FIG. 29 is a diagram showing an erase operation.
FIG. 34 is a diagram showing an erase operation.
FIGS. 46 to 49 are diagrams, each showing a state in a read operation.

FIGS. 50 and 51 are diagrams, each showing a three-dimensional multi-dot flash memory.
FIG. 52 is a diagram showing a memory cell array and a peripheral circuit.
FIGS. 53 to 56 are diagrams, each showing a method of switching memory cell arrays.
FIGS. 60 and 61 are diagrams, each showing a device structure by a manufacturing method of a present invention.

DETAILED DESCRIPTION

Figure 3:
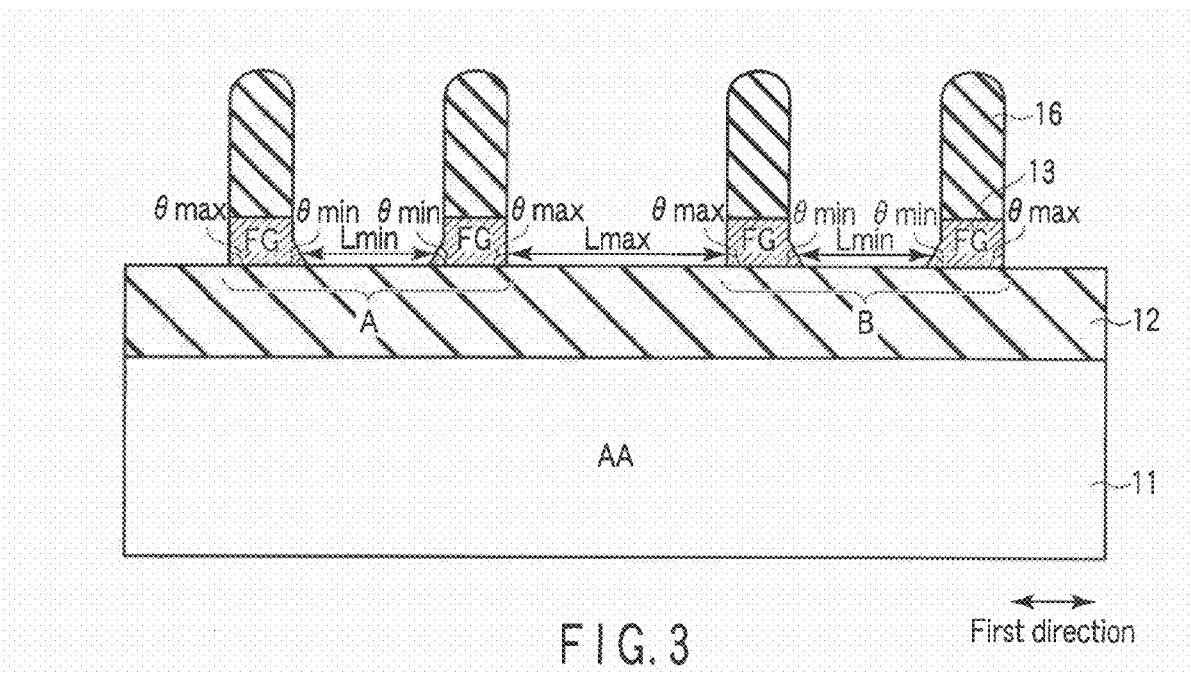
FIG. 3 is a diagram showing an even-odd variation.

A multi-dot flash memory of an aspect of the present invention will be described below in detail with reference to the accompanying drawings.

1. Memory Cell Array Architecture of Multi-Dot Flash Memory (1) First Example

The first example of the memory cell array architecture is disclosed in PCT/JP2008/053688.

In this specification, the multi-dot flash memory is defined as a next generation multi-level memory in which the amount of charges (electrons or holes) stored in a floating gate is controlled in increments of one or more, and two or more bits of data is stored in one memory cell.

FIG. 1 is a birds-eye view showing a memory cell array architecture of the multi-dot flash memory. In addition, FIG. 2 is a cross-sectional view of the memory cell array in FIG. 1 in a first direction.

Active areas (semiconductor substrates or semiconductor layers, for example) AA, . . . are arranged in a line-and-space pattern in the first direction, and the lines of active areas AA, . . . extend in a second direction. Bit lines BL, . . . are arranged above the spaces between active areas AA, . . . and extend in the second direction. The spaces between active areas AA, . . . are element isolation areas (STI (shallow trench isolation), for example).

Floating gates FG, . . . are arranged in the form of an array and provided above active areas AA, . . . and between bit lines BL, . . . . Each of floating gates FG, . . . is sandwiched between two right and left bit lines BL (L) and BL(R).

A gate insulating film is arranged between active areas AA, . . . and floating gates FG, . . . . In addition, tunnel insulating films are arranged between bit lines BL, . . . and floating gates FG, . . . . Thus, since the gate insulating film and the tunnel insulating film are separately provided, the problem in reliability can be solved.

Control gates CG, . . . are arranged above floating gates FG, . . . . An inter-electrode insulating film (IPD, for example) is arranged between floating gates FG, . . . and control gates CG, . . . . Word lines WL, . . . are arranged on control gates CG, . . . . Word lines WL . . . extend in the first direction, and commonly connected to control gates CG, . . . arranged in line in the first direction.

In the multi-dot flash memory having the above structure, by controlling gate potential VG to be applied to word line WL, potential V1 to be applied to left bit line BL (L), and potential V2 to be applied to right bit line BL (R), as shown in FIG. 2, the charge can be injected and emitted to and from floating gate FG.

Thus, the multi-dot flash memory is characterized in that one of the two tunnel insulation films existing on the right and left sides of floating gate FG is used for injecting the charge at the time of writing and the other thereof is used for emitting the charge at the time of erasing.

Thus, since the direction of a tunnel current (flow of electrons) flowing in the tunnel insulating film is kept constant, the reliability of the tunnel insulating film can be improved.

In addition, since the tunnel insulating film and the gate insulating film are separately provided, a charge trap generated at the time of writing or erasing does not affect the gate insulating film, and threshold voltage Vth at the time of reading can be prevented from shifting.

(2) Second Example

The second example of the memory cell array architecture is disclosed in Japanese patent application No. 2009-42548.

Since the multi-dot flash memory controls the charge amount in the floating gate in small unit of one or more in view of its principle, to sufficiently reduce the size of the floating gate is an effective way to implement multilevel by a quantum dot effect.

However, to reduce the size of the floating gate in the memory cell array architecture in FIGS. 1 and 2 is very difficult in terms of a technical limit of a size processed by photolithography and production cost.

For example, a line width of 20 nm can be implemented by a technology using EUV (extreme ultraviolet) in principle, but it has not been put to practical use yet. Even if it is put to practical use, its production cost will be high. In addition, there must be a technological limit of a size processed even by the technology using EUV.

Under such circumstances, a technology to implement fine processing by devising the process has been proposed. This technology is characterized in that a fine mask pattern is formed by use of a side-wall insulating film and called a side-wall spacer lithography process or a self-aligned double patterning process.

Therefore, this process is very effective in processing the floating gate of the multi-dot flash memory.

However, using the side-wall spacer lithography process, a shape of a side surface of the floating gates and a width of the bit line between the floating gates has a variation.

Concretely speaking, it has been found that the shape of the side surface of the floating gates processed by odd-numbered patterns from one end of the fine line-and-space mask pattern alternately differ from the shape of the side surface of the floating gates processed by even-numbered patterns from the one end thereof, and this causes the widths of the bit lines to differ periodically.

Thus, such variation is referred to as "even-odd variation" hereinafter.

This even-odd variation means that regarding the one floating gate, the shapes of two side surfaces existing in the same direction are different, and regarding the two floating gates adjacent in the same direction, the shapes of two side surfaces opposed to each other are symmetrical, that is, almost line symmetrical, or almost the same.

FIG. 3 schematically shows the even-odd variation.

Two adjacent floating gates FG in area A are processed by use of the two side-wall insulating films formed on the two side surfaces of the same core layer, and their shapes are symmetric. That is, the two side surfaces of the core layer side (inner side) are sloped.

When a degree of the slope of the side surface is expressed in a taper angle $\theta$, a taper angle $\theta$ ($=\theta$min) of the two side surfaces on the core layer side of two adjacent floating gates FG in area A is smaller than a taper angle $\theta$ ($=\theta$max) of the two side surfaces on the side (outer side) opposite to the core layer side.

Here, the taper angle is defined by an angle formed between a bottom surface and the side surface of floating gate (FG).

Similarly, two adjacent floating gates FG in area B are processed by the two side-wall insulating films formed on the two side surfaces of the same core layer, and their shapes are symmetric.

That is, a taper angle $\theta$ ($=\theta$min) of the two side surfaces on the core layer side of two adjacent floating gates FG in area B is smaller than a taper angle $\theta$ ($=\theta$max) of the two side surfaces on the side (outer side) opposite to the core layer side.

The $\theta$max is roughly 90° and the $\theta$min is smaller than 90°.

It is thought that the even-odd variation is caused by the symmetry of the shapes of the two side-wall insulating films formed based on the same core layer.

In addition, the even-odd variation of floating gates FG causes distances of L min and L max between floating gates FG to vary periodically. The periodical change in distances of L min and L max of floating gates FG causes the widths of bit lines arranged between floating gates FG to vary periodically.

Such variation in widths of the bit lines is referred to as the "even-odd differential" hereinafter.

Here, the width of the bit line is defined by (the width of the lower surface of the bit line+the width of the upper surface of the bit line)/2.

In the second example of the memory cell array architecture, the even-odd variation or the even-odd differential is positively used. More specifically, using the periodicity of the even-odd variation or the even-odd differential, a charge serving-only line as a bit line for serving the charge into the floating gate, and a charge receiving-only line for receiving the charge from the floating gate are periodically arranged based on the above periodicity.

In addition, which is set as the charge serving-only line and which is set as the charge receiving-only line of the two bit lines sandwiching the floating gate is based on the difference in shapes of the two side surfaces of the floating gate.

More specifically, according to one method, the charge serving-only line is arranged on the side surface having the large taper angle $\theta$max and the charge receiving-only line is arranged on the side surface having the small taper angle $\theta$min of the two side surfaces of the floating gate. When the charge receiving-only line is arranged on the side surface having the small taper angle $\theta$min, the angle formed between the bottom surface and the side surface of the floating gate is an acute angle, and the charge can be easily moved from the floating gate to the charge receiving-only line.

According to another method, the charge serving-only line is arranged on the thick bit line side, and the charge receiving-only line is arranged on the thin bit line side. Thus, when the charge receiving-only line is arranged on the side surface having the small taper angle $\theta$min, the angle formed between the bottom surface and the side surface of the floating gate is an acute angle, and the charge can be easily moved from the floating gate to the charge receiving-only line.

When the above memory cell array architecture is employed, the side-wall spacer lithography process can be employed, so that the multi-dot flash memory can be implemented.

Figure 4:
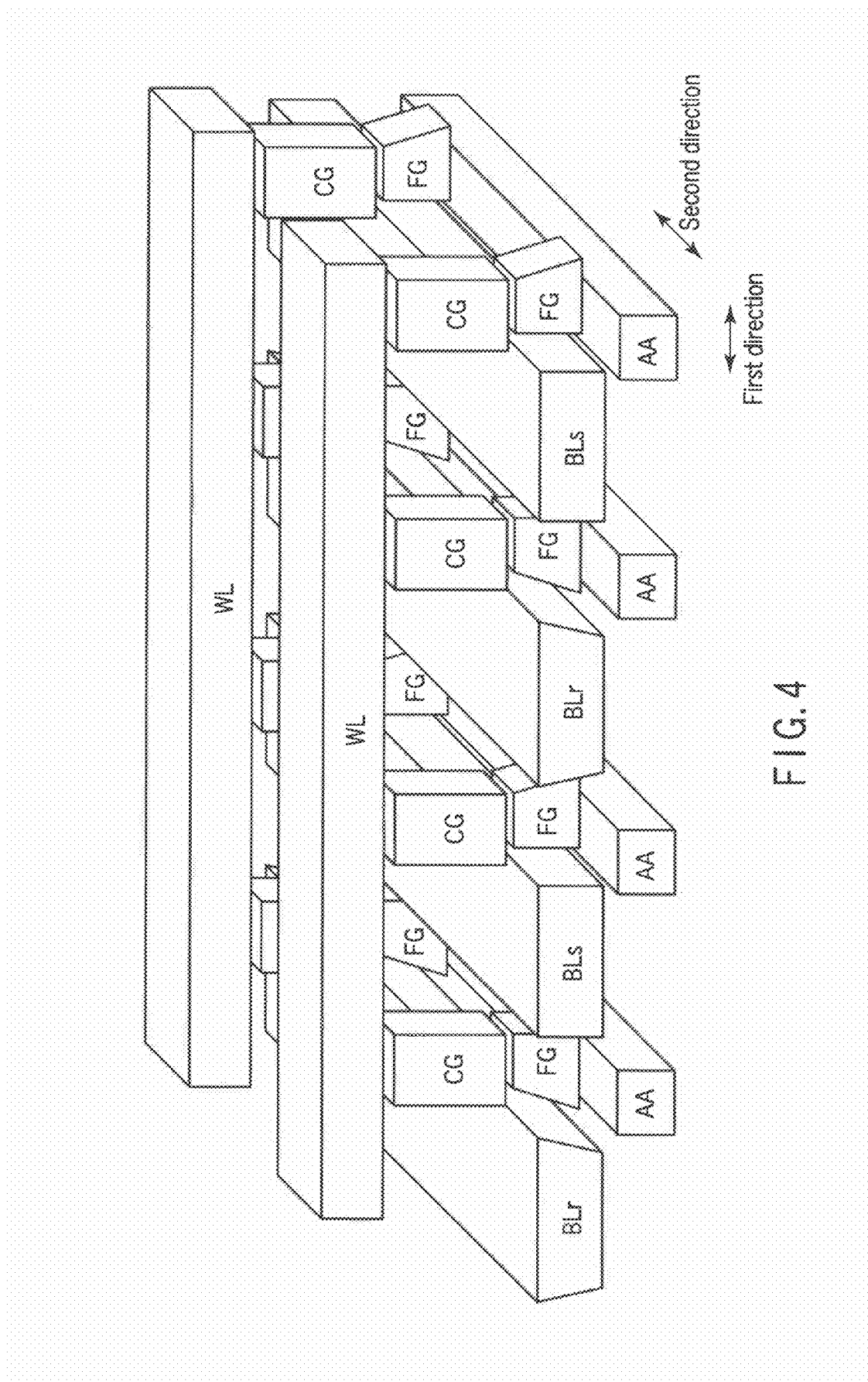
FIG. 4 is a diagram showing a memory cell array.
Figure 6:
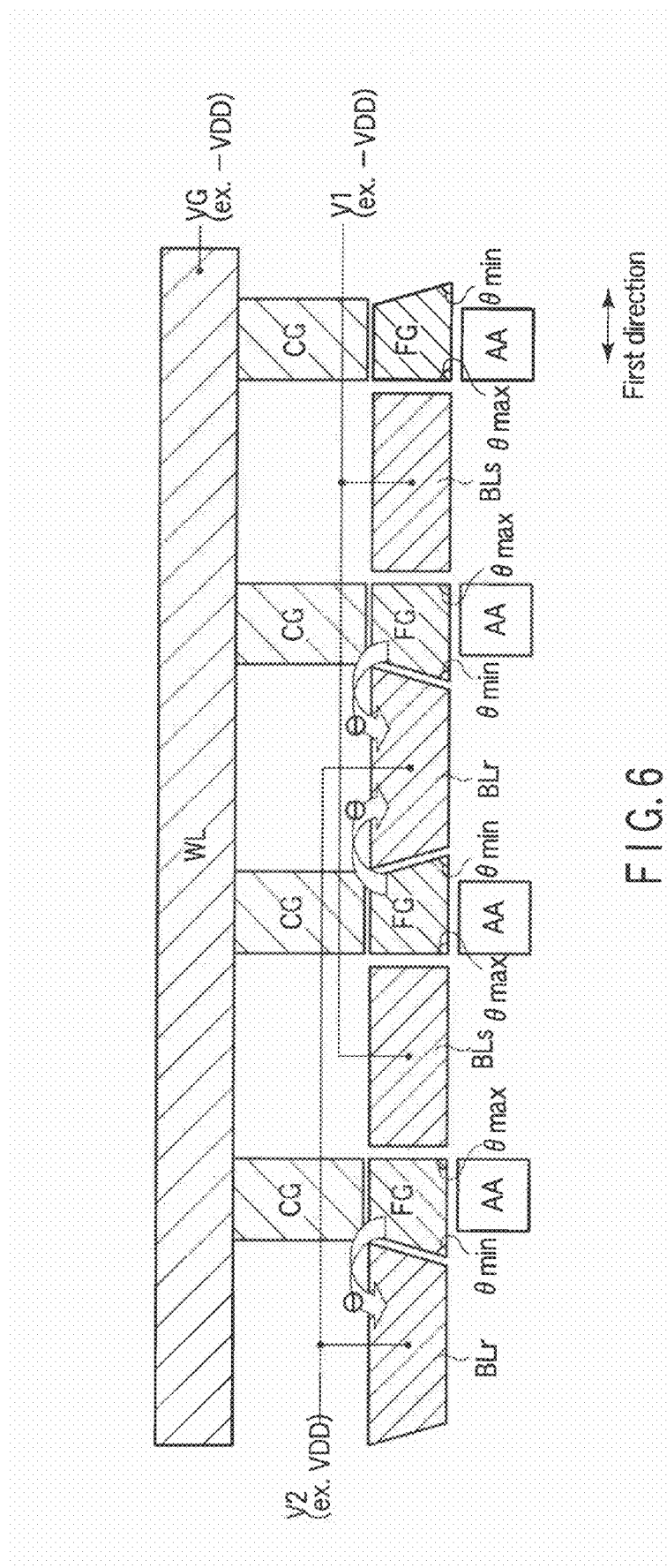

FIG. 4 is a birds-eye view showing the memory cell array architecture. In addition, FIGS. 5 and 6 are cross-sectional views of the memory cell array in a first direction in FIG. 4.

Active areas (semiconductor substrates or semiconductor layers, for example) AA, . . . are arranged in a line-and-space pattern in the first direction, and the lines of active areas AA, . . . extend in a second direction. Bit lines BLs, BLr, . . . are arranged above the spaces between active areas AA, . . . and extend in the second direction. The spaces between active areas AA, . . . are element isolation areas (STI: shallow trench isolation, for example).

Floating gates FG, . . . are arranged in the form of an array and provided above active areas AA, . . . and between bit lines BLs, BLr, . . . . Each of floating gates FG, . . . is sandwiched between two bit lines BLs, and BLr.

Gate insulating film is arranged between active areas AA, . . . and floating gates FG, . . . . In addition, tunnel insulating films are arranged between bit lines BLs, BLr, . . . and floating gates FG, . . . . Thus, since the gate insulating film and the tunnel insulating film are separately provided, the problem in reliability can be solved.

Here, each floating gate FG has two differently-shaped side surfaces which are positioned in the first direction, and adjacent floating gates FG, . . . in the first direction have symmetric side surfaces which are opposed to each other.

For example, referring to FIGS. 4 to 6, the right side surface of first floating gate FG from the left side and the left side surface of second floating gate FG from the left side are symmetric, and the right side surface of second floating gate FG from the left side and the left side surface of third floating gate FG from the left side are symmetric.

In addition, odd-numbered floating gates FG from the left side such as first and third floating gates FG from the left side have the same shape. More specifically, the left side surface is slanted and the right side surface is roughly vertical. Consequently, a taper angle θmin of the left side surface is smaller than a taper angle θmax of the right side surface.

Similarly, the even-numbered floating gates FG from the left side such as second and fourth floating gates FG from the left side have the same shape. More specifically, the right side surface is slanted and the left side surface is roughly vertical. Consequently, a taper angle θmin of the right side surface is smaller than a taper angle θmax of the left side surface.

Using such periodicity of the even-odd variation of floating gates FG, . . . , bit lines (charge serving-only lines) BLs which serve the charges into floating gates FG, . . . and bit lines (charge receiving-only lines) BLr which receive the charges from floating gates FG are alternately arranged.

More specifically, bit line (charge serving-only line) BLs is arranged on the side surface having the large taper angle θmax, and bit line (charge receiving-only line) BLr is arranged on the side surface having the small taper angle θmin.

When bit line (charge receiving-only line) BLr is arranged on the side surface having the small taper angle θmin, the angle formed between the bottom surface and the side surface of floating gate FG is an acute angle, so that the charge can easily move from floating gate FG to bit line (charge receiving-only line) BLr.

Since bit line (charge receiving-only line) BLr is arranged between the two side surfaces having the small taper angle θmin, the two side surfaces of bit line (charge receiving-only line) BLr in the first direction form an overhung shape. Therefore, the width of the upper surface of bit line (charge receiving-only line) BLr in the first direction is larger than the width of the lower surface thereof in the first direction.

In addition, when it is assumed that the distance between floating gates FG, . . . in the first direction is constant, the cross-sectional area of bit line (charge receiving-only line) BLr in the first direction is smaller than the cross-sectional area of bit line (charge serving-only line) BLs in the first direction. In other words, the resistance value of bit line (charge receiving-only line) BLr is greater than the resistance value of bit line (charge serving-only line) BLs.

Control gates CG, . . . are arranged above floating gates FG, . . . . An inter-electrode insulating film (IPD, for example) is arranged between floating gates FG, . . . and the control gates CG, . . . . Word lines WL, . . . are arranged above control gates CG, . . . . Word line WL extends in the first direction, and commonly connected to control gates CG, . . . arranged in the first direction.

In the multi-dot flash memory having the above structure, the charge can be injected and emitted to and from floating gates FG, . . . by controlling gate potential VG to be applied to word line WL, potential V1 to be applied to bit line (charge serving-only line) BLs, and potential V2 to be applied to bit line (charge receiving-only line) BLr.

For example, when the charge is an electron, the relation of the potentials is V2>V1, and VG>0 V. Potential V2 is a positive potential, for example, and potential V1 is a negative potential, for example.

More specifically, at the time of writing, the potentials are set such that VG=VDD/2, V1=−VDD, and V2=VDD as shown in FIG. 5. Here, the potential VDD is a power supply potential. The writing means an operation in which electrons are injected into floating gate FG. The same is true in the following description.

In this case, the electrons are injected from bit line (charge serving-only line) BLs to floating gates FG, . . . .

At the time of erasing, as shown in FIG. 6, the potentials are set such that VG=−VDD, V1=−VDD, and V2=VDD. Here, potential VDD is a power supply potential. The erasing means an operation in which electrons are emitted from floating gate FG. The same is true in the following description.

In this case, the electrons are emitted from the floating gates FG, . . . to bit line (charge receiving-only line) BLr.

As described above, one of the two tunnel insulating films existing right and left of floating gate FG is used for the writing (charge injection) and the other thereof is used for the erasing (charge emission).

Thus, since the direction of the tunnel current (electron flow) flowing in the tunnel insulating film is kept constant, the reliability of the tunnel insulating film can be improved.

In addition, when the tunnel insulating film and the gate insulating film are separately provided, the charge trap generated at the time of writing/erasing does not affect the gate insulating film, so that threshold voltage Vt at the time of reading can be prevented from shifting.

2. Principle of Present Invention

The present invention relates to a technique to control writing/erasing.

A description will be made of an example of the writing/erasing in a memory cell array architecture shown in FIGS. 1 and 2 or a memory cell array architecture shown in FIGS. 4, 5 and 6.

(1) Write Operation

Figure 7:
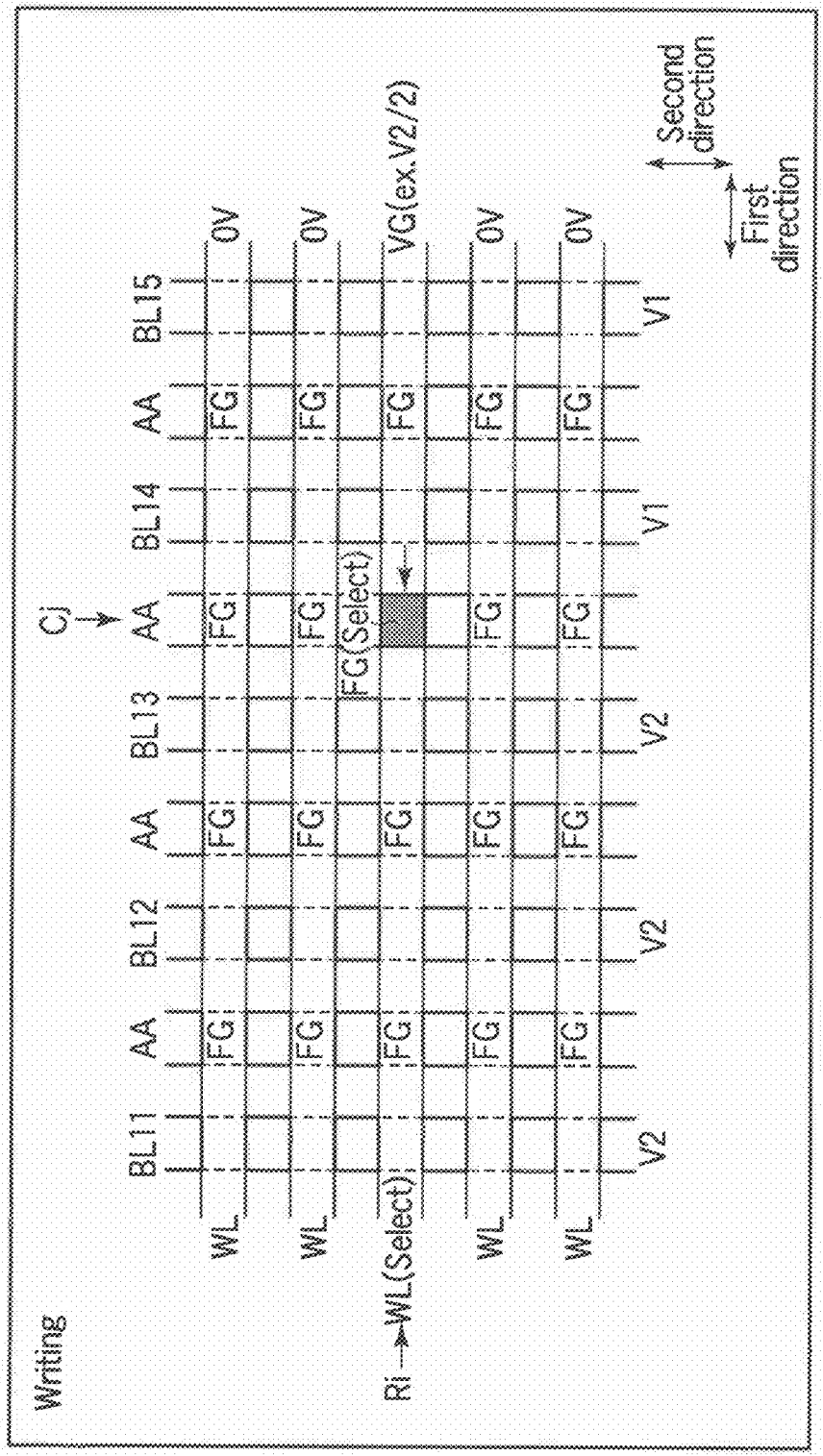
FIG. 7 is a diagram showing a write operation.

FIG. 7 shows an example of a write operation.

In this example, an electron is injected into one selected floating gate FG (Select) positioned at row address Ri and column address Cj from bit line BL14 positioned on the right side of it.

In this case, bit line BL14 on the right side of selected floating gate FG (Select) is set to V1 (minus potential, for example) and bit lines BL15, . . . positioned on the right side of bit line BL14 are all set to V1. In addition, bit line BL13 on the left side of selected floating gate FG (Select) is set to V2 (plus potential, for example), and bit lines BL12, BL11, . . . positioned on the left side of bit line BL13 are all set to V2.

Word line WL (Select) positioned over selected floating gate FG (Select) is set to VG (V2/2, for example), and the rest of word lines WL are set to 0 V.

In this state, the electron is injected from bit line BL14 on the right side of selected floating gate FG (Select), to selected floating gate FG (Select) as shown by an arrow.

(2) Erase Operation

Figure 8:
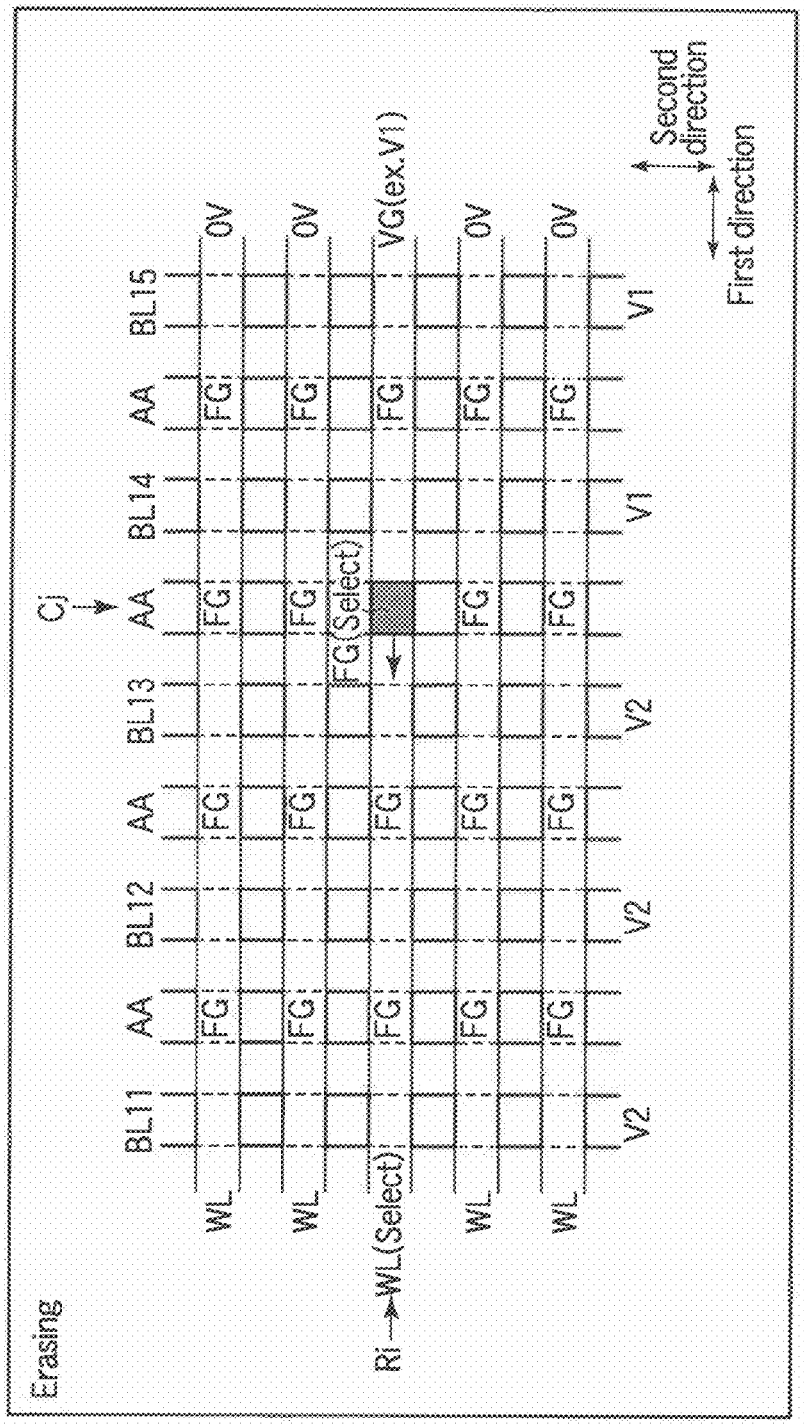
FIG. 8 is a diagram showing an erase operation.

FIG. 8 shows an example of an erase operation.

In this example, an electron is emitted from selected floating gate FG (Select) positioned at row address Ri and column address Cj, to bit line BL13 positioned on the left side of it.

In this case, bit line BL14 on the right side of selected floating gate FG (Select) is set to V1 (minus potential, for example), and bit lines BL15, . . . positioned on the right side of bit line BL14 are all set to V1. In addition, bit line BL13 on the left side of selected floating gate FG (Select) is set to V2 (plus potential, for example), and bit lines BL12, BL11, . . . positioned on the left side of bit line BL13 are all set to V2.

Word line WL (Select) positioned over selected floating gate FG (Select) is set to VG (V1, for example), and the rest of word lines WL are set to 0 V.

In this state, the electron is emitted from selected floating gate FG (Select) to bit line BL13 on the left side of selected floating gate FG (Select) as shown by an arrow.

(3) Problem

In the above write operation and erase operation, the bit lines have the same potential relationship and a different potential is applied to selected word line WL (Select).

Figure 9:
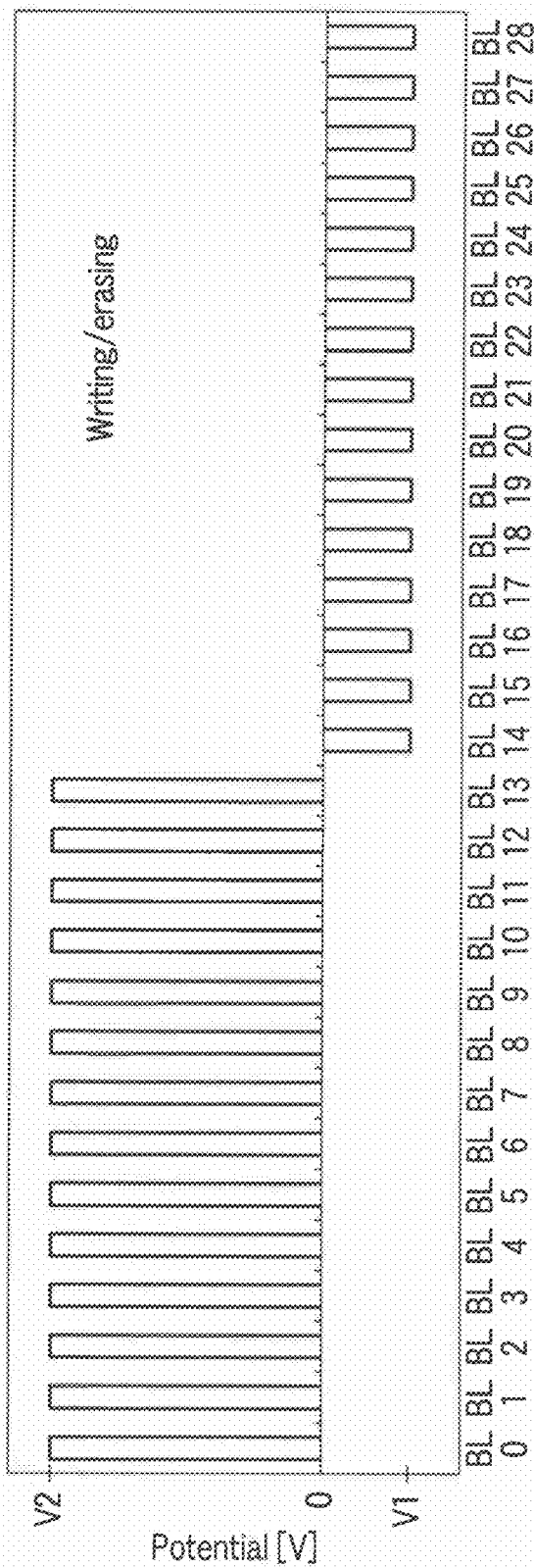
FIG. 9 is a diagram showing a potential of a bit line.

For example, as shown in FIG. 9, regarding the bit lines, bit lines BL14, BL15, . . . on the right side of selected floating gate FG (Select) are all set to V1, and bit lines BL13, BL12, BL11, . . . on the left side of selected floating gate FG (Select) are all set to V2.

However, in this potential relationship, since bit lines have to be all set to V1 or V2 at the time of writing/erasing, power consumption increases. In addition, this causes the problem that a waiting time for the writing/erasing increases and a design margin decreases due to upgrading the specification of a booster circuit.

In addition, after the writing/erasing, a verification is performed to verify whether the writing/erasing is completed or not. When it is verified that the writing/erasing is NG (writing/erasing is not completed), the writing/erasing is performed again, and when it is verified that the writing/erasing is OK (writing/erasing is completed), the writing/erasing is finished.

However, potential Vpass applied to the bit lines at the time of verification is considerably different from potentials V1 and V2 applied to the bit lines at the time of writing/erasing.

Therefore, when the writing/erasing and the verification are performed repeatedly, the potentials of the bit lines rapidly change (V1, V2→Vpass→V1, V2), thus the power consumption and the waiting time for writing/erasing noticeably increase.

Figure 10:
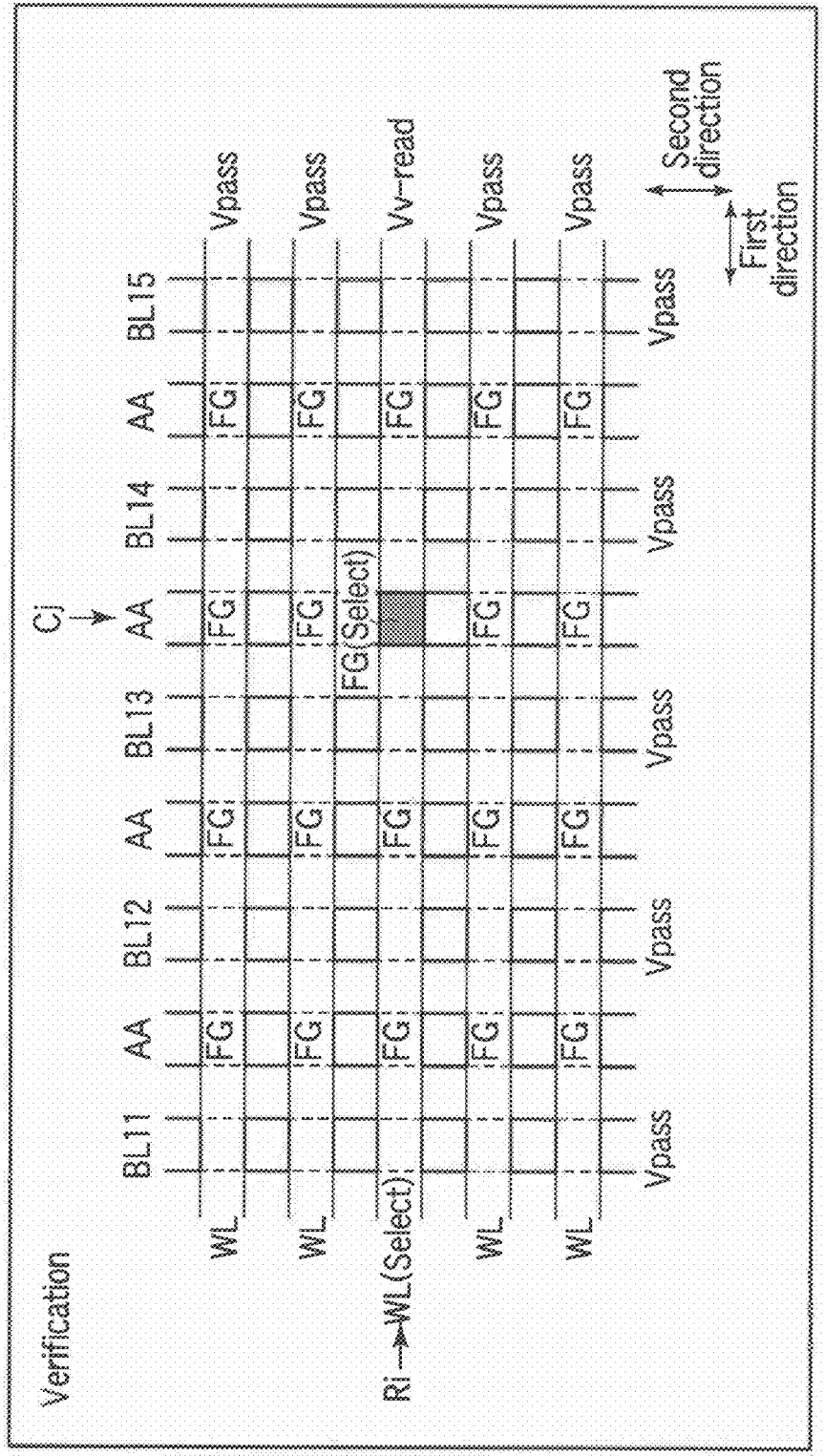
FIG. 10 is a diagram showing a verify operation.

FIG. 10 shows an example of a verify operation.

In this example, the verify operation is performed for a threshold value (charge quantity) of one selected memory cell (floating gate) FG (Select) positioned at row address Ri and column address Cj.

In this case, word line WL (Select) positioned over selected floating gate FG (Select) is set to Vv-read, and the rest of word lines WL are all set to Vpass.

Here, Vv-read means a minimum value or a maximum value of the threshold value set in the writing/erasing. In addition, Vpass means a potential to turn on memory cells (floating gates) FG except for memory cell FG (Select) regardless of its threshold value.

Therefore, whether or not the writing/erasing is completed can be verified by verifying whether the threshold value of floating gate FG (Select) is greater or smaller than Vv-read.

Figure 11:
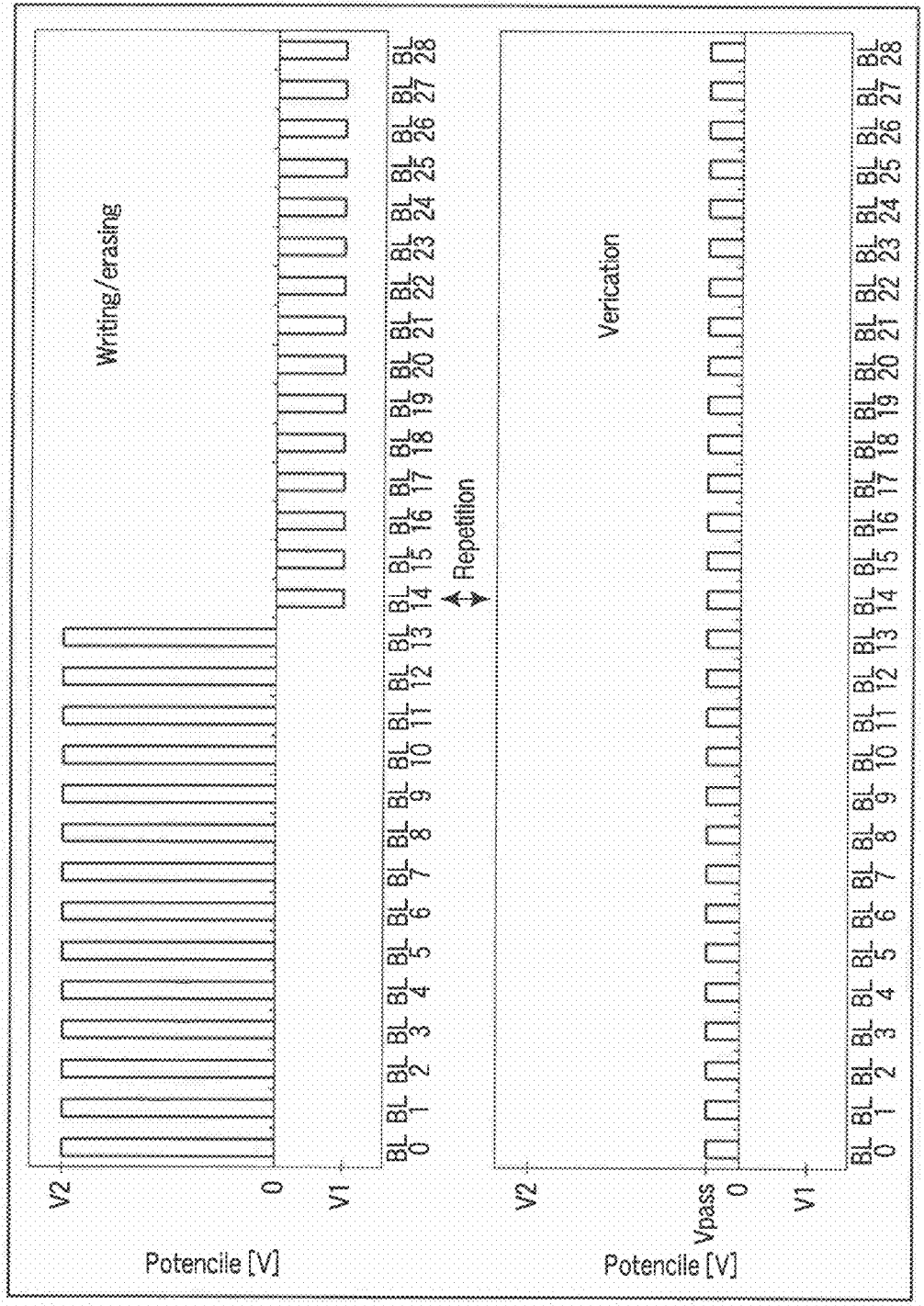
FIG. 11 is a diagram showing a potential of a bit line.

At this time, all bit lines are set to Vpass. Thus, as shown in FIG. 11, for example, when the writing/erasing and the verification are repeated, the potentials of the bit lines rapidly change (V1, V2→Vpass→V1, V2), so that the power consumption and the waiting time for the writing/erasing increase.

(4) Basic Concept

The present invention does not set the two bit lines positioned on both sides of the unselected floating gate (unselected memory cell) at the same potential (there is no potential difference) at the time of writing/erasing, but provides a potential difference between the two bit lines and sets the potential difference to a value which does not cause the transfer of electric charge due to the tunneling phenomenon, with a view to lowering power consumption.

More specifically, according to the present invention, the power consumption is lowered by gradually decreasing absolute values of the potentials of the bit lines positioned on the left/right side of selected floating gate FG (Select) with increase in distance from selected floating gate FG (Select) at the time of writing/erasing.

Figure 12:
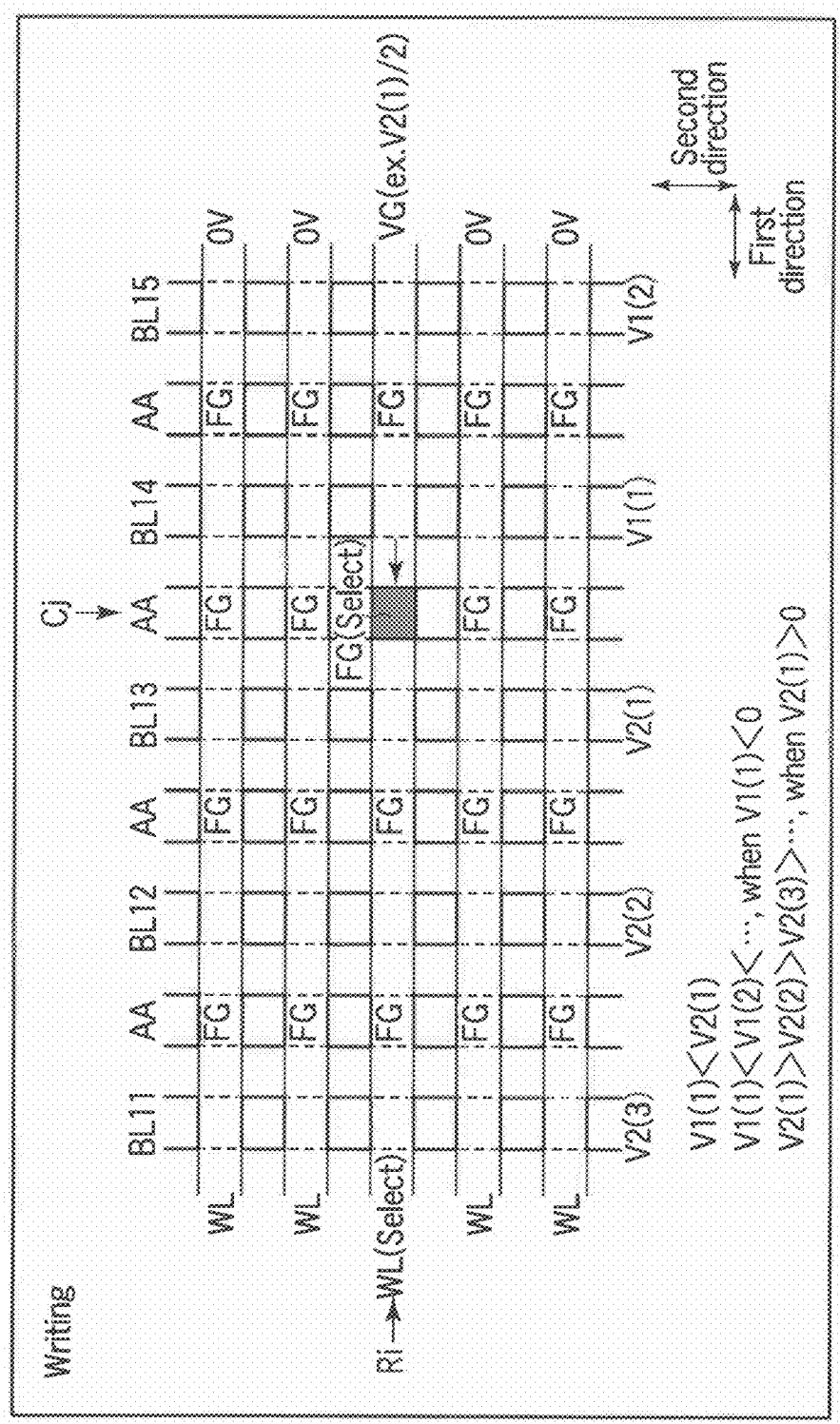
FIG. 12 is a diagram showing a write operation.

FIG. 12 shows an example of the write operation.

In this example, an electron is injected to selected floating gate FG (Select) positioned at row address Ri an column address Cj, from bit line BL14 positioned on the right side of it.

In this case, bit line BL14 on the right side of selected floating gate FG (Select) is set to V1(1) (minus potential, for example), and bit lines BL15, . . . positioned on the right side of bit line BL14 are set to V1(2), . . . .

In addition, bit line BL13 on the left side of selected floating gate FG (Select) is set to V2(1) (plus potential, for example), and bit lines BL12, BL11, . . . positioned on the left side of bit line BL13 are set to V2(2), V2(3), . . . .

Here, it is to be noted that V1(1)<V2(1).

In addition, when V1(1)<0, V1(1)<V1(2)< . . . , and when V1(1)>0, V1(1)>V1(2)> . . . .

In addition, when V2(1)>0, V2(1)>V2(2)>V2(3)> . . . , and when V2(1)<0, V2(1)<V2(2)<V2(3)< . . . .

Word line WL (Select) positioned over selected floating gate FG (Select) is set to VG (V2(1)/2, for example), and the rest of word lines WL are set to 0 V.

In this state, the electron is injected from bit line BL14 on the right side of selected floating gate FG (Select), to selected floating gate FG (Select) as shown by an arrow.

In addition, since the absolute values of the potentials of the bit lines positioned on the left/right side of selected floating gate FG (Select) gradually decrease with increase in distance from selected floating gate FG (Select), the power consumption can be lowered.

Figure 13:
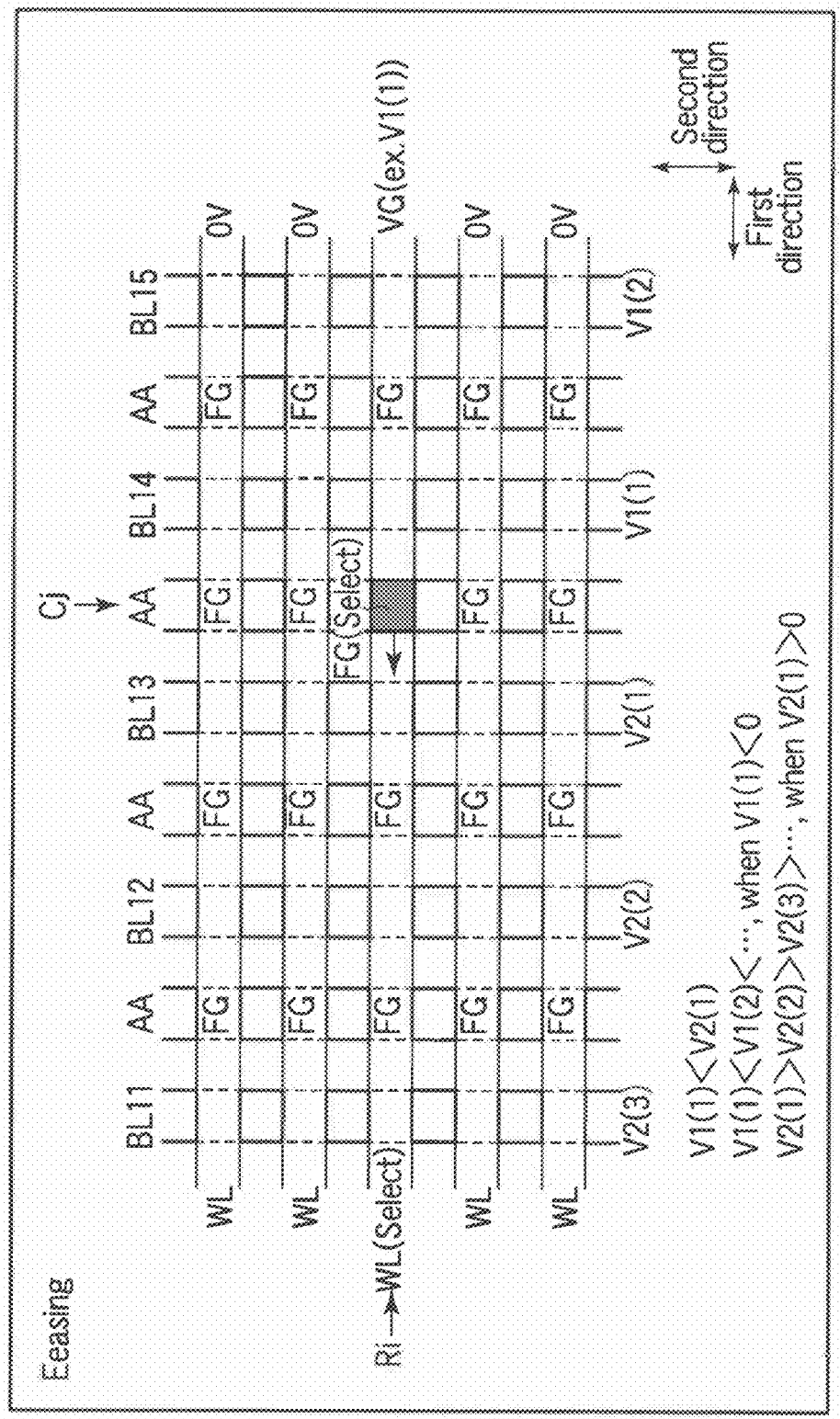
FIG. 13 is a diagram showing an erase operation.

FIG. 13 shows an example of the erase operation.

In this example, an electron is emitted from selected floating gate FG (Select) positioned at row address Ri and column address Cj to bit line BL13 positioned on the left side of it.

In this case, bit line BL14 on the right side of selected floating gate FG (Select) is set to V1(1) (minus potential, for example), and bit lines BL15, ... positioned on the right side of bit line BL14 are set to V1(2), ....

In addition, bit line BL13 on the left side of selected floating gate FG (Select) is set to V2(1) (plus potential, for example), and bit lines BL12, BL11, ... positioned on the left side of bit line BL13 are set to V2(2), V2(3), ....

Here, it is to be noted that V1(1)<V2(1).

In addition, when V1(1)<0, V1(1)<V1(2)<..., and when V1(1)>0, V1(1)>V1(2)>....

In addition, when V2(1)>0, V2(1)>V2(2)>V2(3)>..., and when V2(1)<0, V2(1)<V2(2)<V2(3)<....

Word line WL (Select) positioned on selected floating gate FG (Select) is set to VG (V1(1), for example), and the rest of word lines WL are set to 0 V.

In this state, the electron is emitted from selected floating gate FG (Select) to bit line BL13 on the left side of selected floating gate FG (Select) as shown by an arrow.

In addition, since the absolute values of the potentials of the bit lines positioned on the left/right side of selected floating gate FG (Select) gradually decrease with increase in distance from selected floating gate FG (Select), the power consumption can be lowered.

(5) Advantage

Figure 14:
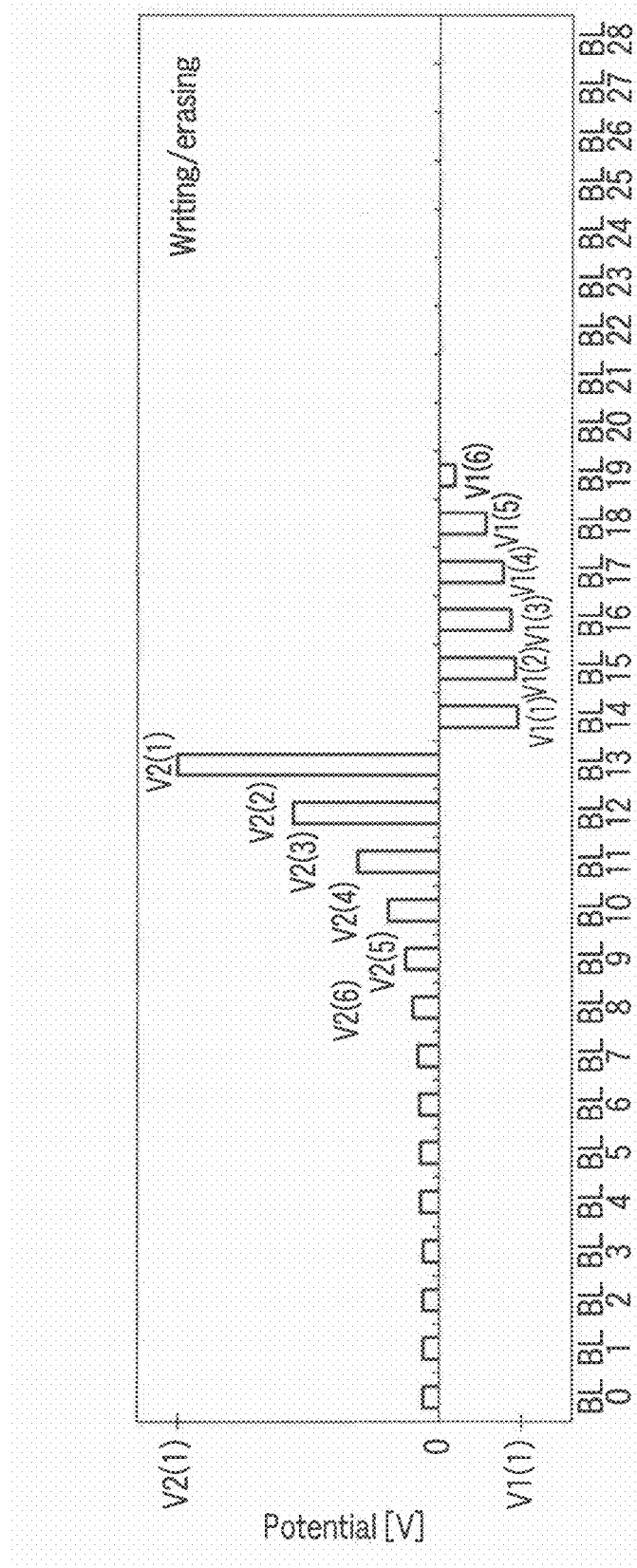
FIG. 14 is a diagram showing a potential of a bit line.

According to the principle of the present invention, for example, as shown in FIG. 14, potentials V1(1), V1(2) ... of bit lines BL14, BL15, ... on the right side of selected floating gate FG (Select) are minus potentials, and gradually increase with increase in distance from selected floating gate FG (Select).

In other words, the absolute values of potentials V1(1), V1(2) ... of bit lines BL14, BL15, ... gradually decrease with increase in distance from selected floating gate FG (Select).

In addition, the potentials V2(1), V2(2), V2(3), ... of bit lines BL13, BL12, BL11, ... positioned on the left side of selected floating gate FG (Select) are plus potentials, and gradually decrease with increase in distance from selected floating gate FG (Select).

In other words, the absolute values of potentials V2(1), V2(2), V2(3), ... of bit lines BL13, BL12, BL11, ... gradually decrease with increase in distance from selected floating gate FG (Select).

Therefore, as is clear from a comparison between FIG. 9 and FIG. 14, according to the present invention, since the potentials of the bit lines are sequentially varied at the time of writing/erasing, the potential variation of the bit lines decreases with increase in distance from selected floating gate FG (Select), which contributes to reduced power consumption. Accordingly, the problem that the waiting time for the writing/erasing increases and the design margin decreases due to a specification upgrade of the booster circuit can be solved.

In addition, after the writing/erasing, the verification is performed to verify whether the writing/erasing is completed or not. Thus, when it is verified that the writing/erasing is NG (writing/erasing is not completed), the writing/erasing is performed again, and when it is verified that the writing/erasing is OK (writing/erasing is completed), the writing/erasing is finished.

Here, with this principle of the present invention, the potentials of the bit lines positioned on the left/right side of selected floating gate FG (Select) can be gradually brought close to Vpass with increase in distance from selected floating gate FG (Select) and finally can reach Vpass at the time of writing/erasing.

Vpass means the potential to be applied to the bit lines at the time of verification.

In this case, even when the writing/erasing and verification are performed repeatedly, the bit lines that are spaced sufficiently away from selected floating gate FG (Select) have no potential variation (always Vpass). Therefore, the power consumption can be further lowered, and the waiting time for the writing/erasing can be further shortened.

Figure 15:
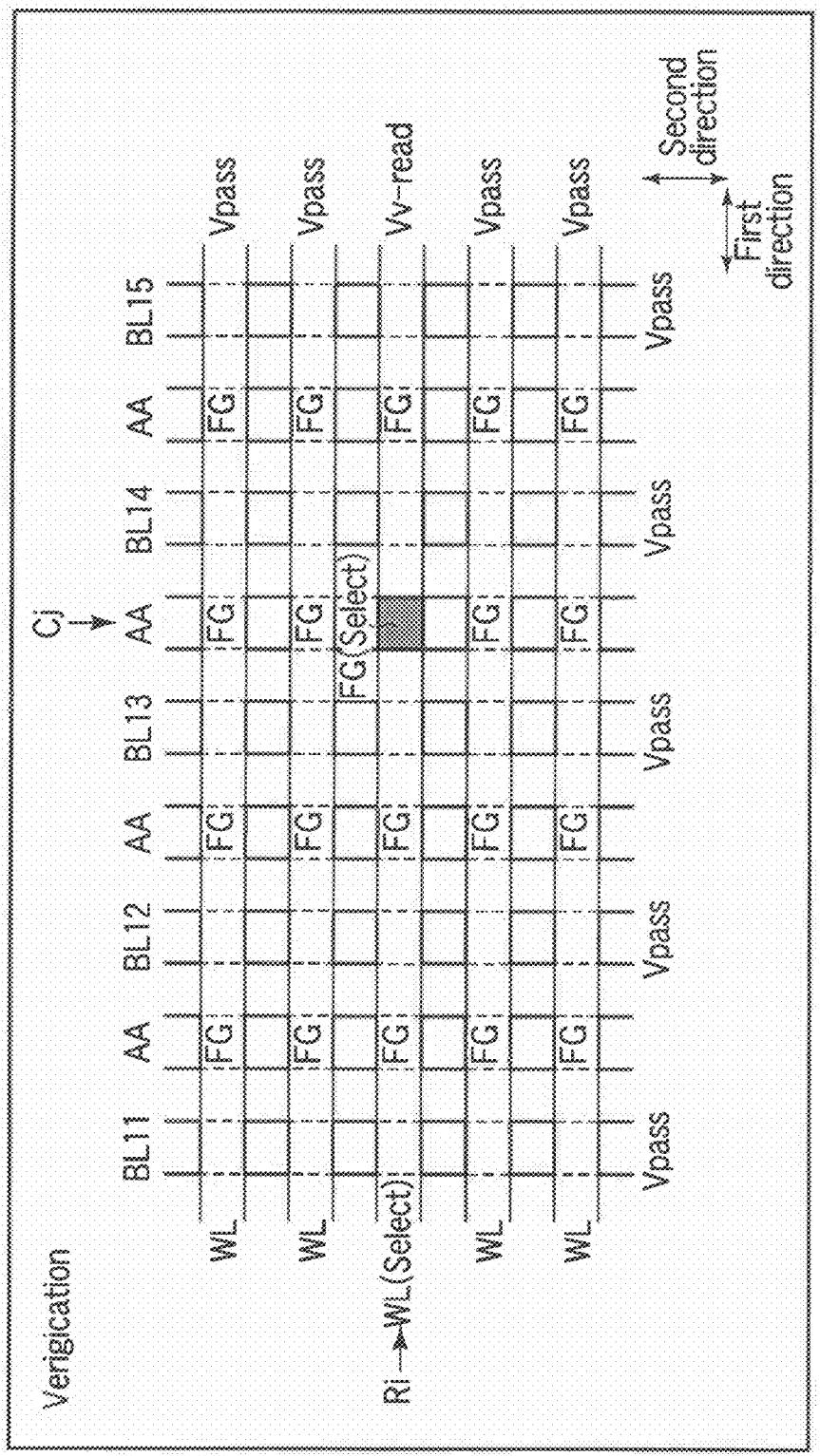
FIG. 15 is a diagram showing a verify operation.

FIG. 15 shows a verify operation.

In this example, the verify operation is performed for a threshold value (charge quantity) of one selected memory cell (floating gate) FG (Select) positioned at row address Ri and column address Cj.

In this case, word line WL (Select) positioned over selected floating gate FG (Select) is set to Vv-read, and the rest of word lines WL are all set to Vpass.

Therefore, whether or not the writing/erasing is completed can be verified by verifying whether the threshold value of floating gate FG (Select) is greater or smaller than Vv-read.

At this time, bit lines are all set to Vpass.

Figure 16:
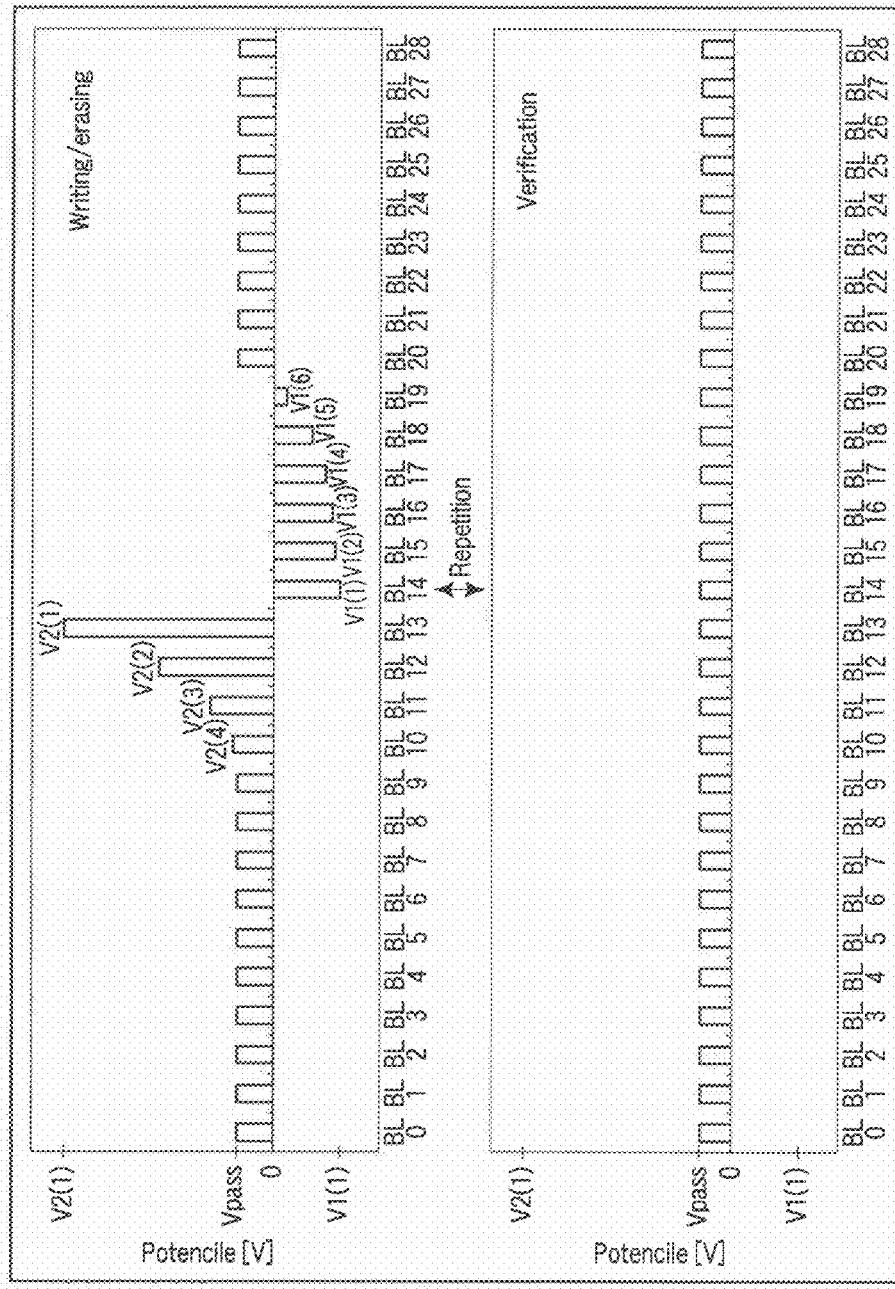
FIG. 16 is a diagram showing a potential of a bit line.

Thus, for example, as shown in FIG. 16, when the writing/erasing and verification are repeated, the potential variations of bit lines BL10 to BL12, and BL15 to BL19 are gentle, while bit lines BL0 to BL9, and BL20 to BL28 have no potential variation.

Therefore, the power consumption can be lowered, and the waiting time for the writing/erasing can be shortened.

3. Variation of Potential of Bit Line

When the potentials of the bit lines are sequentially varied with increase in distance from selected floating gate FG (Select), the variation amount of the potential of the bit line has to be set within a range so as not to generate an error when writing or erasing.

Hereinafter, the range of the variation amount will be described.

First, to simply the following explanation, a memory cell structure of the present invention will be divided into segments.

Figure 17:
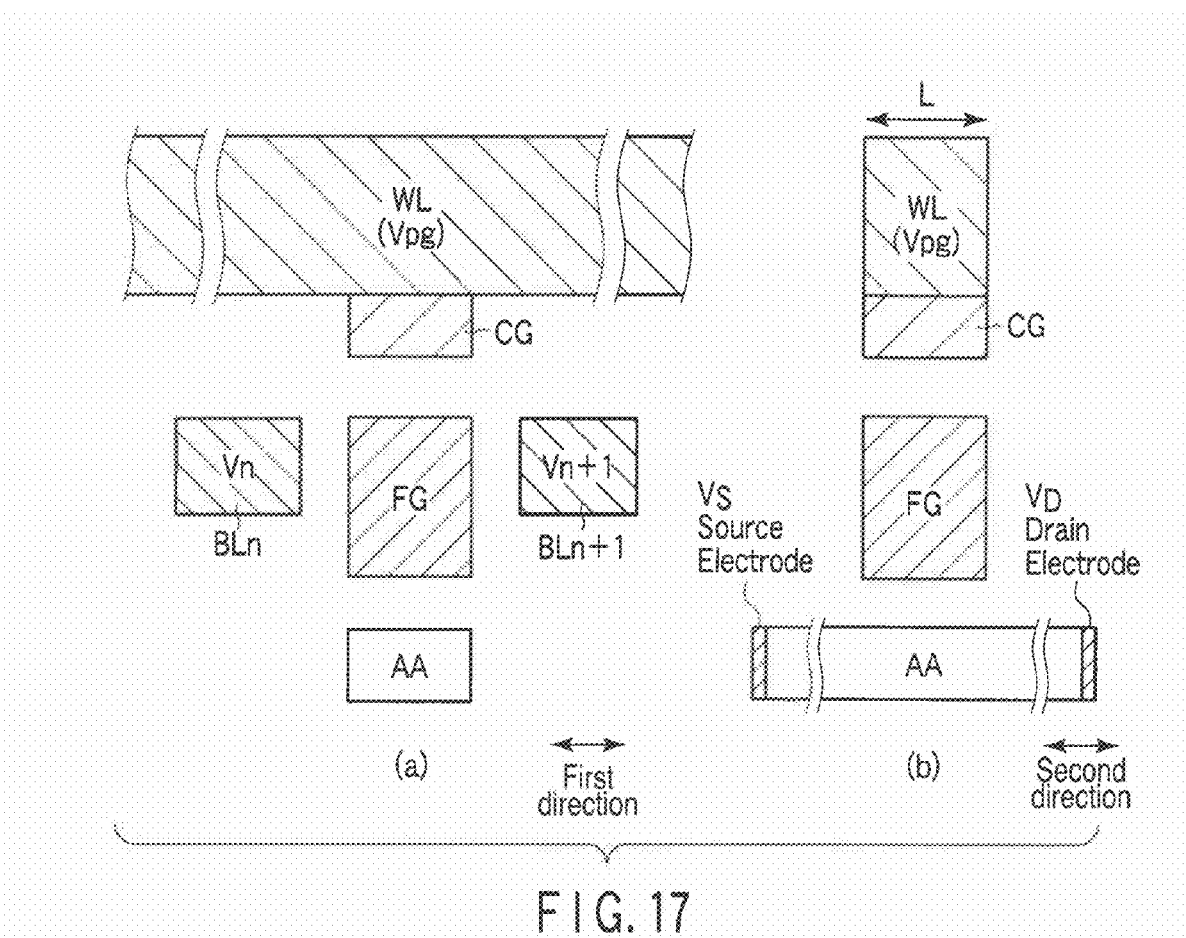
FIG. 17 is a diagram showing a memory cell.

FIG. 17 shows the segmented memory cell structure according to the present invention.

Figure 18:
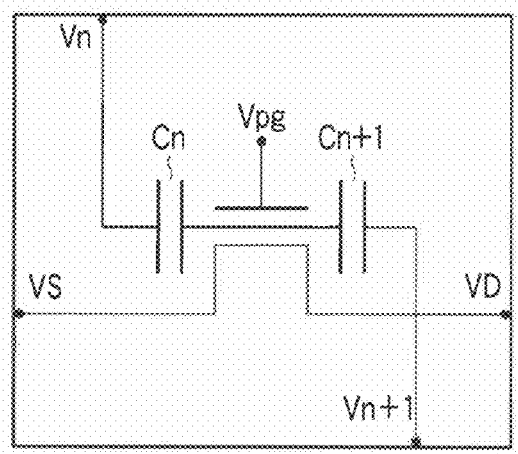
FIG. 18 is a diagram showing an equivalent circuit of a memory cell.

Item (a) of FIG. 17 is a cross-sectional view taken along a first direction in which the word line extends, and Item (b) of FIG. 17 is a cross-sectional view taken along a second direction in which the bit line extends. FIG. 18 shows an equivalent circuit created from the segmented view of the memory cell of the multi-dot flash memory according to the present invention.

Figure 19:
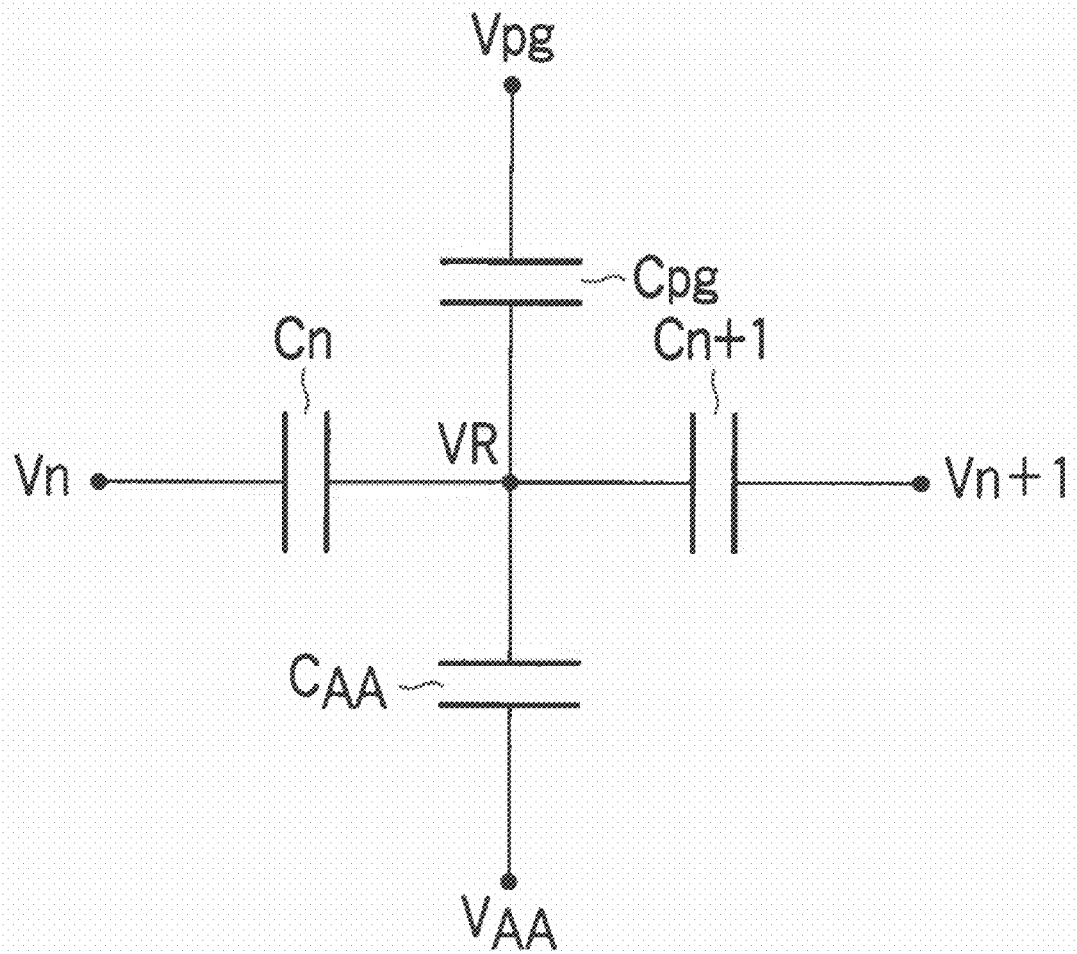
FIG. 19 is a diagram showing a capacitance which generates to a memory cell.

In addition, FIG. 19 shows an equivalent circuit of electric capacitances generated in the memory cell.

Referring to FIGS. 17, 18 and 19, WL is the word line, CG is a control gate, FG is the floating gate, AA is an active area, $BL_n$ is an n-th (n is a natural number) bit line from the selected floating gate as a target of the writing/erasing, and $BL_{n+1}$ is an (n+1)-th bit line from the selected floating gate as a target of the writing/erasing.

$C_n$ is an electric capacitance between n-th bit line $BL_n$ and floating gate FG, $C_{n+1}$ is an electric capacitance between (n+1)-th bit line $BL_{n+1}$ and floating gate FG, $C_{pg}$ is an electric capacitance between control gate CG and floating gate FG, and $C_{AA}$ is an electric capacitance between active area AA and floating gate FG.

$V_n$ is a potential of n-th bit line $BL_n$, $V_{n+1}$ is a potential of (n+1)-th bit line $BL_{n+1}$, $V_{pg}$ is a potential of control gate CG, $V_{AA}$ is a potential of active area AA, and VR is a potential of floating gate FG.

In the above segmented memory cell structure, a condition is to be found to prevent writing and erasing errors of unselected memory cells not targeted for writing/erasing.

This condition is satisfied by preventing an electric charge from being injected to/emitted from the floating gate of the unselected memory cell due to the tunneling phenomenon.

First, formula (1) is derived from a basic formula of a charge quantity.

$$C_n V_1 - C_{n+1} V_2 - C_{pg} V_3 - C_{AA} V_4 = Q \quad (1)$$

Where Q is a charge quantity accumulated in floating gate FG, V1 is a voltage between n-th bit line $BL_n$ and floating gate FG, V2 is a voltage between (n+1)-th bit line $BL_{n+1}$ and floating gate FG, V3 is a voltage between control gate CG and floating gate FG, and V4 is a voltage between active area AA and floating gate FG.

In addition, formula (2) is derived by erasing V2, V3 and VR from formula (1) based on the following formulas:

$$V1 = VR - V_n$$

$$V2 = V_{n+1} - VR$$

$$V3 = V_{pg} - VR$$

$$V4 = V_{AA} - VR$$

$$C_n V_1 + C_{n+1}(V_n + V_1 - V_{n+1}) + C_{pg}(V_n + V_1 - V_{AA}) = Q \quad (2)$$

In addition, $Eth_n$ is a threshold value of an electric field intensity in which a transfer of electric charges is generated by the tunneling phenomenon between n-th bit line $BL_n$ and floating gate FG, and $d_n$ is a thickness of an insulating film between n-th bit line $BL_n$ and floating gate FG.

At this time, the condition to prevent the transfer of electric charge from being generated by the tunneling phenomenon between n-th bit line $BL_n$ and floating gate FG is shown in formula (3).

$$-Eth_n < \frac{V_1}{d_n} = \frac{C_{n+1}(V_{n+1} - V_n) + C_{pg}(V_{pg} - V_n) + C_{AA}(V_{AA} - V_n) + Q}{d_n(C_n + C_{n+1} + C_{pg} + C_{AA})} < Eth_n \quad (3)$$

When formula (3) is expressed as the condition of $V_n$, formula (4) is derived.

$$\frac{C_{n+1}V_{n+1} + C_{pg}V_{pg} + C_{AA}V_{AA} + Q - d_n Eth_n(C_n + C_{n+1} + C_{pg} + C_{AA})}{C_{n+1} + C_{pg} + C_{AA}} < \quad (4)$$

$$V_n < \frac{C_{n+1}V_{n+1} + C_{pg}V_{pg} + C_{AA}V_{AA} + Q + d_n Eth_n(C_n + C_{n+1} + C_{pg} + C_{AA})}{C_{n+1} + C_{pg} + C_{AA}}$$

In addition, when formula (3) is expressed as the condition of $V_{n+1}$, formula (5) is derived.

$$\frac{(C_{n+1} + C_{pg} + C_{AA})V_n - C_{pg}V_{pg} - C_{AA}V_{AA} - Q - d_n Eth_n(C_n + C_{n+1} + C_{pg} + C_{AA})}{C_{n+1}} < \quad (5)$$

$$V_{n+1} < \frac{(C_{n+1} + C_{pg} + C_{AA})V_n - C_{pg}V_{pg} - C_{AA}V_{AA} - Q + d_n Eth_n(C_n + C_{n+1} + C_{pg} + C_{AA})}{C_{n+1}}$$

Here, when n-th bit line $BL_n$ and the (n+1)-th bit line $BL_{n+1}$ are symmetrical with respect to floating gate FG, and $Q_{min}$ is a minimum electric charge quantity in floating gate FG, and $Q_{max}$ is a maximum electric charge quantity in floating gate FG, the following formulas (6) to (9) are derived.

A condition to prevent the transfer of electric charge from being generated by the tunneling phenomenon between (n+1)-th bit line $BL_{n+1}$ and floating gate FG $$\frac{C_n V_n + C_{pg}V_{pg} + C_{AA}V_{AA} + Q_{min} - d_{n+1} Eth_{n+1}(C_n + C_{n+1} + C_{pg} + C_{AA})}{C_n + C_{pg} + C_{AA}} < \quad (6)$$

$$V_{n+1} < \frac{C_n V_n + C_{pg}V_{pg} + C_{AA}V_{AA} + Q_{max} + d_{n+1} Eth_{n+1}(C_n + C_{n+1} + C_{pg} + C_{AA})}{C_n + C_{pg} + C_{AA}}$$

where $Eth_{n+1}$ is a threshold value of electric field intensity in which a transfer of electric charge is generated by the tunneling phenomenon between (n+1)-th bit line $BL_{n+1}$ and floating gate FG, and $d_{n+1}$ is a thickness of an insulating film between (n+1)-th bit line $BL_{n+1}$ and floating gate FG.

A condition to prevent the transfer of electric charge from being generated by the tunneling phenomenon between n-th bit line $BL_n$ and floating gate FG $$\frac{(C_{n+1} + C_{pg} + C_{AA})V_n - C_{pg}V_{pg} - C_{AA}V_{AA} - Q_{max} - d_n Eth_n(C_n + C_{n+1} + C_{pg} + C_{AA})}{C_{n+1}} < \quad (7)$$

$$V_{n+1} < \frac{(C_{n+1} + C_{pg} + C_{AA})V_n - C_{pg}V_{pg} - C_{AA}V_{AA} - Q_{min} + d_n Eth_n(C_n + C_{n+1} + C_{pg} + C_{AA})}{C_{n+1}}$$

where $Eth_n$ is the threshold value of the electric field intensity in which the transfer of electric charge is generated by the tunneling phenomenon between n-th bit line $BL_n$ and floating gate FG, and $d_n$ is the thickness of the insulating film between n-th bit line $BL_n$ and floating gate FG.

A condition to prevent a transfer of electric charge from being generated by the tunneling phenomenon between control gate CG and floating gate FG $$\frac{(C_{n+1} + C_n + C_{AA})V_{pg} - C_n V_n - C_{AA}V_{AA} - Q_{max} - d_{pg} Eth_{pg}(C_n + C_{n+1} + C_{pg} + C_{AA})}{C_{n+1}} < \quad (8)$$

$$V_{n+1} < \frac{(C_{n+1} + C_n + C_{AA})V_{pg} - C_n V_n - C_{AA}V_{AA} - Q_{max} - d_{pg} Eth_{pg}(C_n + C_{n+1} + C_{pg} + C_{AA})}{C_{n+1}}$$

where $Eth_{pg}$ is a threshold value of electric field intensity in which a transfer of electric charge is generated by the tunneling phenomenon between control gate CG and floating gate FG, and $d_{pg}$ is a thickness of an insulating film between control gate CG and floating gate FG.

A condition to prevent a transfer of electric charge from being generated by the tunneling phenomenon between active area AA and floating gate FG $$(C_{n+1} + C_{pg} + C_n)V_{AA} - C_{pg}V_{pg} - C_nV_n - \frac{Q_{max} - d_{AA}Eth_{AA}(C_n + C_{n+1} + C_{pg} + C_{AA})}{C_{n+1}} < \qquad (9)$$

$$V_{n+1} < \frac{(C_{n+1} + C_{pg} + C_n)V_{AA} - C_{pg}V_{pg} - C_nV_n - Q_{min} + d_{AA}Eth_{AA}(C_n + C_{n+1} + C_{pg} + C_{AA})}{C_{n+1}}$$

where $Eth_{AA}$ is a threshold value of electric field intensity in which the transfer of electric charge is generated by the tunneling phenomenon between active area AA and floating gate FG, and $d_{AA}$ is a thickness of an insulating film between active area AA and floating gate FG.

Thus, the conditions to prevent electric charge from being injected to/emitted from floating gate FG of the unselected memory cell by the tunneling phenomenon, are expressed by formula (10) and formula (11).

$$\max \begin{pmatrix} \frac{C_nV_n + C_{pg}V_{pg} + C_{AA}V_{AA} + Q_{min} - \frac{d_{n+1}Eth_{n+1}(C_n + C_{n+1} + C_{pg} + C_{AA})}{C_n + C_{pg} + C_{AA}}}{}, \\ \frac{(C_{n+1} + C_{pg} + C_{AA})V_n - C_{pg}V_{pg} - C_{AA}V_{AA} - Q_{max} - d_nEth_n(C_n + C_{n+1} + C_{pg} + C_{AA})}{C_{n+1}}, \\ \frac{(C_{n+1} + C_n + C_{AA})V_{pg} - C_nV_n - C_{AA}V_{AA} - Q_{max} - d_{pg}Eth_{pg}(C_n + C_{n+1} + C_{pg} + C_{AA})}{C_{n+1}}, \\ \frac{(C_{n+1} + C_{pg} + C_n)V_{AA} - C_{pg}V_{pg} - C_nV_n - Q_{max} - d_{AA}Eth_{AA}(C_n + C_{n+1} + C_{pg} + C_{AA})}{C_{n+1}} \end{pmatrix} < V_{n+1} \qquad (10)$$

$$\min \begin{pmatrix} \frac{C_nV_n + C_{pg}V_{pg} + C_{AA}V_{AA} + Q_{max} + \frac{d_{n+1}Eth_{n+1}(C_n + C_{n+1} + C_{pg} + C_{AA})}{C_n + C_{pg} + C_{AA}}}{}, \\ \frac{(C_{n+1} + C_{pg} + C_{AA})V_n - C_{pg}V_{pg} - C_{AA}V_{AA} - Q_{min} + d_nEth_n(C_n + C_{n+1} + C_{pg} + C_{AA})}{C_{n+1}}, \\ \frac{(C_{n+1} + C_n + C_{AA})V_{pg} - C_nV_n - C_{AA}V_{AA} - Q_{min} + d_{pg}Eth_{pg}(C_n + C_{n+1} + C_{pg} + C_{AA})}{C_{n+1}}, \\ \frac{(C_{n+1} + C_{pg} + C_n)V_{AA} - C_{pg}V_{pg} - C_nV_n - Q_{min} + d_{AA}Eth_{AA}(C_n + C_{n+1} + C_{pg} + C_{AA})}{C_{n+1}} \end{pmatrix} > V_{n+1} \qquad (11)$$

where $Q_{min}$ and $Q_{max}$ are previously determined values of a specification when used as a memory. The specification is determined under the condition that when the written floating gate (memory cell) is not selected, writing and erasing errors are not generated, or when the floating gate (memory cell) written to is not selected, an electron does not leak from the floating gate.

In addition, the specification may be determined so as to always satisfy formula (10) and formula (11) in an unselected bit line, to prevent writing and erasing errors.

4. System for Writing/Erasing

FIG. 20 shows a system for the writing/erasing.

Memory cell array MA has the structure shown in FIGS. 1 and 2 or the structure shown in FIGS. 4, 5 and 6.

(N+1) word lines WL0, WL1, . . . WLN are connected to word line decoder 21, and (N+1) bit lines BL0, BL1, . . . BLN are connected to bit line decoder 22. N data lines DL1, DL2, . . . DLN are connected to sense amplifier S/A.

ROM 11 stores a program to execute the writing/erasing according to the present invention.

Control circuit 12 controls word line decoder 21, bit line decoder 22, and sense amplifier S/A, based on the program stored in ROM 11.

Figure 21:
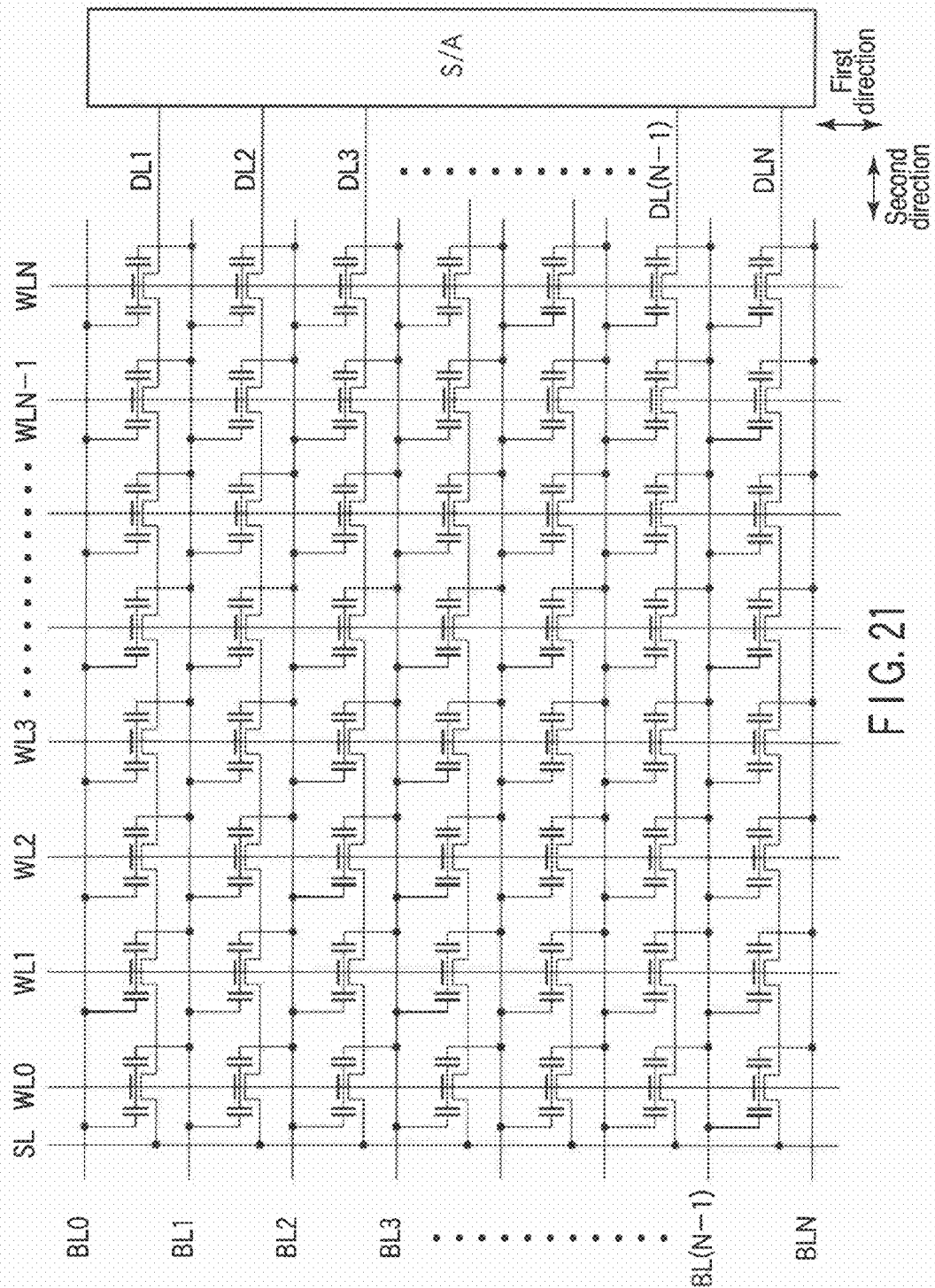
FIG. 21 is a diagram showing a memory cell array.

FIG. 21 shows memory cell array MA in FIG. 20.

In this drawing, the memory cell is expressed by the equivalent circuit in FIG. 18.

In this example, (N+1) word lines WL0, WL1, . . . WLN and (N+1) bit lines BL0, BL1, . . . BLN are arranged on the memory cell array. N data lines DL1, DL2, . . . DLN electrically connect drain regions of one ends of N NAND columns to sense amplifier (S/A).

In the multi-dot flash memory according to the present invention, the writing/erasing is performed in a random access mode. In addition, reading is performed at the same time with respect to the memory cells connected to one word line WLi, and sequentially performed with respect to the memory cells in each NAND column.

Figure 22:
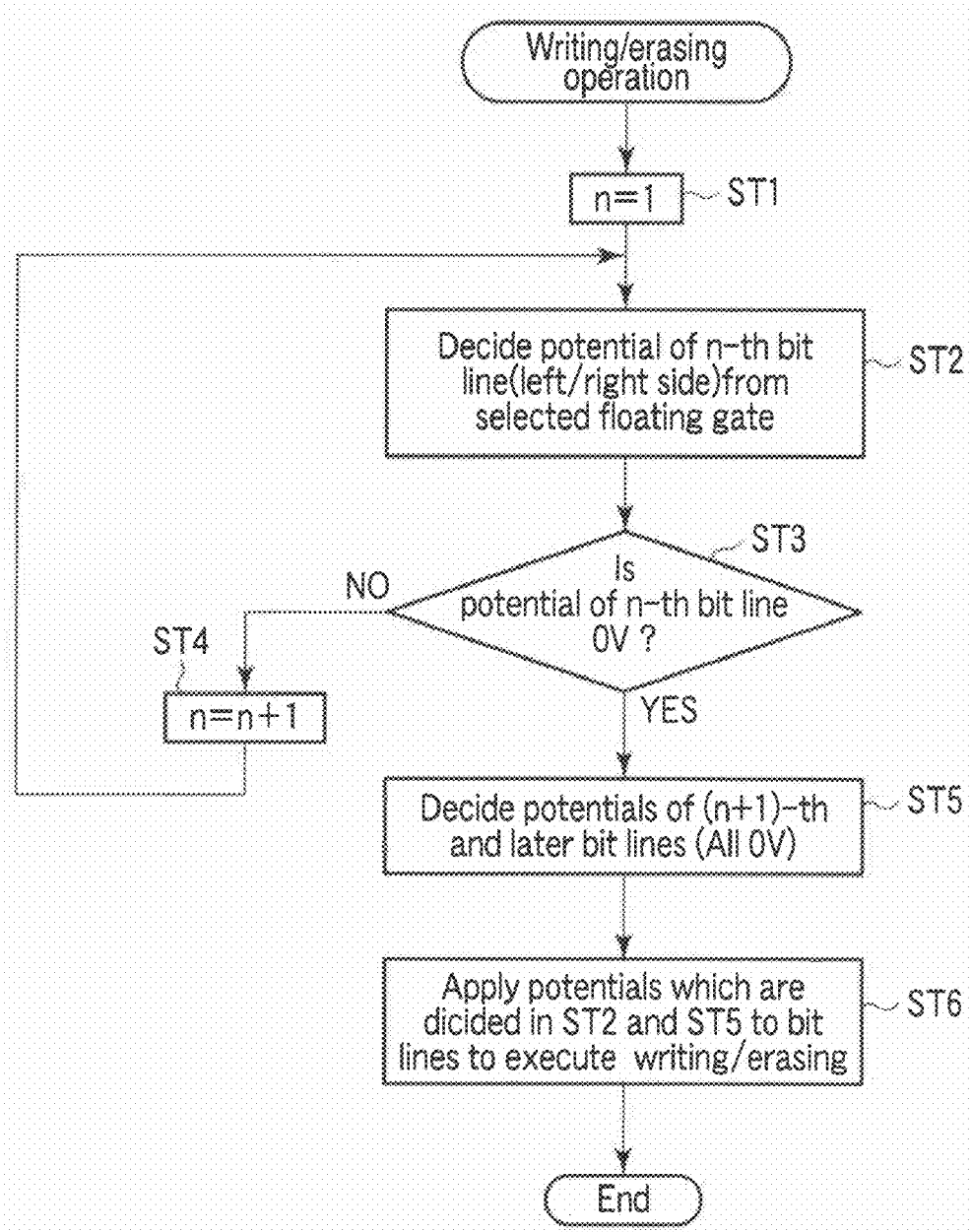
FIGS. 22 and 23 are diagrams, each showing an operation which decides a potential of a bit line sequentially.

FIG. 22 shows a first example of the writing/erasing.

This operation is controlled by control circuit 12 shown in FIG. 20.

First, n is set to 1 (step ST1), and the potential of the n (=1)-th bit line from the selected memory cell (floating gate) on the left/right side is decided, based on an address signal (step ST2).

The potential of the n (=1)-th bit line from the selected memory cell on the left/right side is set sufficiently higher for the selected floating gate so that transfer of electric charge is generated by the tunneling phenomenon.

For example, the potential of the n (=1)-th bit line positioned on the left side of the selected floating gate is set to a plus potential, and the potential of the n (=1)-th bit line positioned on the right side of the selected floating gate is set to a minus potential.

Then, it is determined whether the potential of the n (=1)-th bit line is 0 V or not (step ST3).

When the potential of the n (=1)-th bit line is not 0 V, n is set to (n+1) (step ST4), and the potential of the (n+1)-th bit line from the selected memory cell (floating gate) on the right/left side is decided (step ST2).

The potentials of the (n+1)-th bit line on the right/left side from the selected memory cell are set to a value so that the transfer of electric charge is prevented from being generated due to the tunneling phenomenon, for the unselected floating gate positioned between the n-th bit line and the (n+1)-th bit line.

More specifically, the potential of the (n+1)-th bit line is decided based on formula (10).

Then, it is determined whether the potential of the (n+1)-th bit line is 0 V or not (step ST3).

When the potential of the (n+1)-th bit line is 0 V, the potentials of the bit lines after the (n+1)-th bit line are set to 0 V (step ST5).

Then, the potentials decided in steps ST2 and ST5 are applied to the bit lines to execute the writing/erasing (step ST6).

As described above, in the first example, the potentials of the bit lines on the right/left side of the selected floating gate are sequentially decided from the bit line positioned closest to the selected floating gate.

In this method, even when the writing/erasing is performed in the random access mode, the potentials of the bit lines satisfying the condition expressed by formula (10) can be decided without requiring a complicated program.

Figure 23:
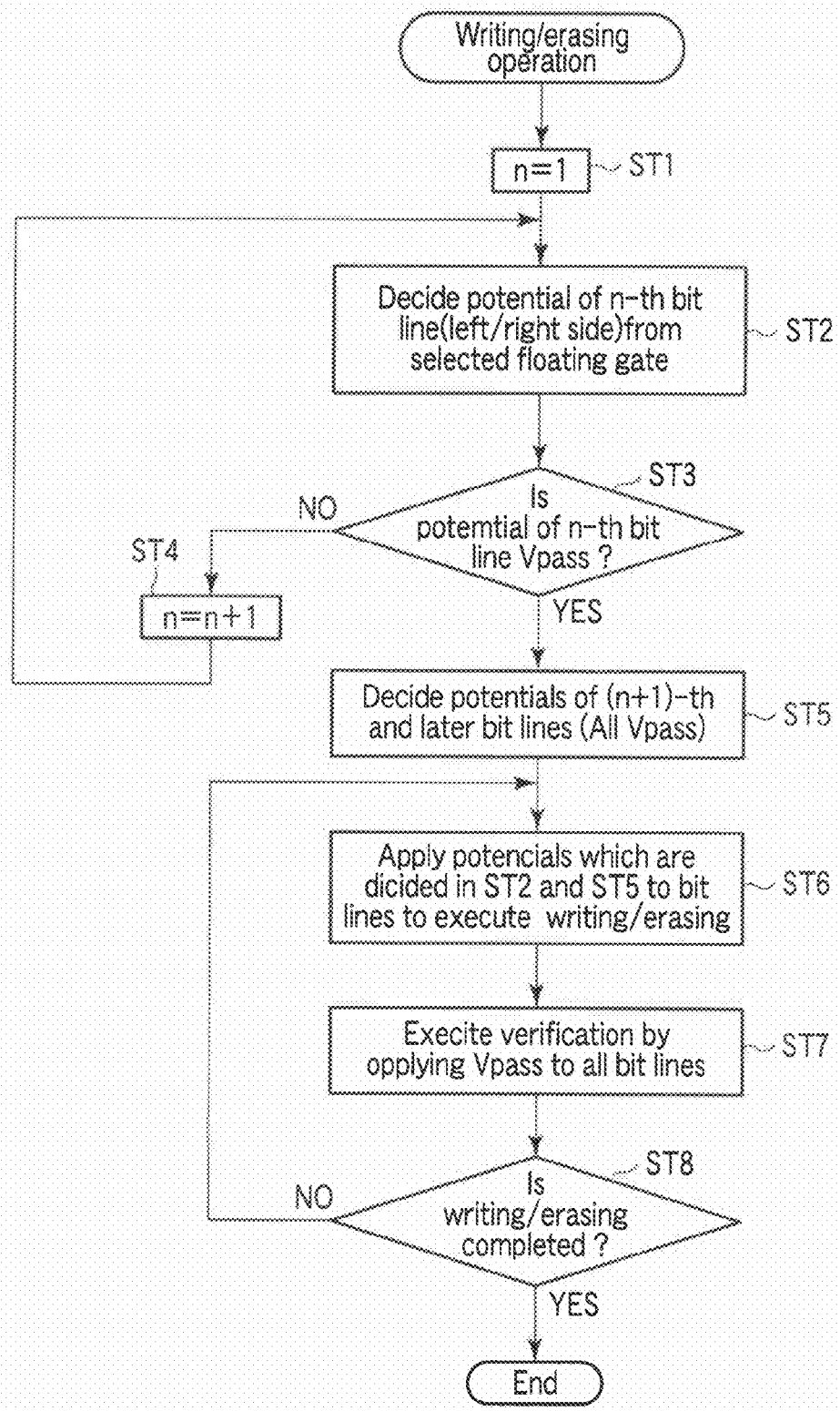

FIG. 23 shows a second example of the writing/erasing.

While the potential of the bit line is lowered/raised toward 0 V in the first example, the potential of the bit line is lowered/raised toward Vpass in the second example.

This operation is controlled by control circuit 12 shown in FIG. 20.

First, n is set to 1 (step ST1), and the potential of the n (=1)-th bit line from the selected memory cell (floating gate) on the left/right side is decided, based on an address signal (step ST2).

Similarly to the first example, the potentials of the n (=1)-th bit line from the selected memory cell on the left/right side is set sufficiently higher for the selected floating gate so that the transfer of electric charge is generated by the tunneling phenomenon.

Then, it is determined whether the potential of the n (=1)-th bit line is Vpass or not (step ST3).

When the potential of the n (=1)-th is not Vpass, n is set to (n+1) (step ST4), and the potential of the (n+1)-th bit line from the selected memory cell (floating gate) on the right/left side is decided (step ST2).

Similarly to the first example, the potential of the (n+1)-th bit line on the right/left side from the selected memory cell is set to a value so that the transfer of electric charge is prevented from being generated by the tunneling phenomenon, for the unselected floating gate positioned between the n-th bit line and the (n+1)-th bit line.

More specifically, the potential of the (n+1)-th bit line is decided based on formula (10).

Then, it is determined whether the potential of the (n+1)-th bit line is Vpass or not (step ST3).

When the potential of the (n+1)-th bit line is Vpass, the potentials of the bit lines after the (n+1)-th bit line are set to Vpass (step ST5).

Then, the potentials decided in steps ST2 and ST5 are applied to the bit lines to execute the writing/erasing (step ST6).

Then, all bit lines are set to Vpass to execute the verification (step ST7).

When it is determined that the writing/erasing is completed by this verification, the writing/erasing is finished. Alternatively, when it is determined that the writing/erasing is not completed, the potentials decided in steps ST2 and ST5 are applied to the bit lines again to execute the writing/erasing (step ST8).

As described above, in the second example, since the potentials of the bit lines at the time of writing/erasing are converged on Vpass which is used at the time of verification, the power consumption does not increase even when the writing/erasing and verification are performed repetitively.

In addition, since the potential of the bit lines on the right/left side of the selected floating gate are sequentially decided from the bit line positioned closest to the selected floating gate, the potential of the bit lines satisfying formula (10) can be decided without needing a complicated program.

5. Embodiments

Embodiments of the writing/erasing will be described.

The examples shown in FIGS. 12, 13, 14, 15 and 16 show the basic operations in which the number of the selected floating gate is one, thus another pattern will be described below.

(1) First Embodiment

Figure 24:
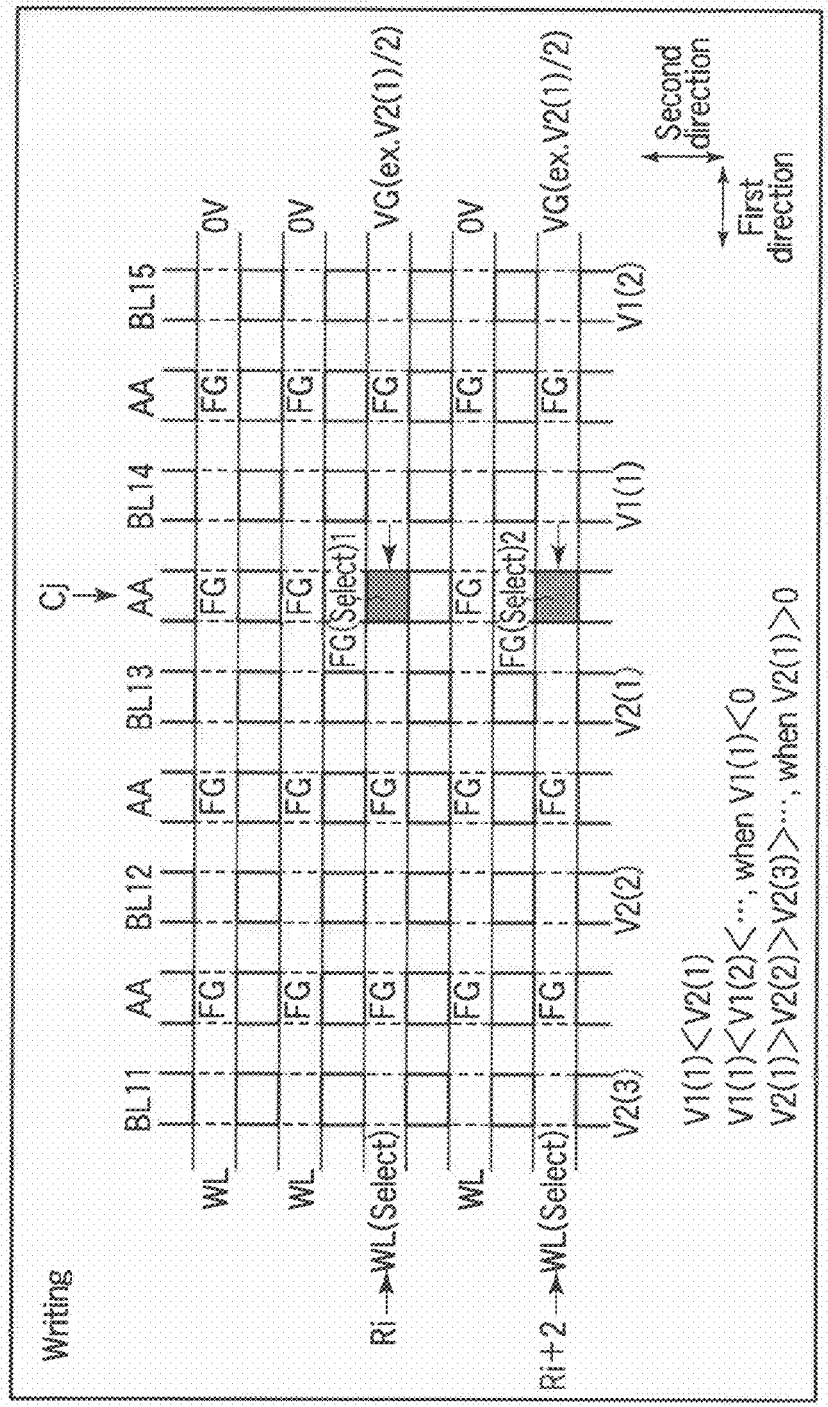
FIG. 24 is a diagram showing a write operation.

FIG. 24 shows an example of the write operation.

In this example, electrons are injected to two selected floating gates FG (Select) 1 and FG (Select) 2 positioned at row addresses Ri and Ri+2 and column address Cj from bit line BL14 positioned on the right side of them.

In this case, two selected floating gates FG, (Select) 1 and FG (Select) 2, are positioned in the same column Cj.

Thus, bit line BL14 on the right side of two selected floating gates FG (Select) 1 and FG (Select) 2 is set to V1(1) (minus potential, for example), and bit lines BL15, . . . positioned on the right side of bit line BL14 are set to V1(2), . . . .

In addition, bit line BL13 on the left side of selected floating gates FG (Select) 1 and FG (Select) 2 is set to V2(1) (plus potential, for example), and bit lines BL12, BL11, . . . positioned on the left side of bit line BL13 are set to V2(2), V2(3), . . . .

Here, it is to be noted that $V1(1) < V2(1)$.

In addition, when $V1(1) < 0$, $V1(1) < V1(2) < \ldots$, and when $V1(1) > 0$, $V1(1) > V1(2) > \ldots$.

In addition, when $V2(1) > 0$, $V2(1) > V2(2) > V2(3) > \ldots$, and when $V2(1) < 0$, $V2(1) < V2(2) < V2(3) < \ldots$.

Word lines WL (Select) positioned over selected floating gates FG (Select) 1 and FG (Select) 2 are set to VG (V2(1)/2, for example), and the rest of word lines WL are set to 0 V.

In this state, the electrons are injected from bit line BL14 on the right side of selected floating gates FG (Select) 1 and FG (Select) 2, to selected floating gates FG (Select) 1 and FG (Select) 2 as shown by arrows.

In addition, since the absolute values of the potentials of the bit lines positioned on the left/right side of selected floating gates FG (Select) 1 and FG (Select) 2 gradually decrease with increase in distance from selected floating gates FG (Select) 1 and FG (Select) 2, the power consumption can be lowered.

Figure 25:
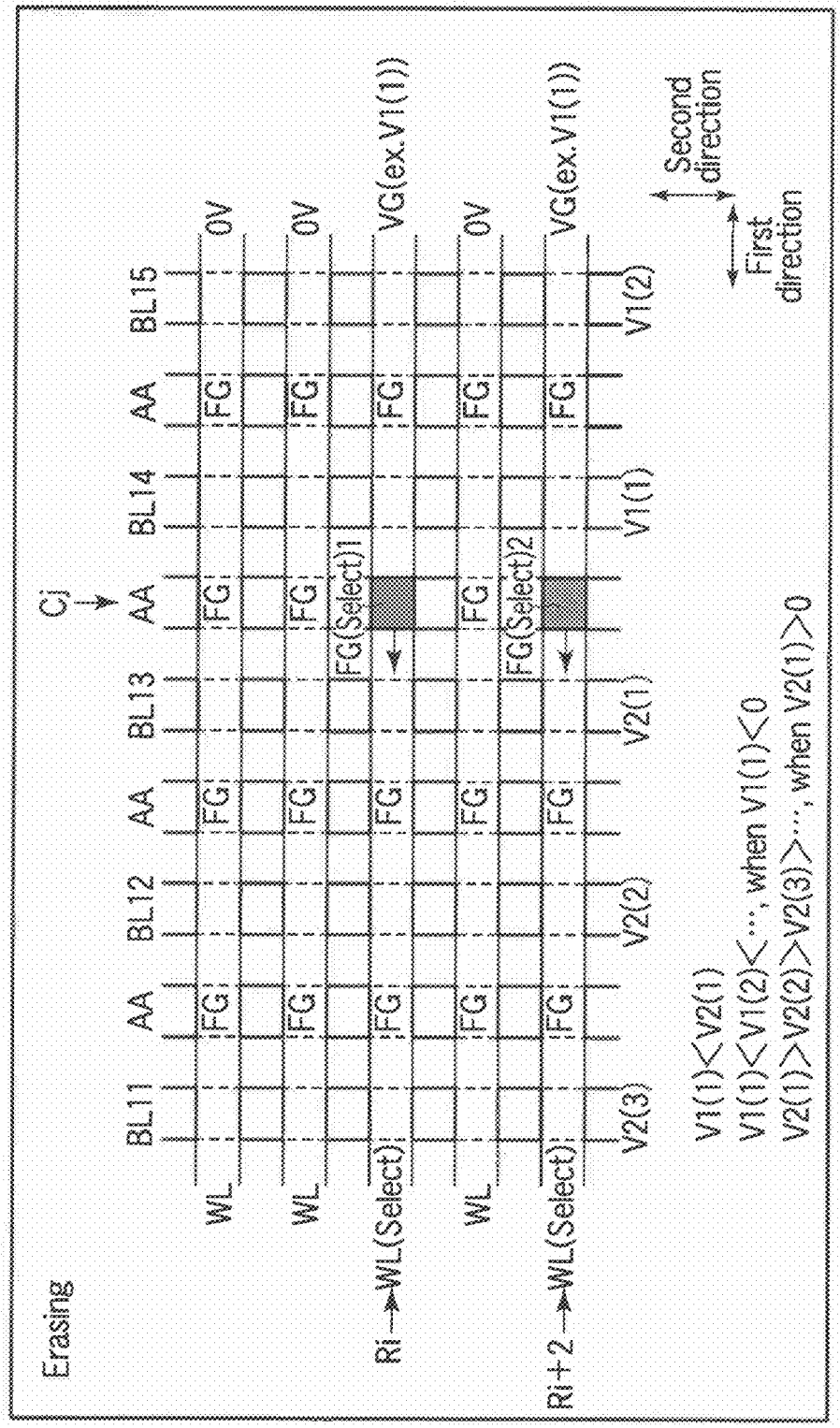
FIG. 25 is a diagram showing an erase operation.

FIG. 25 shows an example of the erase operation.

In this example, electrons are emitted from two selected floating gates, FG (Select) 1 and FG (Select) 2, positioned at row addresses Ri and Ri+2, and column address Cj, to bit line BL13 positioned on the left side of them.

In this case, bit line BL14 on the right side of selected floating gates FG (Select) 1 and FG (Select) 2 is set to V1(1) (minus potential, for example), and bit lines BL15, . . . positioned on the right side of bit line BL14 are set to V1(2), . . . .

In addition, bit line BL13 on the left side of selected floating gates FG (Select) 1 and FG (Select) 2 is set to V2(1) (plus potential, for example), and bit lines BL12, BL11, positioned on the left side of bit line BL13 are set to V2(2), V2(3), . . . .

Here, it is to be noted that $V1(1) < V2(1)$.

In addition, when $V1(1) < 0$, $V1(1) < V1(2) < \ldots$, and when $V1(1) > 0$, $V1(1) > V1(2) > \ldots$.

In addition, when $V2(1) > 0$, $V2(1) > V2(2) > V2(3) > \ldots$, and when $V2(1) < 0$, $V2(1) < V2(2) < V2(3) < \ldots$.

Word lines WL (Select) positioned over selected floating gates FG (Select) 1 and FG (Select) 2 are set to VG (V1(1), for example), and the rest of word lines WL are set to 0 V.

In this state, the electrons are emitted from selected floating gates FG (Select) 1 and FG (Select) 2 to bit line BL13 on the left side of selected floating gates FG (Select) 1 and FG (Select) 2 as shown by arrows.

In addition, since the absolute values of the potentials of the bit lines positioned on the left/right side of selected floating gates FG (Select) 1 and FG (Select) 2 gradually decrease with increase in distance from selected floating gates FG (Select) 1 and FG (Select) 2, the power consumption can be lowered.

(2) Second Embodiment

FIG. 26 shows an example of the write operation.

In this example, electrons are injected to two selected floating gates, FG (Select) 1 and FG (Select) 2, positioned at row address Ri and column addresses Cj-1 and Cj from bit lines BL12 and BL14 positioned on the left/right sides of them, respectively.

In this case, bit line BL14 on the right side of selected floating gate FG (Select) 2 is set to V1(1) (minus potential, for example), and bit lines BL15, . . . positioned on the right side of bit line BL14 are set to V1(2), . . . .

In addition, bit line BL12 on the left side of selected floating gate FG (Select) 1 is set to V1(1) (minus potential, for example), and bit lines BL11, . . . positioned on the left side of bit line BL12 are set to V1(2), . . . .

Furthermore, bit line BL13 positioned between two selected floating gates FG (Select) 1 and FG (Select) 2 is set to V2(1) (plus potential, for example).

Here, it is to be noted that V1(1)<V2(1).

In addition, when V1(1)<0, V1(1)<V1(2)< . . . , and when V1(1)>0, V1(1)>V1(2)> . . . .

Word line WL (Select) positioned over selected floating gates FG (Select) 1 and FG (Select) 2 is set to VG (V2(1)/2, for example), and the rest of word lines WL are set to 0 V.

In this state, the electrons are injected from bit lines BL12 and BL14 on the left/right sides of selected floating gates FG (Select) 1 and FG (Select) 2, to selected floating gates FG (Select) 1 and FG (Select) 2, respectively as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

Figure 27:
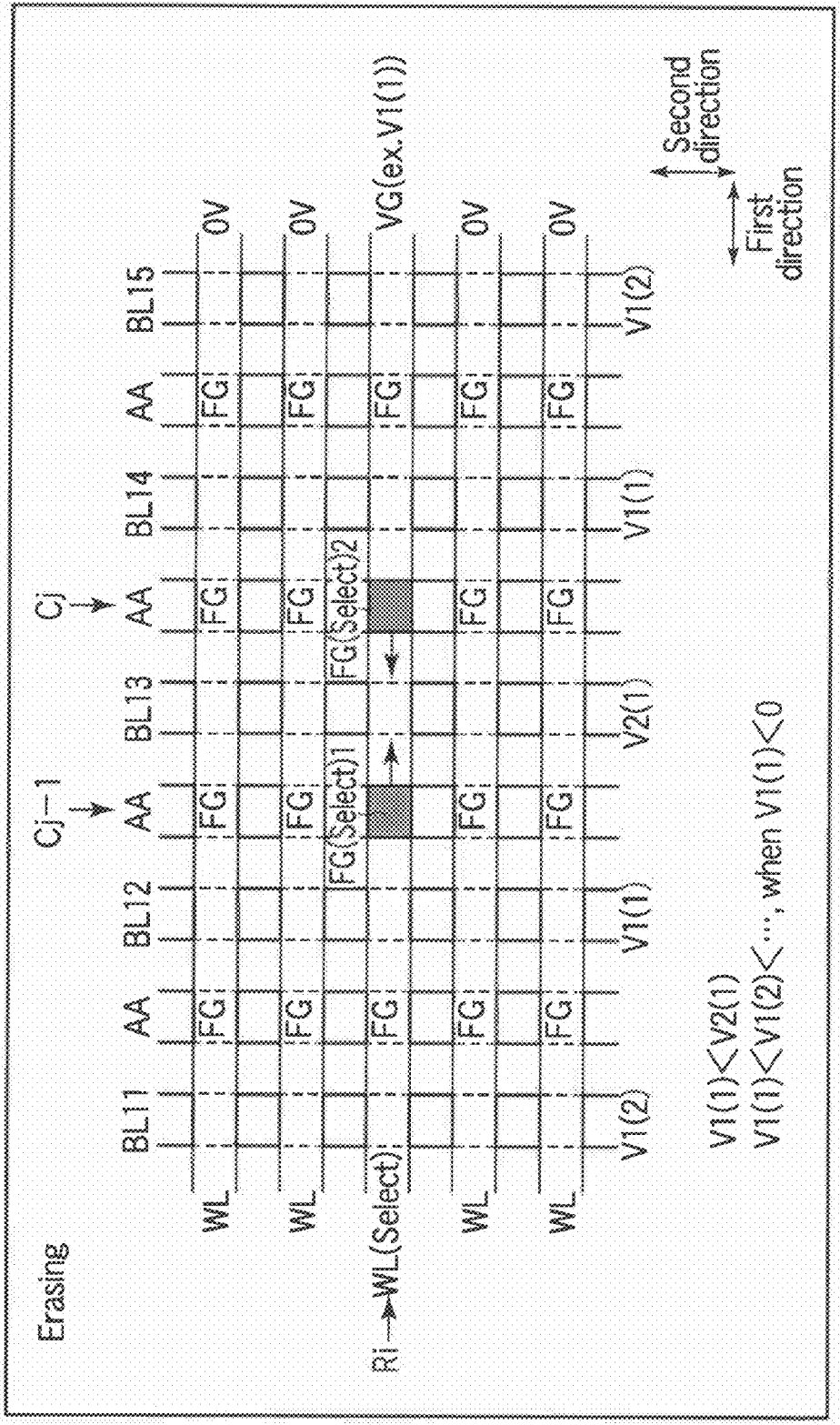
FIG. 27 is a diagram showing an erase operation.

FIG. 27 shows an example of the erase operation. In this example, electrons are emitted from two selected floating gates, FG (Select) 1 and FG (Select) 2, positioned at row address Ri and column addresses Cj-1 and Cj, to bit line BL13 positioned between them.

In this case, bit line BL14 on the right side of selected floating gate FG (Select) 2 is set to V1(1) (minus potential, for example), and bit lines BL15, . . . positioned on the right side of bit line BL14 are set to V1(2), . . . .

In addition, bit line BL12 on the left side of selected floating gate FG (Select) 1 is set to V1(1) (minus potential, for example), and bit lines BL11, . . . positioned on the left side of bit line BL12 are set to V1(2), . . . .

Furthermore, bit line BL13 positioned between two selected floating gates FG (Select) 1 and FG (Select) 2 is set to V2(1) (plus potential, for example).

Here, it is to be noted that V1(1)<V2(1).

In addition, when V1(1)<0, V1(1)<V1(2)< . . . , and when V1(1)>0, V1(1)>V1(2)> . . . .

Word line WL (Select) positioned over selected floating gates FG (Select) 1 and FG (Select) 2 is set to VG (V1(1), for example), and the rest of word lines WL are set to 0 V.

In this state, the electrons are emitted from two selected floating gates FG (Select) 1 and FG (Select) 2 to bit line BL13 positioned between them as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

(3) Third Embodiment

Figure 28:
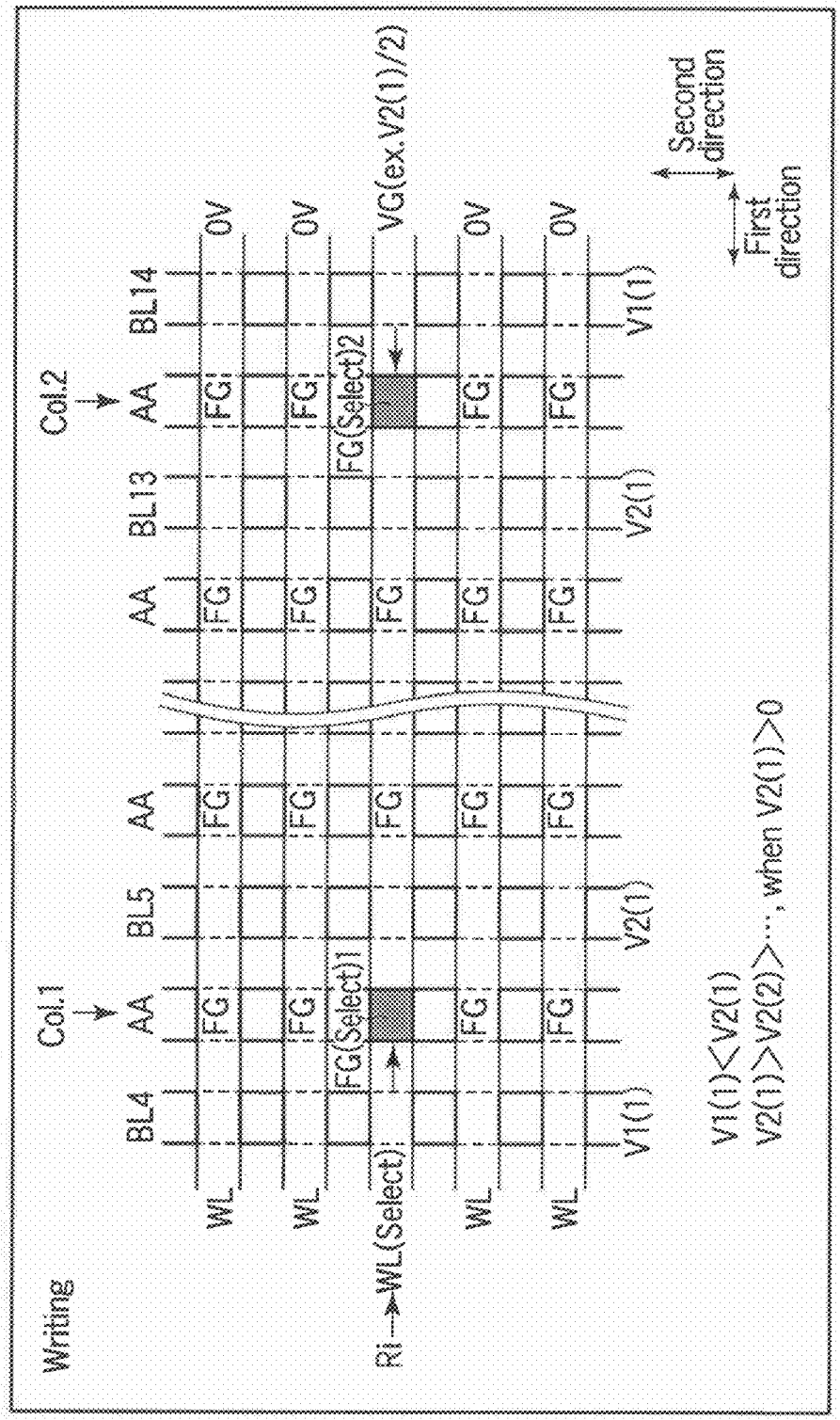
FIG. 28 is a diagram showing a write operation.

FIG. 28 shows an example of the write operation.

In this example, electrons are injected to two selected floating gates, FG (Select) 1 and FG (Select) 2, positioned at row address Ri and column addresses Col.1 and Col.2, from bit lines BL4 and BL14 positioned on the left/right sides of them, respectively.

In this case, bit line BL14 on the right side of selected floating gate FG (Select) 2 is set to V1(1) (minus potential, for example), and bit lines BL15, . . . positioned on the right side of bit line BL14 are set to V1(2), . . . .

In addition, bit line BL4 on the left side of selected floating gate FG (Select) 1 is set to V1(1) (minus potential, for example), and bit lines BL3, . . . positioned on the left side of bit line BL4 are set to V1(2), . . . .

Furthermore, adjacent bit line BL5 positioned on the right side of selected floating gate FG (Select) 1 and adjacent bit line BL13 positioned on the left side of selected floating gate FG (Select) 2 are set to V2(1) (plus potential, for example).

The absolute values of the potentials of bit lines BL5, . . . BL13 positioned between two selected floating gates FG (Select) 1 and FG (Select) 2 gradually decrease with increase in distance from selected floating gates FG (Select), respectively.

Thus, the absolute value of potential Vcenter of bit line BL9 positioned in the center of bit lines BL5, . . . BL13 positioned between two selected floating gate FG (Select) 1 and FG (Select) 2 is set to a minimum value.

In addition, when the potentials of the bit lines are converged on Vpass, |Vcenter−Vpass| among the absolute values of the values obtained by subtracting Vpass from the respective potentials of bit lines BL5, . . . BL13 is set to a minimum value.

Here, it is to be noted that V1(1)<V2(1).

In addition, when V1(1)<0, V1(1)<V1(2)< . . . , and when V1(1)>0, V1(1)>V1(2)> . . . .

In addition, when V2(1)>0, V2(1)>V2(2)>V2(3)> . . . , and when V2(1)<0, V2(1)<V2(2)<V2(3)< . . . .

Word line WL (Select) positioned over selected floating gates FG (Select) 1 and FG (Select) 2 is set to VG (V2(1)/2, for example), and the rest of word lines WL are set to 0 V.

In this state, the electrons are injected from bit line BL4 on the left side of selected floating gate FG (Select) 1, to selected floating gate FG (Select) 1 and from bit line BL14 on the right side of selected floating gate FG (Select) 2, to selected floating gate FG (Select) 2 as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

FIG. 29 shows an example of the erase operation.

In this example, electrons are emitted from two selected floating gates FG (Select) 1 and FG (Select) 2 positioned at row address Ri and column addresses Col.1 and Col.2, to bit lines BL5 and BL13 positioned on the right/left sides of them, respectively.

In this case, bit line BL14 on the right side of selected floating gate FG (Select) 2 is set to V1(1) (minus potential, for example), and bit lines BL15, . . . positioned on the right side of bit line BL14 are set to V1(2), . . . .

In addition, bit line BL4 on the left side of selected floating gate FG (Select) 1 is set to V1(1) (minus potential, for example), and bit lines BL3, . . . positioned on the left side of bit line BL4 are set to V1(2), . . . .

Furthermore, adjacent bit line BL5 positioned on the right side of selected floating gate FG (Select) 1 and adjacent bit line BL13 positioned on the left side of selected floating gate FG (Select) 2 are set to V2(1) (plus potential, for example).

The absolute values of the potentials of bit lines BL5, . . . BL13 positioned between two selected floating gates FG (Select) 1 and FG (Select) 2 gradually decrease with increase in distance from selected floating gates FG (Select) 1 and FG (Select) 2, respectively.

Thus, the absolute value of potential Vcenter of bit line BL9 positioned in the center of bit lines BL5, . . . BL13 positioned between two selected floating gates, FG (Select) 1 and FG (Select) 2, is set to a minimum value.

In addition, when the potentials of the bit lines are converged on Vpass, |Vcenter−Vpass| among the absolute values of the values obtained by subtracting Vpass from the respective potentials of bit lines BL5, . . . BL13 is set to a minimum value.

Here, it is to be noted that V1(1)<V2(1).

In addition, when V1(1)<0, V1(1)<V1(2)< . . . , and when V1(1)>0, V1(1)>V1(2)> . . . .

In addition, when V2(1)>0, V2(1)>V2(2)>V2(3)> . . . , and when V2(1)<0, V2(1)<V2(2)<V2(3)< . . . .

Word line WL (Select) positioned over selected floating gates FG (Select) 1 and FG (Select) 2 is set to VG (V1(1), for example), and the rest of word lines WL are set to 0 V.

In this state, the electrons are emitted from selected floating gates FG (Select) 1 and FG (Select) 2 to bit lines BL5 and BL13 positioned on the right/left sides of them, respectively as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

Figure 30:
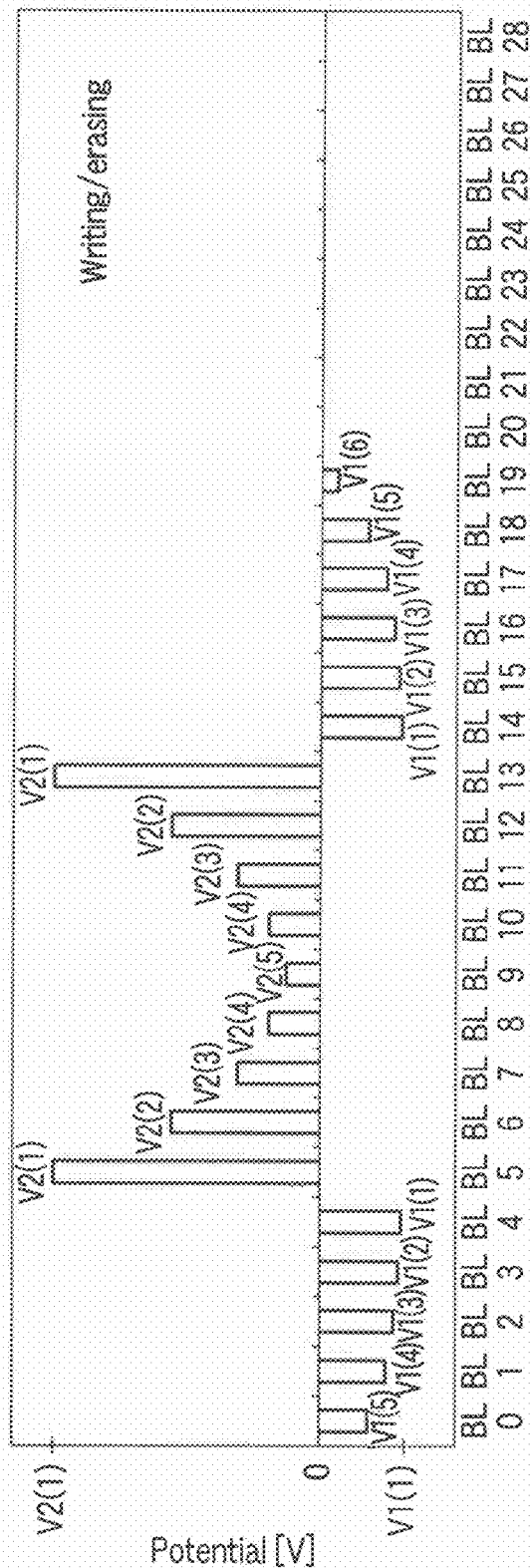
FIG. 30 is a diagram showing a potential of a bit line.

FIG. 30 shows a potential relationship of the bit lines according to the third embodiment.

Thus, the absolute value of potential Vcenter of bit line BL9 positioned in the center of bit lines BL5, . . . BL13 positioned between two selected floating gates FG (Select) 1 and FG (Select) 2 is set to a minimum value.

When the potentials of the bit lines BL5, . . . BL13 are sequentially decided, they are preferable decided from the sides of bit line BL5 and bit line BL13, respectively.

(4) Fourth Embodiment

Figure 31:
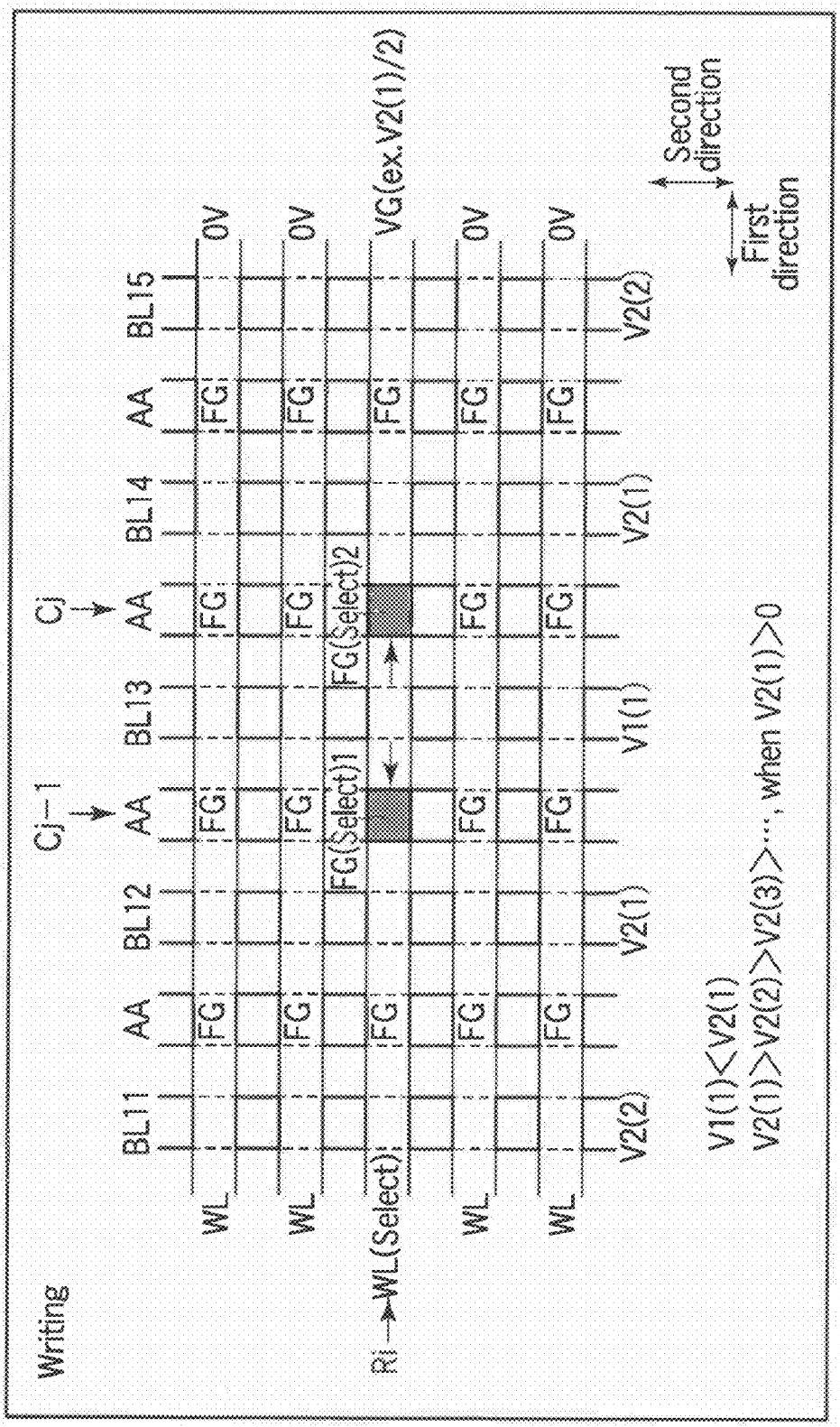
FIG. 31 is a diagram showing a write operation.

FIG. 31 shows an example of the write operation.

In this example, electrons are injected to two selected floating gates, FG (Select) 1 and FG (Select) 2, positioned at row address Ri and column addresses Cj-1 and Cj, from bit line BL13 positioned between them.

In this case, bit line BL14 on the right side of selected floating gate FG (Select) 2 is set to V2(1) (plus potential, for example), and bit lines BL15, . . . positioned on the right side of bit line BL14 are set to V2(2), . . . .

In addition, bit line BL12 on the left side of selected floating gate FG (Select) 1 is set to V2(1) (plus potential, for example), and bit lines BL11, . . . positioned on the left side of bit line BL12 are set to V2(2), . . . .

Furthermore, bit line BL13 positioned between two selected floating gates FG (Select) 1 and FG (Select) 2 is set to V1(1) (minus potential, for example).

Here, it is to be noted that V1(1)<V2(1).

In addition, when V2(1)>0, V2(1)>V2(2)> . . . , and when V2(1)<0, V2(1)<V2(2)< . . . .

Word line WL (Select) positioned over selected floating gates FG (Select) 1 and FG (Select) 2 is set to VG (V2(1)/2, for example), and the rest of word lines WL are set to 0 V.

In this state, the electrons are injected from bit line BL13 positioned between selected floating gates FG (Select) 1 and FG (Select) 2, to selected floating gates FG (Select) 1 and FG (Select) 2 as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

Figure 32:
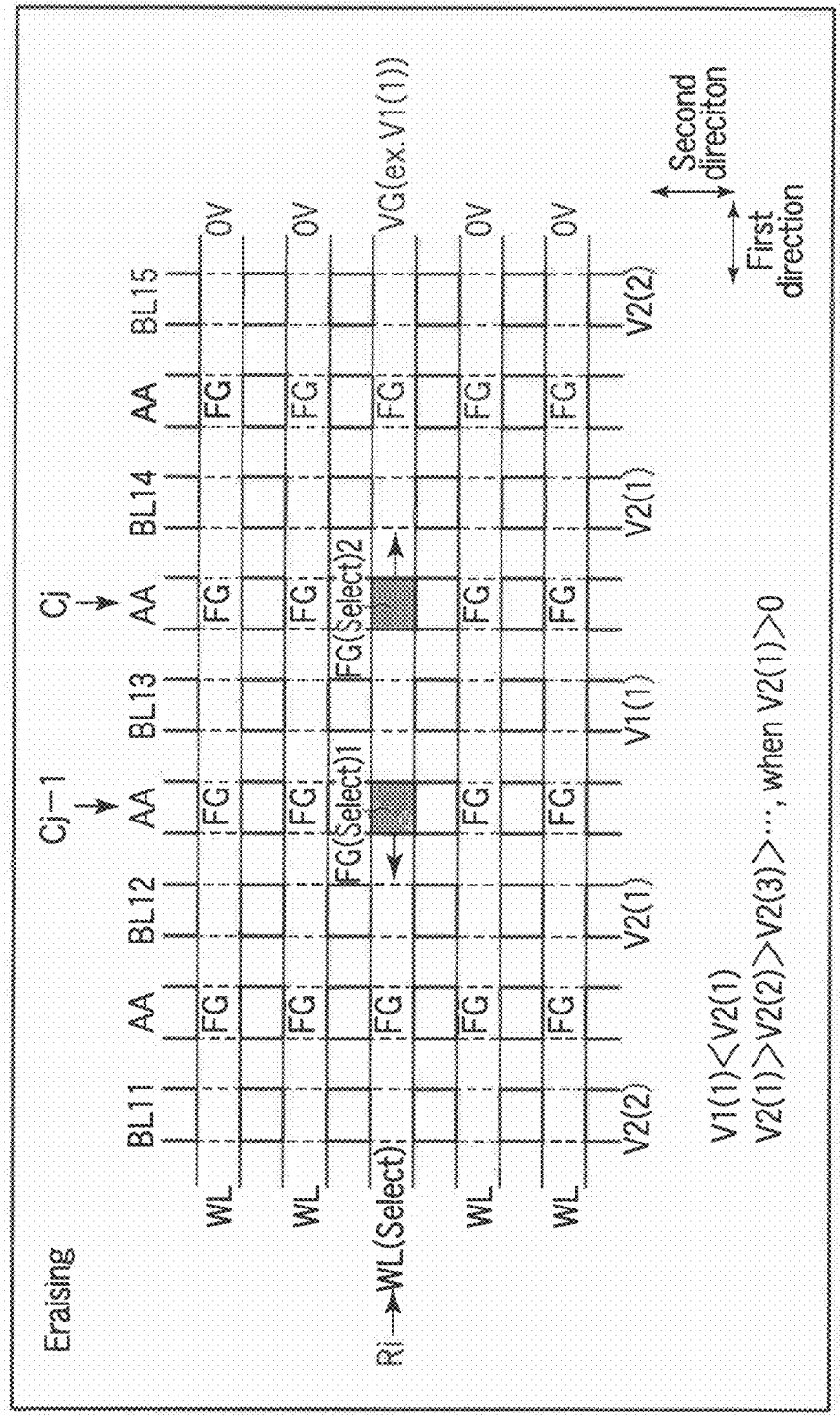
FIG. 32 is a diagram showing an erase operation.

FIG. 32 shows an example of the erase operation.

In this example, electrons are emitted from two selected floating gates FG (Select) 1 and FG (Select) 2 positioned at row address Ri and column addresses Cj-1 and Cj, to bit lines BL12 and BL14 positioned on the left/right sides of them, respectively.

In this case, bit line BL14 on the right side of selected floating gate FG (Select) 2 is set to V2(1) (plus potential, for example), and bit lines BL15, . . . positioned on the right side of bit line BL14 are set to V2(2), . . . .

In addition, bit line BL12 on the left side of selected floating gate FG (Select) 1 is set to V2(1) (plus potential, for example), and bit lines BL11, . . . positioned on the left side of bit line BL12 are set to V2(2), . . . .

Furthermore, bit line BL13 positioned between two selected floating gates FG (Select) 1 and FG (Select) 2 is set to V1(1) (minus potential, for example).

Here, it is to be noted that V1(1)<V2(1).

In addition, when V2(1)>0, V2(1)>V2(2)> . . . , and when V2(*l*)<0, V2(1)<V2(2)< . . . .

Word line WL (Select) positioned over selected floating gates FG (Select) 1 and FG (Select) 2 is set to VG (V1(1), for example), and the rest of word lines WL are set to 0 V.

In this state, the electrons are emitted from two selected floating gates FG (Select) 1 and FG (Select) 2 to bit lines BL12 and BL14 positioned on left/right sides of selected floating gates FG (Select) 1 and FG (Select) 2, respectively as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

(5) Fifth Embodiment

Figure 33:
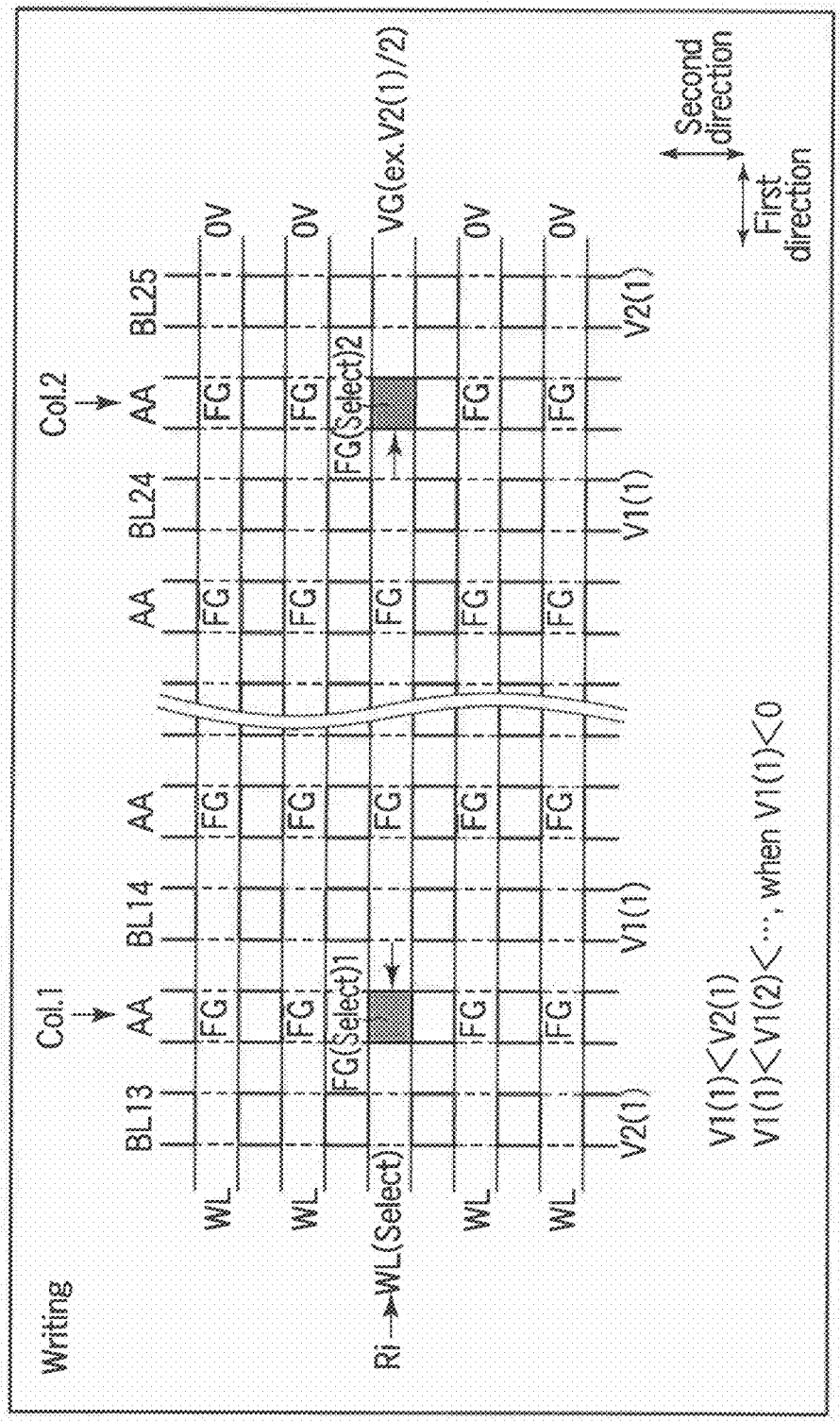
FIG. 33 is a diagram showing a write operation.

FIG. 33 shows an example of the write operation.

In this example, electrons are injected to two selected floating gates, FG (Select) 1 and FG (Select) 2, positioned at row address Ri and column addresses Col.1 and Col.2, from bit lines BL14 and BL24 positioned on the right/left sides of them, respectively.

In this case, bit line BL14 on the right side of selected floating gate FG (Select) 1 is set to V1(1) (minus potential, for example) and bit lines BL15, . . . positioned on the right side of bit line BL14 are set to V1(2), . . . .

In addition, bit line BL13 on the left side of selected floating gate FG (Select) 1 is set to V2(1) (plus potential, for example), and bit lines BL12, . . . positioned on the left side of bit line BL13 are set to V2(2), . . . .

Furthermore, bit line BL24 positioned on the left side of selected floating gate FG (Select) 2 is set to V1(1) (minus potential, for example), and bit lines BL23, . . . positioned on the left side of bit line BL24 are set to V1(2), . . . .

In addition, bit line BL25 positioned on the right side of selected floating gate FG (Select) 2 is set to V2(1) (plus potential, for example), and bit lines BL26, . . . positioned on the right side of bit line BL25 are set to V2(2), . . . .

The absolute values of the potentials of bit lines BL14, . . . BL24 positioned between two selected floating gates FG (Select) 1 and FG (Select) 2 gradually decrease with increase in distance from selected floating gates FG (Select) 1 and FG (Select) 2, respectively.

Thus, the absolute value of potential Vcenter of bit line BL19 positioned in the center of bit lines BL14, . . . BL24 positioned between two selected floating gates FG (Select) 1 and FG (Select) 2 is set to a minimum value.

In addition, when the potentials of the bit lines are converged on Vpass, |Vcenter−Vpass| among the absolute values of the values obtained by subtracting Vpass from the respective potentials of bit lines BL14, . . . BL24 is set to a minimum value.

Here, it is to be noted that V1(1)<V2(1).

In addition, when V1(1)<0, V1(1)<V1(2)< . . . , and when V1(1)>0, V1(1)>V1(2)> . . . .

In addition, when V2(1)>0, V2(1)>V2(2)>V2(3) . . . , and when V2(1)<0, V2(1)<V2(2)<V2(3)< . . . .

Word line WL (Select) positioned over selected floating gates FG (Select) 1 and FG (Select) 2 is set to VG (V2(1)/2, for example), and the rest of word lines WL are set to 0 V.

In this state, the electrons are injected from bit lines BL14 and BL24 on the right/left sides of selected floating gates FG (Select) 1 and FG (Select) 2, to selected floating gates FG (Select) 1 and FG (Select) 2, respectively as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

FIG. 34 shows an example of the erase operation.

In this example, electrons are emitted from two selected floating gates, FG (Select) 1 and FG (Select) 2, positioned at row address Ri and column addresses Col.1 and Col.2, to bit lines BL13 and BL25 positioned on the left/right sides of them, respectively.

In this case, bit line BL14 on the right side of selected floating gate FG (Select) 1 is set to V1(1) (minus potential, for example), and bit lines BL15, . . . positioned on the right side of bit line BL14 are set to V1(2), . . . .

In addition, bit line BL13 on the left side of selected floating gate FG (Select) 1 is set to V2(1) (plus potential, for example), and bit lines BL12, . . . positioned on the left side of bit line BL13 are set to V2(2), . . . .

Furthermore, bit line BL24 on the left side of selected floating gate FG (Select) 2 is set to V1(1) (minus potential, for example), and bit lines BL23, . . . positioned on the left side of bit line BL24 are set to V1(2), . . . .

In addition, bit line BL25 on the right side of selected floating gate FG (Select) 2 is set to V2(1) (plus potential, for example), and bit lines BL26, . . . positioned on the right side of bit line BL25 are set to V2(2), . . . .

Here, the absolute values of the potentials of bit lines BL14, . . . BL24 positioned between two selected floating gates, FG (Select) 1 and FG (Select) 2, gradually decrease with increase in distance from selected floating gates FG (Select) 1 and FG (Select) 2, respectively.

Thus, the absolute value of potential Vcenter of bit line BL19 positioned in the center of bit lines BL14, . . . BL24 positioned between two selected floating gates FG (Select) 1 and FG (Select) 2 is set to a minimum value.

In addition, when the potentials of the bit lines are converged on Vpass, |Vcenter−Vpass| among the absolute values of the values obtained by subtracting Vpass from the respective potentials of bit lines BL14, . . . BL24 is set to a minimum value.

Here, it is to be noted that V1(1)<V2(1).

In addition, when V1(1)<0, V1(1)<V1(2)< . . . , and when V1(1)>0, V1(1)>V1(2)> . . . .

In addition, when V2(1)>0, V2(1)>V2(2)>V2(3)> . . . , and when V2(1)<0, V2(1)<V2(2)<V2(3)< . . . .

Word line WL (Select) positioned over selected floating gates FG (Select) 1 and FG (Select) 2 is set to VG (V1(1), for example), and the rest of word lines WL are set to 0 V.

In this state, the electrons are emitted from selected floating gates FG (Select) 1 and FG (Select) 2 to bit lines BL13 and BL25 positioned on the left/right sides of them, respectively as shown by arrows.

In addition, since the absolute values of the potentials of the bit lines positioned on the left/right sides of selected floating gates FG (Select) 1 and FG (Select) 2 gradually decrease with increase in distance from selected floating gates FG (Select) 1 and FG (Select) 2, respectively, the power consumption can be lowered.

Figure 35:
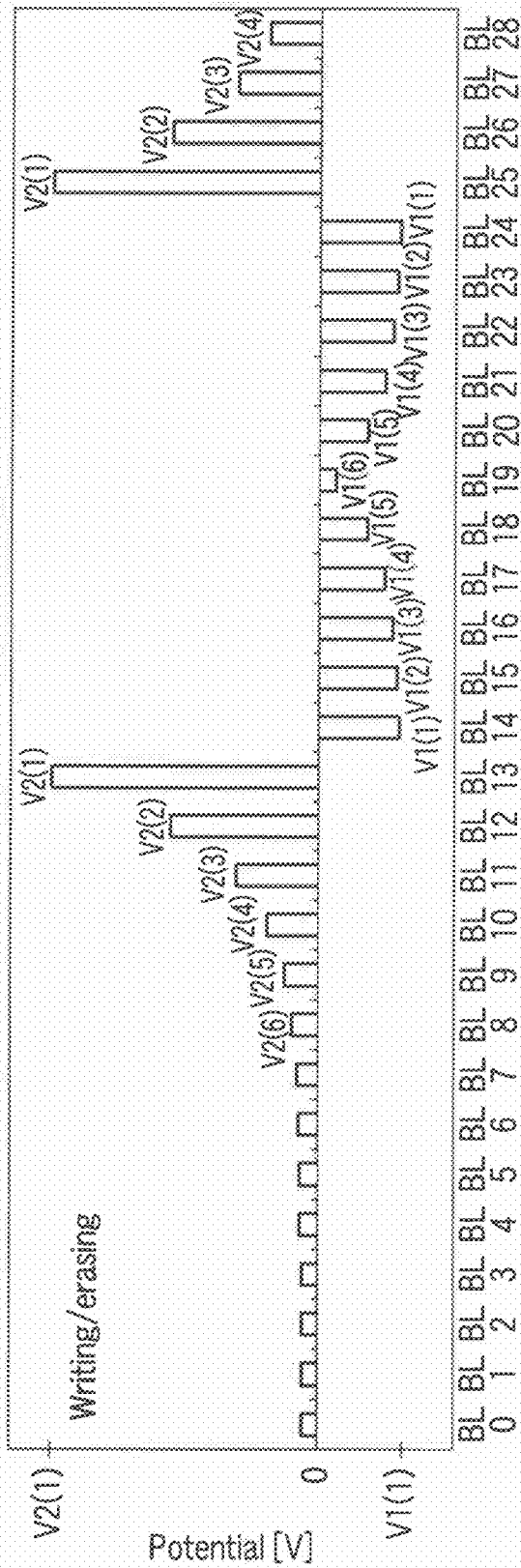
FIG. 35 is a diagram showing a potential of a bit line.

FIG. 35 shows a potential relationship of the bit lines according to the fifth embodiment.

Thus, the absolute value of potential Vcenter of bit line BL19 positioned in the center of bit lines BL14, . . . BL24 positioned between two selected floating gates FG (Select) 1 and FG (Select) 2 is set to a minimum value.

When the potentials of bit lines BL14, . . . BL24 are sequentially decided, they are preferably decided from the sides of bit line BL14 and bit line BL24, respectively.

(6) Sixth Embodiment

The present invention is characterized in that the absolute values of the potentials of the bit lines gradually decrease with increase in distance from the selected floating gate. Here, when the potentials of the bit lines are converged on Vpass instead of 0 V, the potential of the bit line finally becomes Vpass.

Here, in view of circuit design, the potential which can be applied to the bit line is limited in some cases. For example, a potential value Vbit which can be applied to the bit line is k times the value of Vmin and not continuous, as will be shown below.

$V\text{bit} = k \times V\text{min}$ ($k$ is a natural number)

Therefore, potential $V_{n+1}$ of the (n+1)-th bit line from the selected floating gate cannot be set to an optimal value such as a maximum value or a minimum value within a range defined by formulas (10) and (11) in some cases.

In this case, as shown in formulas (12) and (13), it is necessary to adjust the potential $V_{n+1}$ of the (n+1)-th bit line from the selected floating gate with $\Delta$ where $0 < \Delta < V\text{min}$.

$$V_{n+1} = \max\left(\begin{array}{l} C_n V_n + C_{pg} V_{pg} + C_{AA} V_{AA} + Q_{min} - \\ \dfrac{d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA}) V_n - C_{pg} V_{pg} - C_{AA} V_{AA} - Q_{max} -}{} \\ \dfrac{d_n Eth_n(C_n + C_{n+1} + C_{pg} + C_{AA})}{C_{n+1}}, \\ (C_{n+1} + C_n + C_{AA}) V_{pg} - C_n V_n - C_{AA} V_{AA} - Q_{max} - \\ \dfrac{d_{pg} Eth_{pg}(C_n + C_{n+1} + C_{pg} + C_{AA})}{C_{n+1}}, \\ (C_{n+1} + C_{pg} + C_n) V_{AA} - C_{pg} V_{pg} - C_n V_n - Q_{max} - \\ \dfrac{d_{AA} Eth_{AA}(C_n + C_{n+1} + C_{pg} + C_{AA})}{C_{n+1}}, \\ 0 \end{array}\right) + \Delta \quad (12)$$

$$V_{n+1} = \min\left(\begin{array}{l} C_n V_n + C_{pg} V_{pg} + C_{AA} V_{AA} + Q_{max} + \\ \dfrac{d_{n+1} Eth_{n+1}(C_n + C_{n+1} + C_{pg} + C_{AA})}{C_n + C_{pg} + C_{AA}}, \\ (C_{n+1} + C_{pg} + C_{AA}) V_n - C_{pg} V_{pg} - C_{AA} V_{AA} - Q_{min} + \\ \dfrac{d_n Eth_n(C_n + C_{n+1} + C_{pg} + C_{AA})}{C_{n+1}}, \\ (C_{n+1} + C_n + C_{AA}) V_{pg} - C_n V_n - C_{AA} V_{AA} - Q_{min} + \\ \dfrac{d_{pg} Eth_{pg}(C_n + C_{n+1} + C_{pg} + C_{AA})}{C_{n+1}}, \\ (C_{n+1} + C_{pg} + C_n) V_{AA} - C_{pg} V_{pg} - C_n V_n - Q_{min} + \\ \dfrac{d_{AA} Eth_{AA}(C_n + C_{n+1} + C_{pg} + C_{AA})}{C_{n+1}}, \\ 0 \end{array}\right) - \Delta \quad (13)$$

Here, it is to be noted that the potentials of the bit lines are converged on 0 V.

In addition, since efficiency is enhanced as the value of $\Delta$ becomes smaller, it is preferable that Vmin is previously decided at the time of circuit design such that the value of $\Delta$ can be smaller.

In addition, when the potentials of the bit lines can be continuously varied, or when continuously varying potentials can be generated, the maximum value or the minimum value within the range defined by formulas (10) and (11) may be directly applied to the bit line without using formulas (12) and (13).

Meanwhile, when the potentials of the bit lines are converged not on 0 V but on Vpass, potential $V_{n+1}$ of the (n+1)-th bit line from the selected floating gate is as shown in formulas (14) and (15).

$$V_{n+1} = \max\left(\begin{array}{l} C_n V_n + C_{pg} V_{pg} + C_{AA} V_{AA} + Q_{min} - \\ \dfrac{d_{n+1} Eth_{n+1}(C_n + C_{n+1} + C_{pg} + C_{AA})}{C_n + C_{pg} + C_{AA}}, \\ (C_{n+1} + C_{pg} + C_{AA}) V_n - C_{pg} V_{pg} - C_{AA} V_{AA} - Q_{max} - \\ \dfrac{d_n Eth_n(C_n + C_{n+1} + C_{pg} + C_{AA})}{C_{n+1}}, \\ (C_{n+1} + C_n + C_{AA}) V_{pg} - C_n V_n - C_{AA} V_{AA} - Q_{max} - \\ \dfrac{d_{pg} Eth_{pg}(C_n + C_{n+1} + C_{pg} + C_{AA})}{C_{n+1}}, \\ (C_{n+1} + C_{pg} + C_n) V_{AA} - C_{pg} V_{pg} - C_n V_n - Q_{max} - \\ \dfrac{d_{AA} Eth_{AA}(C_n + C_{n+1} + C_{pg} + C_{AA})}{C_{n+1}}, \\ V\text{pass} \end{array}\right) + \Delta \quad (14)$$

$$V_{n+1} = \min\left(\begin{array}{l} C_n V_n + C_{pg} V_{pg} + C_{AA} V_{AA} + Q_{max} + \\ \dfrac{d_{n+1} Eth_{n+1}(C_n + C_{n+1} + C_{pg} + C_{AA})}{C_n + C_{pg} + C_{AA}}, \\ (C_{n+1} + C_{pg} + C_{AA}) V_n - C_{pg} V_{pg} - C_{AA} V_{AA} - Q_{min} + \\ \dfrac{d_n Eth_n(C_n + C_{n+1} + C_{pg} + C_{AA})}{C_{n+1}}, \\ (C_{n+1} + C_n + C_{AA}) V_{pg} - C_n V_n - C_{AA} V_{AA} - Q_{min} + \\ \dfrac{d_{pg} Eth_{pg}(C_n + C_{n+1} + C_{pg} + C_{AA})}{C_{n+1}}, \\ (C_{n+1} + C_{pg} + C_n) V_{AA} - C_{pg} V_{pg} - C_n V_n - Q_{min} + \\ \dfrac{d_{AA} Eth_{AA}(C_n + C_{n+1} + C_{pg} + C_{AA})}{C_{n+1}}, \\ V\text{pass} \end{array}\right) - \Delta \quad (15)$$

In addition, when the potentials of the bit lines are converged on Vpass, and the sixth embodiment is applied to the bit lines between two selected floating gates, as shown in the third and fifth embodiments, the potential $V_{n+1}$ of the (n+1)-th bit line from the selected floating gate is as shown in formulas (16) and (17).

$$V_{n+1} = \max \begin{pmatrix} \dfrac{C_n V_n + C_{pg} V_{pg} + C_{AA} V_{AA} + Q_{min} - }{d_{n+1} Eth_{n+1}(C_n + C_{n+1} + C_{pg} + C_{AA})} \\ \dfrac{(C_{n+1} + C_{pg} + C_{AA})V_n - C_{pg} V_{pg} - C_{AA} V_{AA} - Q_{max} - }{d_n Eth_n(C_n + C_{n+1} + C_{pg} + C_{AA})} \\ \dfrac{(C_{n+1} + C_n + C_{AA})V_{pg} - C_n V_n - C_{AA} V_{AA} - Q_{max} - }{d_{pg} Eth_{pg}(C_n + C_{n+1} + C_{pg} + C_{AA})} \\ \dfrac{(C_{n+1} + C_{pg} + C_n)V_{AA} - C_{pg} V_{pg} - C_n V_n - Q_{max} - }{d_{AA} Eth_{AA}(C_n + C_{n+1} + C_{pg} + C_{AA})} \\ \dfrac{C_{n+2} V_{n+2} + C_{pg} V_{pg} + C_{AA} V_{AA} + Q_{min} - }{d_{n+1} Eth_{n+1}(C_{n+2} + C_{n+1} + C_{pg} + C_{AA})} \\ \dfrac{(C_{n+1} + C_{pg} + C_{AA})V_{n+2} - C_{pg} V_{pg} - C_{AA} V_{AA} - }{Q_{max} - d_{n+2} Eth_{n+2}(C_{n+2} + C_{n+1} + C_{pg} + C_{AA})} \\ \dfrac{(C_{n+1} + C_{n+2} + C_{AA})V_{pg} - C_{n+2} V_{n+2} - C_{AA} V_{AA} - }{Q_{max} - d_{pg} Eth_{pg}(C_{n+2} + C_{n+1} + C_{pg} + C_{AA})} \\ \dfrac{(C_{n+1} + C_{pg} + C_{n+2})V_{AA} - C_{pg} V_{pg} - C_{n+2} V_{n+2} - }{Q_{max} - d_{AA} Eth_{AA}(C_{n+2} + C_{n+1} + C_{pg} + C_{AA})} \\ V_{pass} \end{pmatrix} + \Delta \quad (16)$$

$$V_{n+1} = \min \begin{pmatrix} \dfrac{C_2 V_n + C_3 V_{pg} + C_4 V_C + Q_{max} + }{d_1(Eth_1 + Em_1)(C_1 + C_2 + C_3 + C_4)} \\ \dfrac{(C_1 + C_3 + C_4)V_n - C_3 V_{pg} - C_4 V_C - Q_{min} + }{d_2(Eth_2 Em_2)(C_1 + C_2 + C_3 + C_4)} \\ \dfrac{C_2 V_{n+2} + C_3 V_{pg} + C_4 V_C + Q_{max} + }{d_1(Eth_1 + Em_1)(C_1 + C_2 + C_3 + C_4)} \\ \dfrac{(C_1 + C_3 + C_4)V_{n+2} - C_3 V_{pg} - C_4 V_C - Q_{min} + }{d_2(Eth_2 Em_2)(C_1 + C_2 + C_3 + C_4)} \\ \dfrac{C_{n+2} V_{n+2} + C_{pg} V_{pg} + C_{AA} V_{AA} + Q_{max} + }{d_{n+1} Eth_{n+1}(C_{n+2} + C_{n+1} + C_{pg} + C_{AA})} \\ \dfrac{(C_{n+1} + C_{pg} + C_{AA})V_{n+2} - C_{pg} V_{pg} - C_{AA} V_{AA} - }{Q_{min} - d_{n+2} Eth_{n+2}(C_{n+2} + C_{n+1} + C_{pg} + C_{AA})} \\ \dfrac{(C_{n+1} + C_{n+2} + C_{AA})V_{pg} - C_{n+2} V_{n+2} - C_{AA} V_{AA} - }{Q_{min} - d_{pg} Eth_{pg}(C_{n+2} + C_{n+1} + C_{pg} + C_{AA})} \\ \dfrac{(C_{n+1} + C_{pg} + C_{n+2})V_{AA} - C_{pg} V_{pg} - C_{n+2} V_{n+2} - }{Q_{min} + d_{AA} Eth_{AA}(C_{n+2} + C_{n+1} + C_{pg} + C_{AA})} \\ V_{pass} \end{pmatrix} - \Delta \quad (17)$$

Figure 36:
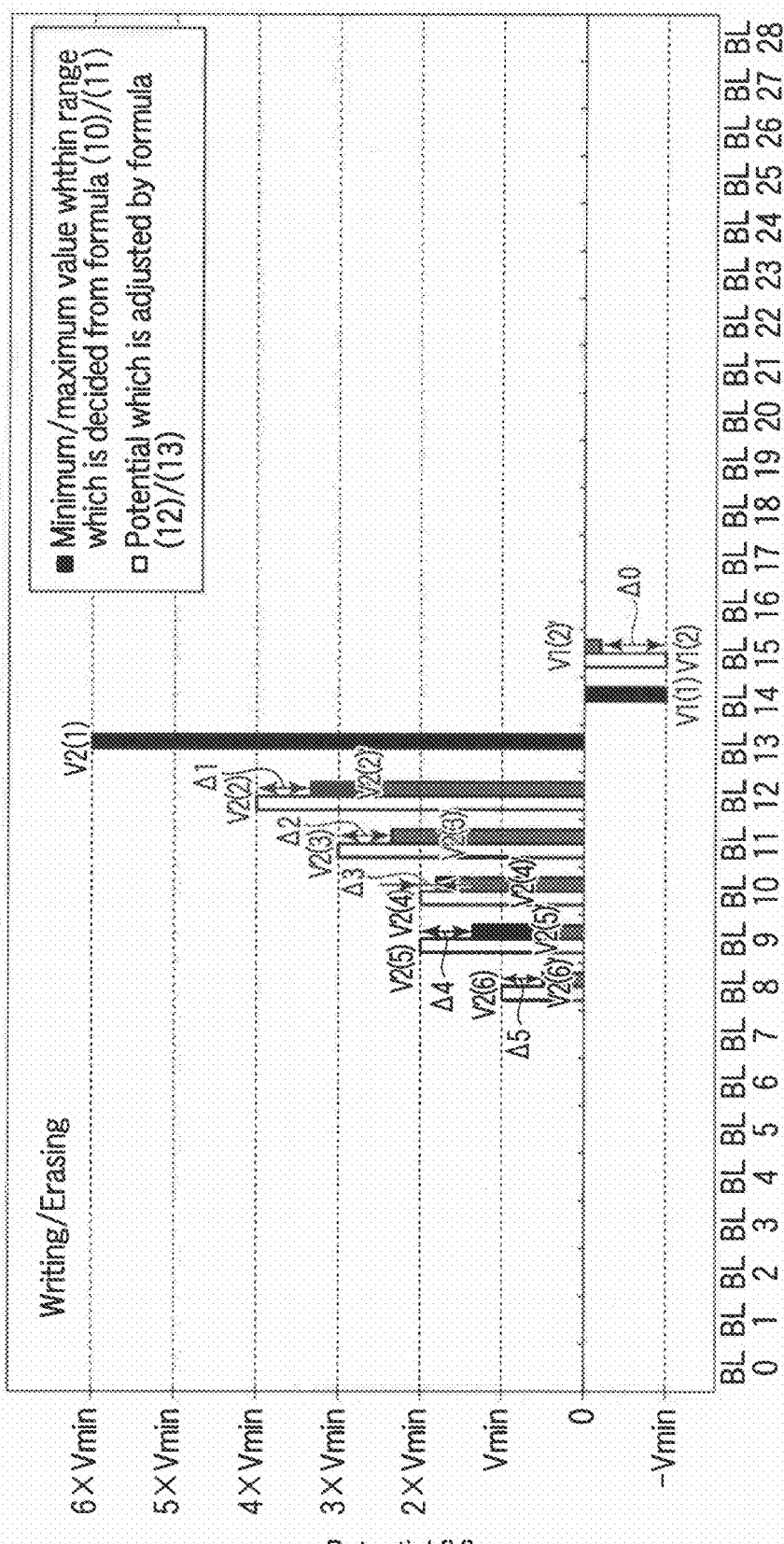
FIG. 36 is a diagram showing a potential of a bit line before or after adjusting by Δ.

FIG. 36 shows potentials before and after adjusted with $\Delta$.

It is assumed that an electric charge is injected into/emitted from the memory cell (floating gate) between bit line BL12 and bit line BL13.

In this case, first, the potential of bit line BL12 is set to V2(1), and the potential of bit line BL13 is set to V1(1). Here, it is assumed that V2(1)>V1(1), and V2(1) and V1(1) are values which can be created by an integrated circuit, that is, k times the value of Vmin or −Vmin.

When the potentials of bit line BL12 and following bit lines BL11, BL10, BL9, BL8, and BL7 are decided as the minimum values within the range of formula (10), V2(2)', V2(3)', V2(4)', V2(5)', and V2(6)' are obtained.

However, these values are not k times the value of Vmin.

Therefore, when the potentials of bit line BL12 and following bit lines BL11, BL10, BL9, BL8, and BL7 are adjusted with $\Delta(\Delta 1, \Delta 2, \Delta 3, \Delta 4,$ and $\Delta 5)$, V2(2), V2(3), V2(4), V2(5), V2(6), . . . are obtained.

These values are k times the value of Vmin.

Similarly, when the potential of bit line BL14 is decided as the maximum value within the range of formula (11), V1(2)' is obtained. However, this value is not k times the value of −Vmin. Thus, when the potential of bit line BL14 is adjusted with $\Delta$ ($\Delta$0) in formula (13), V1(2) is obtained. This value is k times the value of −Vmin.

As described above, based on the potential which can be created by the integrated circuit in the multi-dot flash memory, the potential of the bit line is adjusted with $\Delta$, so that the writing/erasing can be effectively performed.

In addition, while the potentials of the bit lines are converged on 0 V in this example, the potential of the bit line is also adjusted with $\Delta$ similarly when the potentials are converged on Vpass.

(7) Seventh Embodiment

A seventh embodiment relates to a numerical value example.

Electric capacitance $C_n$ is expressed as follows.

$$C_n = (\in \times A_n)/d_n$$

Where $d_n$ is the distance between bit line $BL_n$ and floating gate FG, c is a dielectric constant of the insulating film between bit line $BL_n$ and floating gate FG, and $A_n$ is an area of a side surface of floating gate FG on the side of bit line $BL_n$.

When $\in = 3.54 \times 10^{-11}$ [F/m], $C_n$ is about $2.5297 \times 10^{-19}$ [F].

Electric capacitance $C_{n+1}$ is expressed as follows.

$$C_{n+1} = (\in \times A_{n+1})/d_{n+1}$$

Where $d_{n+1}$ is the distance between bit line $BL_{n+1}$ and floating gate FG, $\in$ is a dielectric constant of the insulating film between bit line $BL_{n+1}$ and floating gate FG, and $A_{n+1}$ is an area of a side surface of floating gate FG on the side of bit line $BL_{n+1}$.

When $\in = 3.54 \times 10^{-11}$ [F/m], $C_{n+1}$ is about $2.5297 \times 10^{-19}$ [F].

Electric capacitance $C_{pg}$ is expressed as follows.

$$C_{pg} = (\in \times A_{pg})/d_{pg}$$

Where $d_{pg}$ is the distance between control gate CG and floating gate FG, $\in$ is a dielectric constant of the insulating film between control gate CG and floating gate FG, and $A_{pg}$ is an area of an upper surface of floating gate FG.

When $\in = 3.54 \times 10^{-11}$ [F/m], $C_{pg}$ is about $1.4757 \times 10^{-19}$ [F].

Electric capacitance $C_{AA}$ is expressed as follows.

$$C_{AA} = (\in \times A_{AA})/d_{AA}$$

Where $d_{AA}$ is the distance between active area AA and floating gate FG, $\in$ is a dielectric constant of the insulating film between active area AA and floating gate FG, and $A_{AA}$ is an area of a lower surface of floating gate FG.

When $\varepsilon=3.54\times10^{-11}$ [F/m], $C_{AA}$ is about $8.8540\times10^{-20}$ [F].

Potential $V_{pg}$ of control gate CG and potential $V_{AA}$ of active area AA are 6 [V], for example. Vpass is 0.5 [V], for example.

The minimum electric charge quantity $Q_{min}$ in floating gate FG is the electric charge quantity when six electrons are emitted from floating gate FG having a predetermined electric charge quantity and is $9.61\times10^{-19}$ [C], for example, and the maximum electric charge quantity $Q_{max}$ in floating gate FG is the electric charge quantity when six electrons are injected to floating gate FG and the predetermined electric charge quantity is provided, and is $-9.61\times10^{-19}$ [C], for example.

Thickness $d_n$ of the insulating film between n-th bit line $BL_n$ and floating gate FG is 3.5 nm, for example, and thickness $d_{n+1}$ of the insulating film between (n+1)-th bit line $BL_{n-1}$ and floating gate FG is 3.5 nm, for example.

Thickness $d_{pg}$ of the insulating film between control gate CG and floating gate FG is 6 nm, for example, and thickness $d_{AA}$ of the insulating film between active area AA and floating gate FG is 10 nm, for example.

The threshold value $Eth_n$ of the electric field intensity in which the transfer of electric charges is generated by the tunneling phenomenon between n-th bit line $BL_n$ and floating gate FG is 10 [MV/cm], for example in an $Si/SiO_2/Si$ structure. This value varies depending on the film quality of the insulating film ($SiO_2$), and a quantity of an impurity doped to bit line $BL_n$ and floating gate FG.

The threshold value $Eth_{n+1}$ of the electric field intensity in which the transfer of electric charge is generated by the tunneling phenomenon between (n+1)-th bit line $BL_{n+1}$ and floating gate FG is 9 [MV/cm], for depending on the film quality of the insulating film ($SiO_2$), and a quantity of an impurity doped to bit line $BL_{n+1}$ and floating gate FG.

Figure 37:
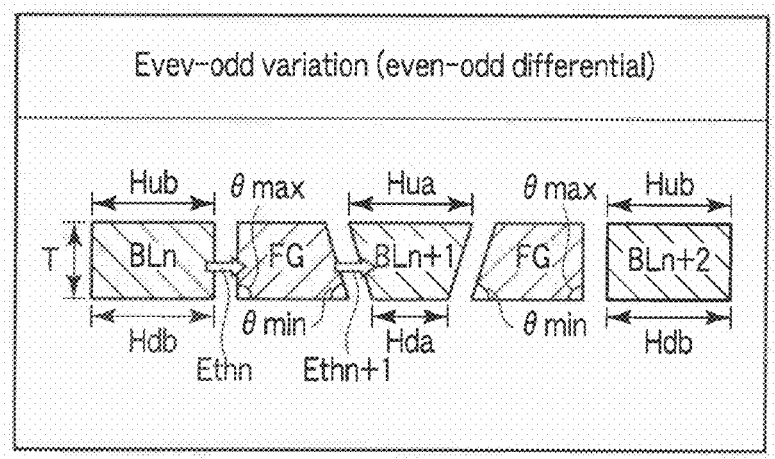
FIG. 37 is a diagram showing an even-odd variation.

The value of $Eth_n$ differs from the value of $Eth_{n+1}$ due to an even-odd variation as shown in FIG. 37, for example. This even-odd variation is mainly generated in the device structure shown in FIGS. 4, 5 and 6.

In FIG. 37, T is a height of bit lines $BL_n$, $BL_{n+1}$, and $BL_{n+2}$.

When a width of each of bit lines $BL_n$, $BL_{n+1}$, and $BL_{n+2}$ is defined as an average value between a width of the upper surface and a width of the lower surface, the width (=(Hub+Hdb)/2) of bit lines $BL_n$ and $BL_{n+2}$ is larger than the width (=(Hua+Hda)/2) of bit line $BL_{n+1}$.

In addition, an angle θmin of an edge of the lower surface of floating gate FG on the side of bit line $BL_{n+1}$ is smaller than an angle θmax of an edge of the lower surface of floating gate FG on the side of bit line $BL_n$ or $BL_{n+2}$. That is, the edge of the lower surface of floating gate FG on the side of bit line $BL_{n+1}$ is an acute angle.

Therefore, in this example, the value of $Eth_{n+1}$ is smaller than the value of $Eth_n$.

The threshold value $Eth_{AA}$ of the electric field intensity in which the transfer of electric charge is generated by the tunneling phenomenon between active area AA and floating gate FG is 10 [MV/cm], for example in the $Si/SiO_2/Si$ structure. This value varies depending on the film quality of the insulating film ($SiO_2$), and a quantity of an impurity doped to active area AA and floating gate FG.

The threshold value $Eth_{pg}$ of the electric field intensity in which the transfer of electric charges is generated by the tunneling phenomenon between control gate CG and floating gate FG is 12 [MV/cm], for example. $Eth_{pg}$ is made greater than $Eth_n$, $Eth_{n+1}$, and $Eth_{AA}$ by differentiating the structure of the insulating film between control gate CG and floating gate FG from the $Si/SiO_2/Si$ structure.

6. Bias Condition in Writing/Erasing

Figure 38:
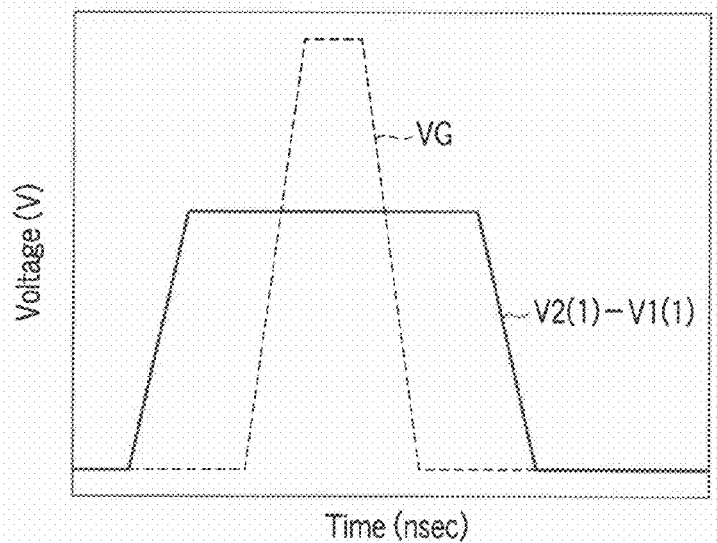
FIG. 38 is a timing in which a gate potential is applied.

FIG. 38 shows an example of a bias condition at the time of writing/erasing.

In this drawing, VG is a gate potential, and V2(1)-V1(1) is a voltage between the two bit lines sandwiching the selected floating gate as the target of the writing/erasing.

This example is characterized in that the potential is applied to the two bit line, and then gate potential VG is applied to the word line over the selected floating gate.

For example, at the time of writing, V2(1)-V1(1) is raised from 0 V to 3 V, and then potential VG is raised from 0 V to 5 V. The writing is executed in this state. Then, potential VG is lowered from 5 V to 0 V, and then V2(1)-V1(1) is lowered from 3 V to 0 V.

Figure 39:
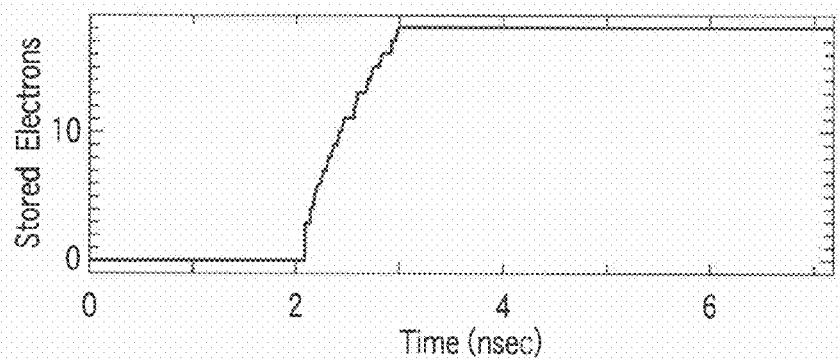
FIG. 39 is a diagram showing an increase of a charge amount in a floating gate.

FIG. 39 shows a writing simulation under the bias condition in FIG. 38.

In this drawing, a horizontal axis shows time, and a vertical axis shows the number of electrons stored in the floating gate.

Before gate potential VG is applied (0-2 nsec), an electron is not injected in the floating gate. While gate potential VG is raised from 2 nsec to 3 nsec, electrons are injected into the floating gate one by one according to the rise of gate potential VG.

Thus, the fact that electrons are injected one by one means that the writing is implemented by a monoelectron effect in this cell structure. Here, it is to be noted that the size of the floating gate used in this simulation is 5 nm×5 nm×5 nm.

7. Data Retention Characteristic

Figure 40:
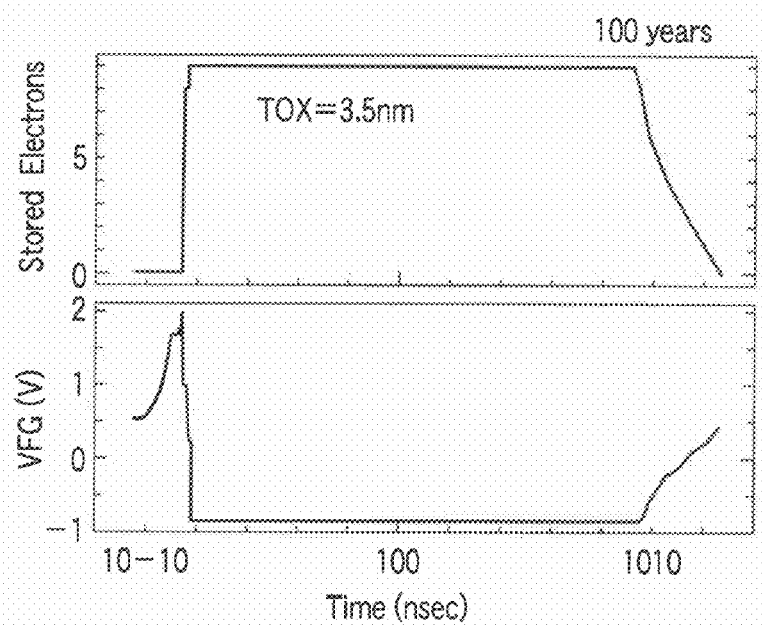
FIG. 40 is a diagram showing a charge retention characteristic.

FIG. 40 shows an electron retention characteristic (data retention characteristic).

The electron retention characteristic is an index showing how long the electrons injected into the floating gate can be retained.

According to this cell structure, when thickness Tox of the tunnel insulating film is 3.5 nm, a certain amount of charges can be kept retained in the floating gate for about 100 years. Here, it is to be noted that this is estimated under the condition that a charge trap is not generated in the tunnel insulating film.

Thus, a description will be made of the charge retention characteristic when the charge trap is generated in the tunnel insulating film, in the writing/erasing methods in the cell structure according to the present invention.

Figure 41:
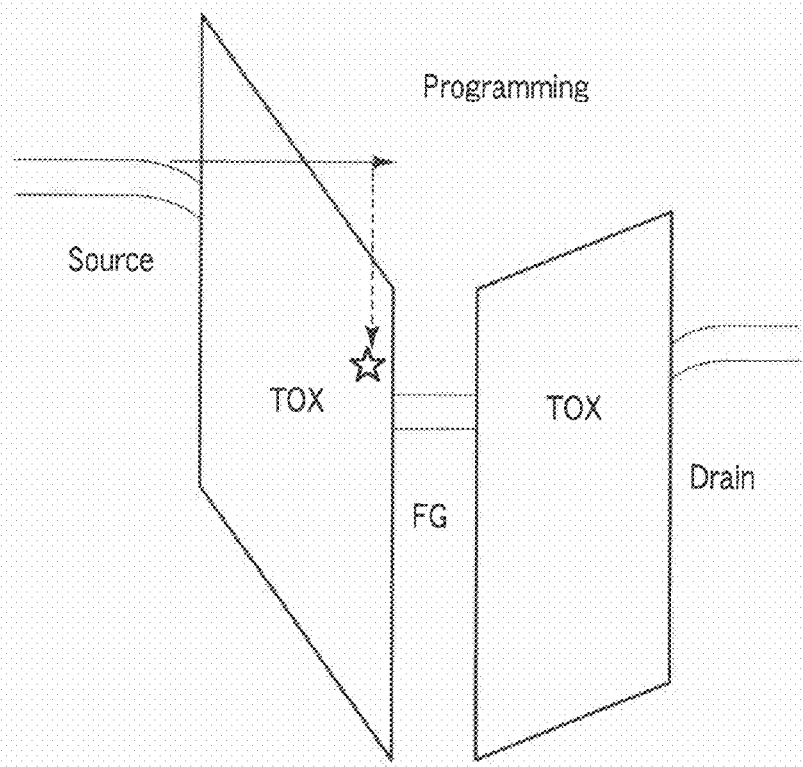
FIG. 41 is a diagram showing a charge trap in a write operation.
Figure 42:
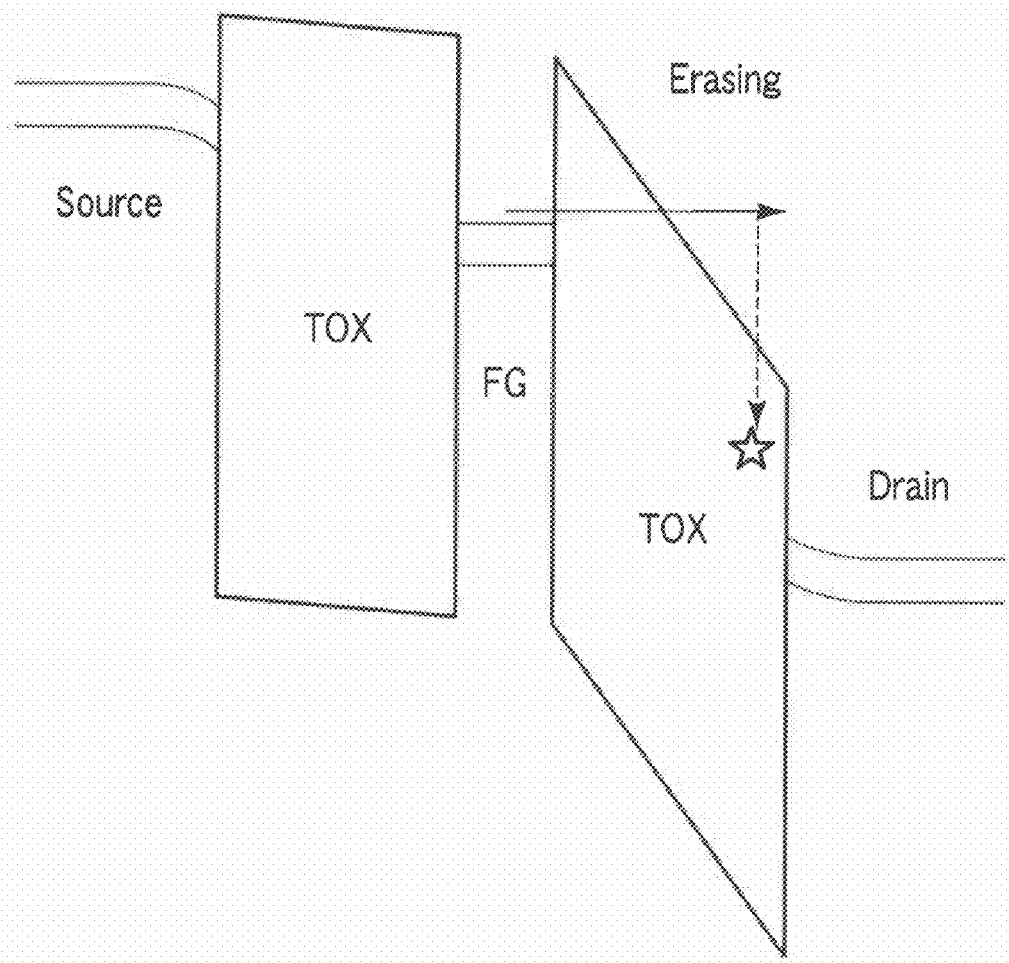
FIG. 42 is a diagram showing a charge trap in an erase operation.

FIG. 41 shows a mechanism of charge trap generation at the time of writing. FIG. 42 shows a mechanism of charge trap generation at the time of erasing.

General non-volatile semiconductor memories use the same tunnel insulating film at the time of writing/erasing. Therefore, a trap level is generated on each side of the tunnel insulating film. When it is assumed that the trap level is generated within a range of 25% of the whole thickness on each side of the tunnel insulating film, a part which functions as the tunnel insulating film actually is about 50% of the whole thickness of the tunnel insulating film.

Meanwhile, the multi-dot flash memory according to the present invention is characterized in that the tunnel insulating film used at the time of writing and the tunnel insulating film used at the time of erasing are different from each other as described above.

In this case, as shown in FIG. 41, the trap level is generated only on one side of the tunnel insulating film used at the time of writing. Therefore, when it is assumed that the trap level is generated within a range of 25% of the whole thickness on one side of the tunnel insulating film, a part functioning as the tunnel insulating film actually is 75% of the whole thickness of the tunnel insulating film.

Similarly, as shown in FIG. 42, the trap level is generated only on one side of the tunnel insulating film used at the time of erasing. Therefore, when it is assumed that the trap level is generated within a range of 25% of the whole thickness on one side of the tunnel insulating film, a part functioning as the tunnel insulating film actually is 75% of the whole thickness of the tunnel insulating film.

Consequently, according to the cell structure in the present invention, since the part functioning as the tunnel insulating film actually can be increased as compared with the cell structure of the general nonvolatile semiconductor memory, it has the advantage in thinning the tunnel insulating film.

In addition, since the gate insulating film and the tunnel insulating film are completely separated, the threshold window is not narrowed even after repeating the writing/erasing.

In addition, since the memory cell according to the present invention is characterized in that there are two kinds of tunnel insulating film, it is preferable that one tunnel insulating films is used for writing and the other is used for erasing to solve the problem in reliability.

8. Read Operation

Next, an example of a read operation will be described.

Figure 43:
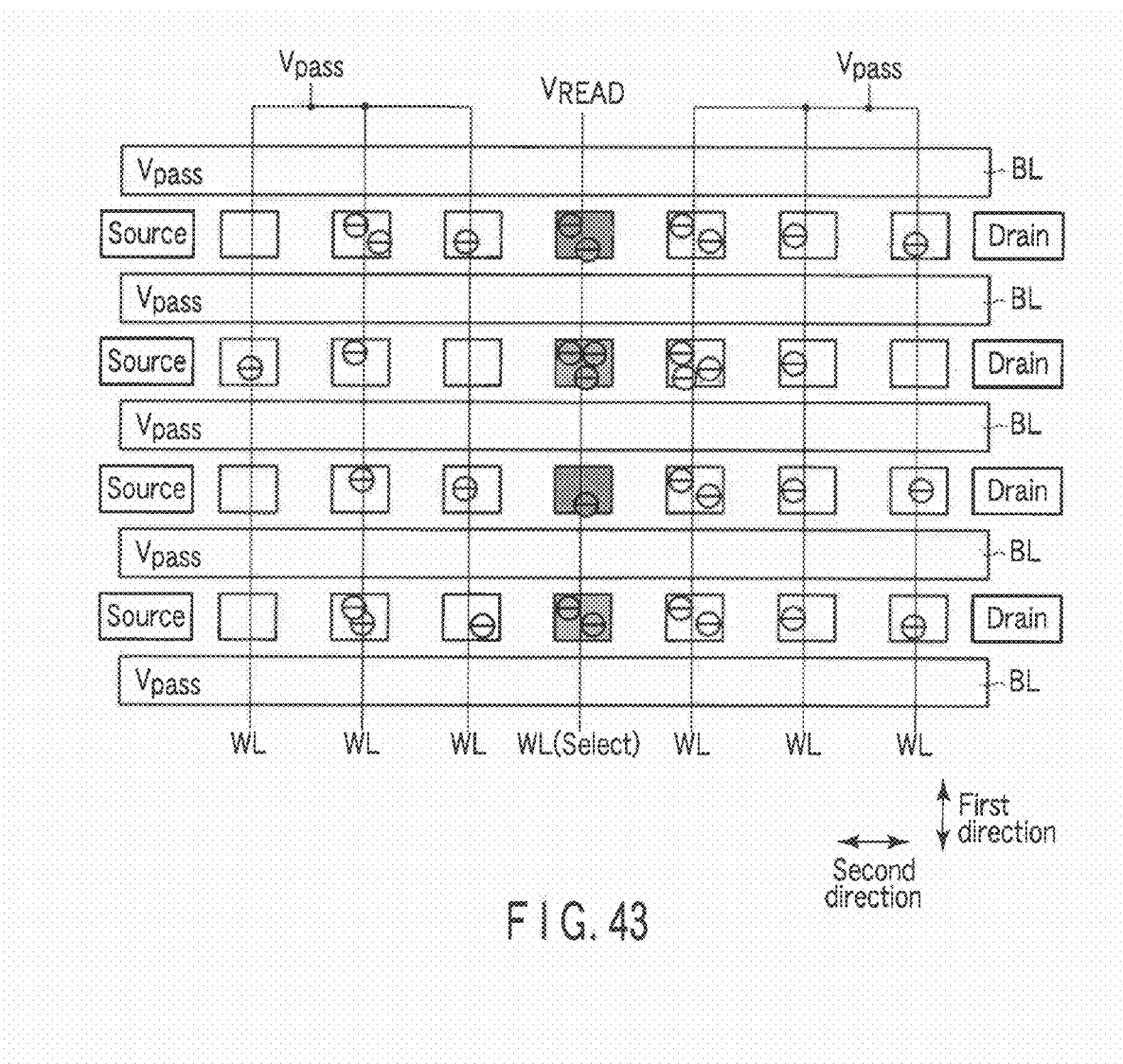
FIG. 43 is a diagram showing an example of a read operation.

FIG. 43 shows an example of the read operation.

When data of memory cells aligned in the center, that is, a charge amount stored in the floating gates (gray parts) is read, word line WL (Select) existing above them is set to VREAD, and other word lines WL, . . . are set to Vpass. In addition, bit lines BL, . . . existing on the right and left sides of the floating gates are set to Vpass also.

VREAD is set such that on/off of the memory cell can be determined according to the charge amount in the floating gate, and Vpass is set such that the memory cell is always turned on regardless of the charge amount in the floating gate. For example, their relation is VREAD<Vpass.

In this state, the data of the memory cells aligned in the center can be read by detecting a cell current flowing between a source region (Source) and a drain region (Drain).

Figure 44:
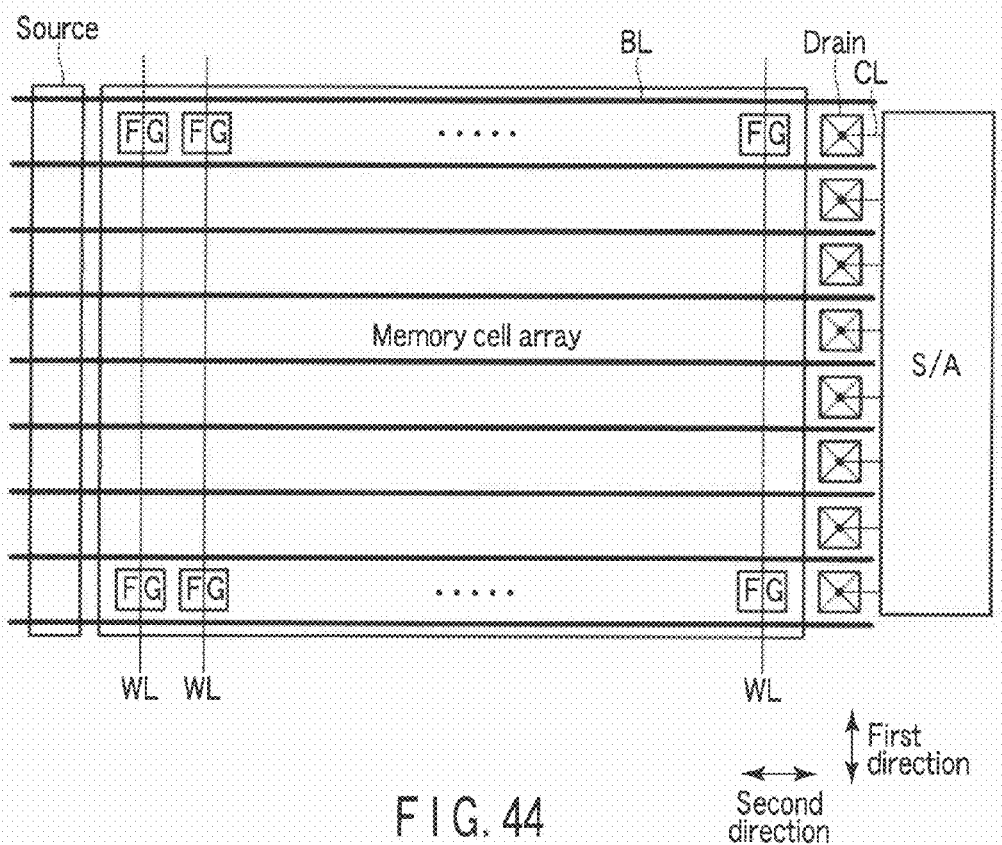
FIGS. 44 and 45 are diagrams, each showing an example of a memory cell array.

Here, when the source region and the drain region are arranged at both ends of the memory cell array as shown in FIG. 44, a conductive line CL to connect the drain region (Drain) and a sense amplifier (S/A), for example is not necessarily arranged in the memory cell array.

In addition, since a select gate transistor is not needed in the memory cell array.

However, in order to increase the capacity of the memory cell array, a great number of memory cells have to be connected between the source region and the drain region. In this case, the resistance between the source region and the drain region is increased at the time of reading, which causes sensitivity to be lowered.

Figure 45:
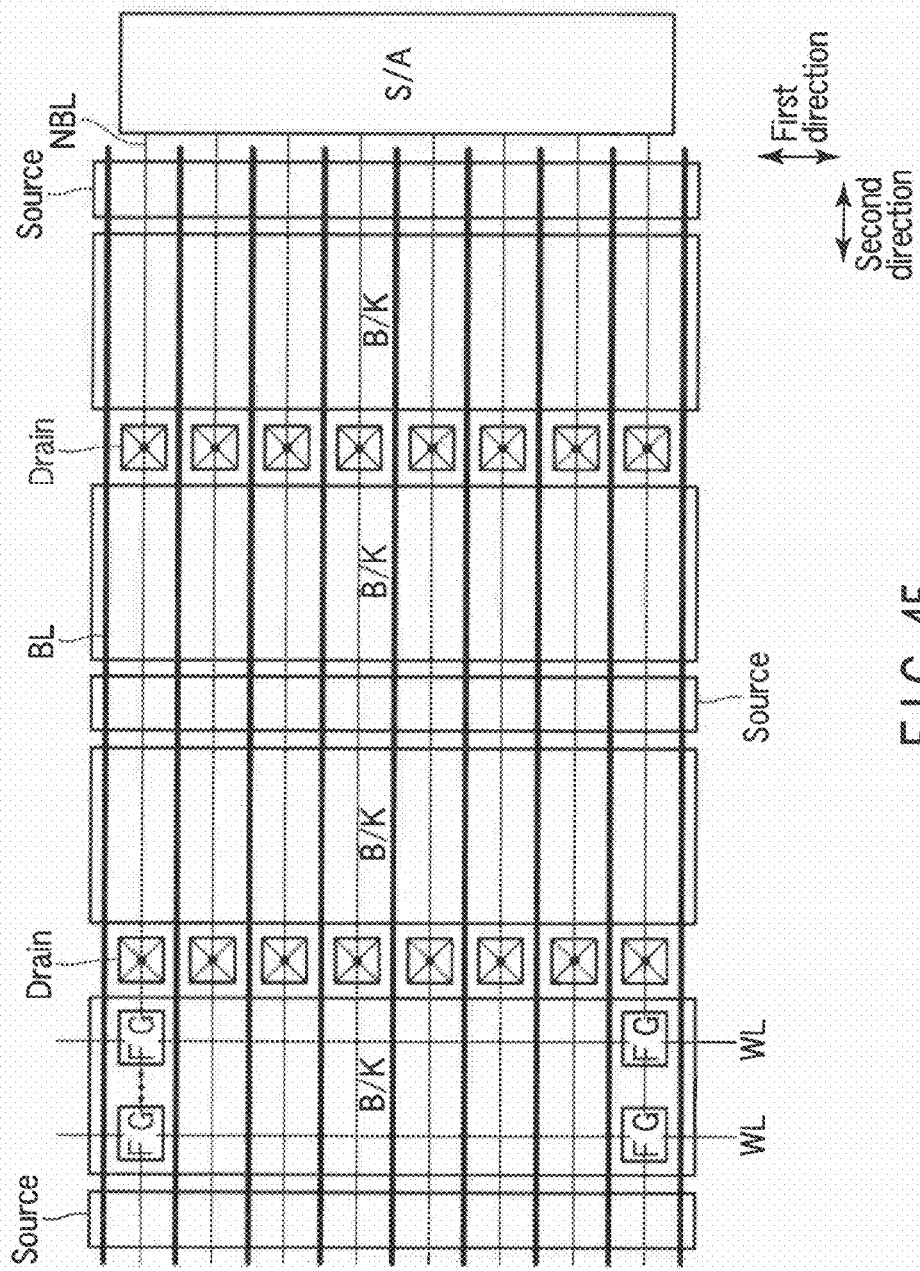

Thus, as shown in FIG. 45, the memory cell array may be divided into blocks. In this case, similar to the NAND type flash memory, new bit lines (conductive line) NBL, . . . extend in a second direction through blocks BK, . . . in the memory cell array. This new bit line NBL connects the drain regions (Drain) in blocks BK, to the sense amplifiers (S/A).

This new bit line NBL is different from bit lines BL existing on the right and left sides of the floating gate.

In addition, when the memory cell array is divided into the blocks as described above, the select gate transistor is needed in the memory cell array.

Figure 47:
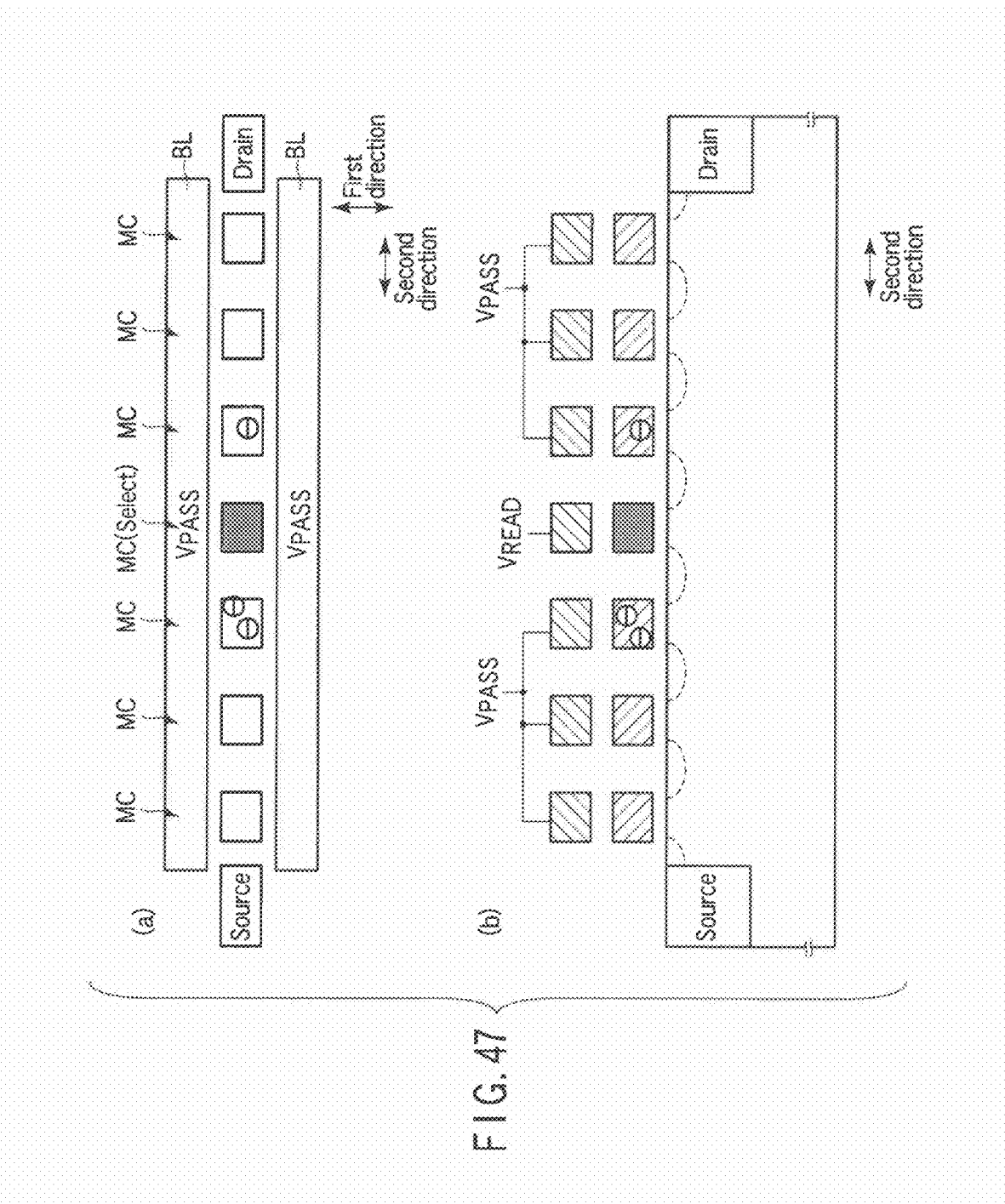

FIGS. 46 and 47 show a NAND string taken out of the memory cell array shown in FIG. 43.

Item (a) in FIGS. 46 and 47 is a plan view showing the NAND string, and Item (b) in FIGS. 46 and 47 is a cross-sectional view showing the NAND string taken along a second direction.

Memory cells MC, . . . are connected in series between the source region (Source) and the drain region (Drain). Although diffusion layers of memory cell MC, . . . are not provided in a semiconductor substrate in this example, diffusion layers (dotted line) of the memory cells MC, . . . may be formed in the semiconductor substrate.

When memory cell MC (Select) in the center of the NAND string is selected, VREAD is applied to word line WL (Select) above selected memory cell MC (Select) and Vpass is applied to other word lines WL.

Memory cell MC (Select) existing in the center of the NAND string in FIG. 46 and memory cell MC (Select) existing in the center in FIG. 47 are commonly connected to word line WL (Select) as is clear from FIG. 43. That is, in the multi-dot flash memory according to the present invention, the data of the memory cells (for one or more pages, for example) can be read at the same time similar to the NAND flash memory.

Figure 48:
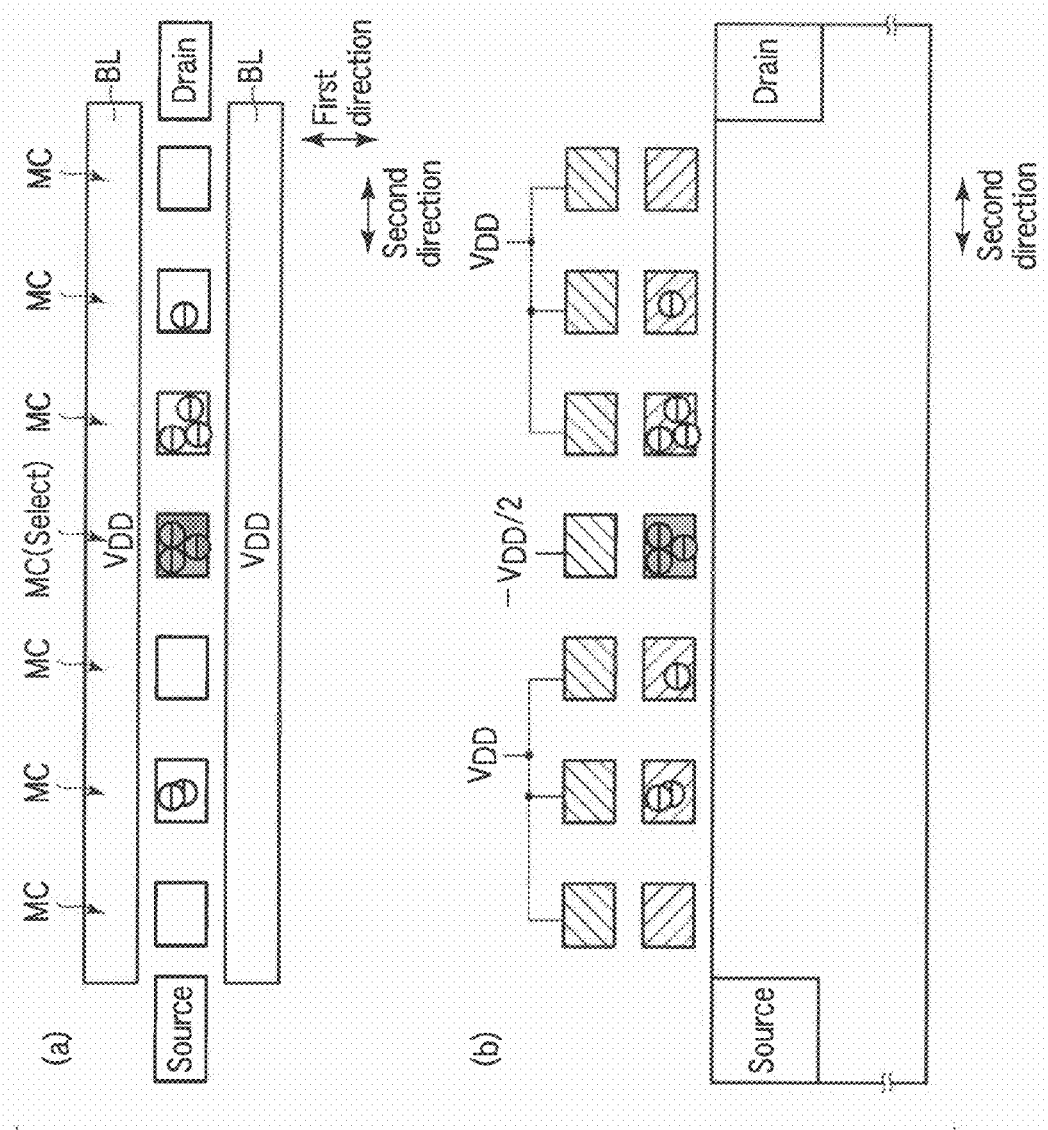

FIG. 48 is a modification example of the read operation. This modification example has characteristics in value of Vpass and VREAD. Vpass is a power supply potential VDD and VREAD is set to −VDD/2. Others are the same as those in FIGS. 43 to 47.

Figure 49:
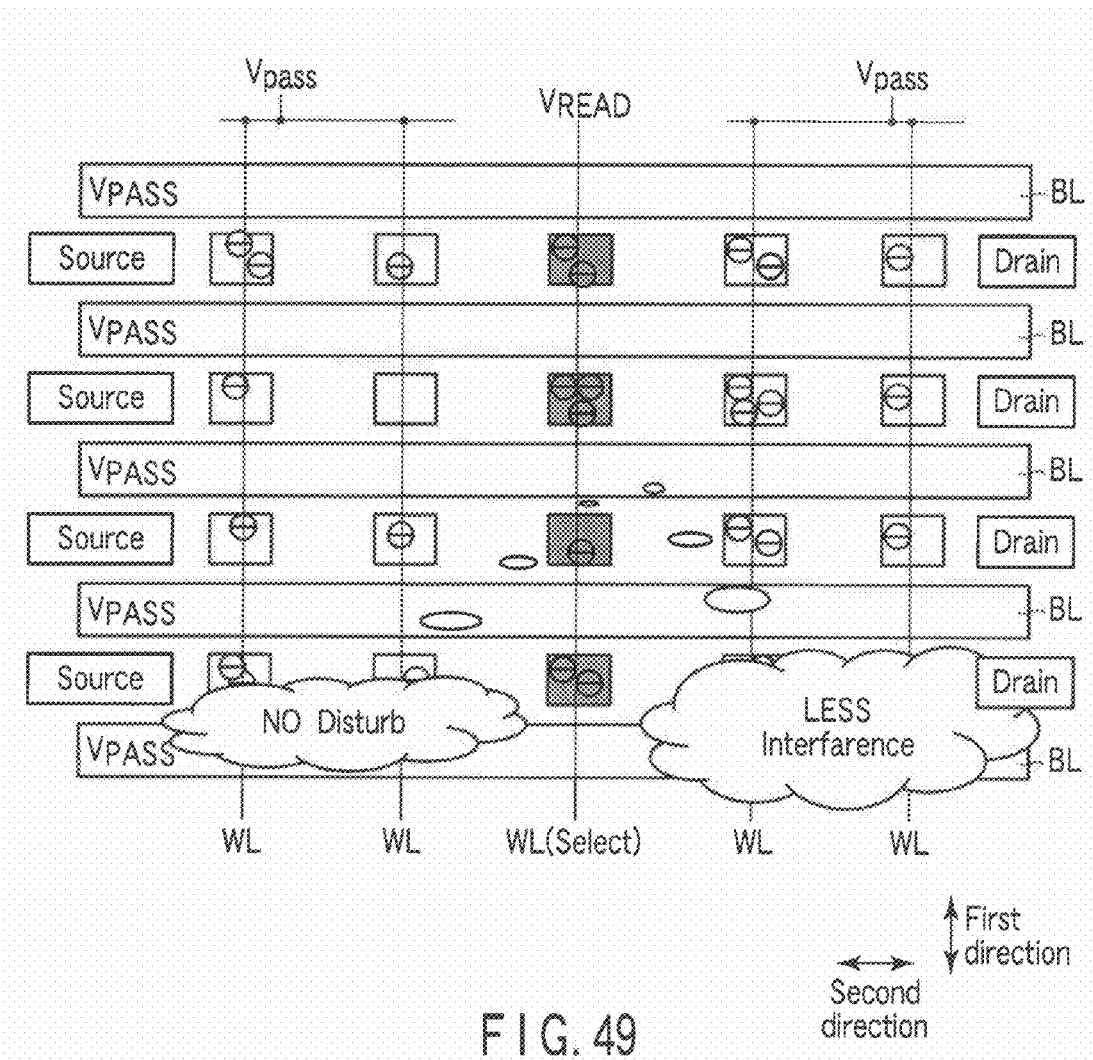

FIG. 49 is a modification example of the NAND string.

This modification example has characteristics in the number of memory cells composing the NAND string. The number of cells in the NAND string is not necessarily five, as a matter of course. This is only one example. Others are the same as those in FIGS. 43 to 47.

In this example, when it is assumed that the width of word line WL is constant, the interference among the word lines can be reduced by increasing the pitch between word lines WL, so that read disturb can be prevented.

9. Three-Dimensional Multi-Dot Flash Memory

The multi-dot flash memory according to the example of the present invention can be three-dimensional.

FIG. 50 shows a three-dimensional multi-dot flash memory.

In this drawing, the memory cell arrays shown in FIGS. 4 to 6 are stacked in a third direction vertical to the surface of a semiconductor substrate.

In order to implement such structure, an active area has to be composed of a semiconductor layer of an SOI substrate. The semiconductor layer is a polycrystalline silicon layer or a monocrystalline silicon layer produced by recrystallizing a polycrystalline silicon layer.

More specifically, the first lowest memory cell array is formed on the SOI substrate, a first insulating film is formed thereon, and a semiconductor layer serving as an active area of a second memory cell array is formed on the first insulating layer.

In addition, third and following memory cell arrays may be formed in the same way as the second memory cell array.

Thus, the multi-dot flash memory can be three-dimensional, and the memory capacity can be further increased.

Figure 51:
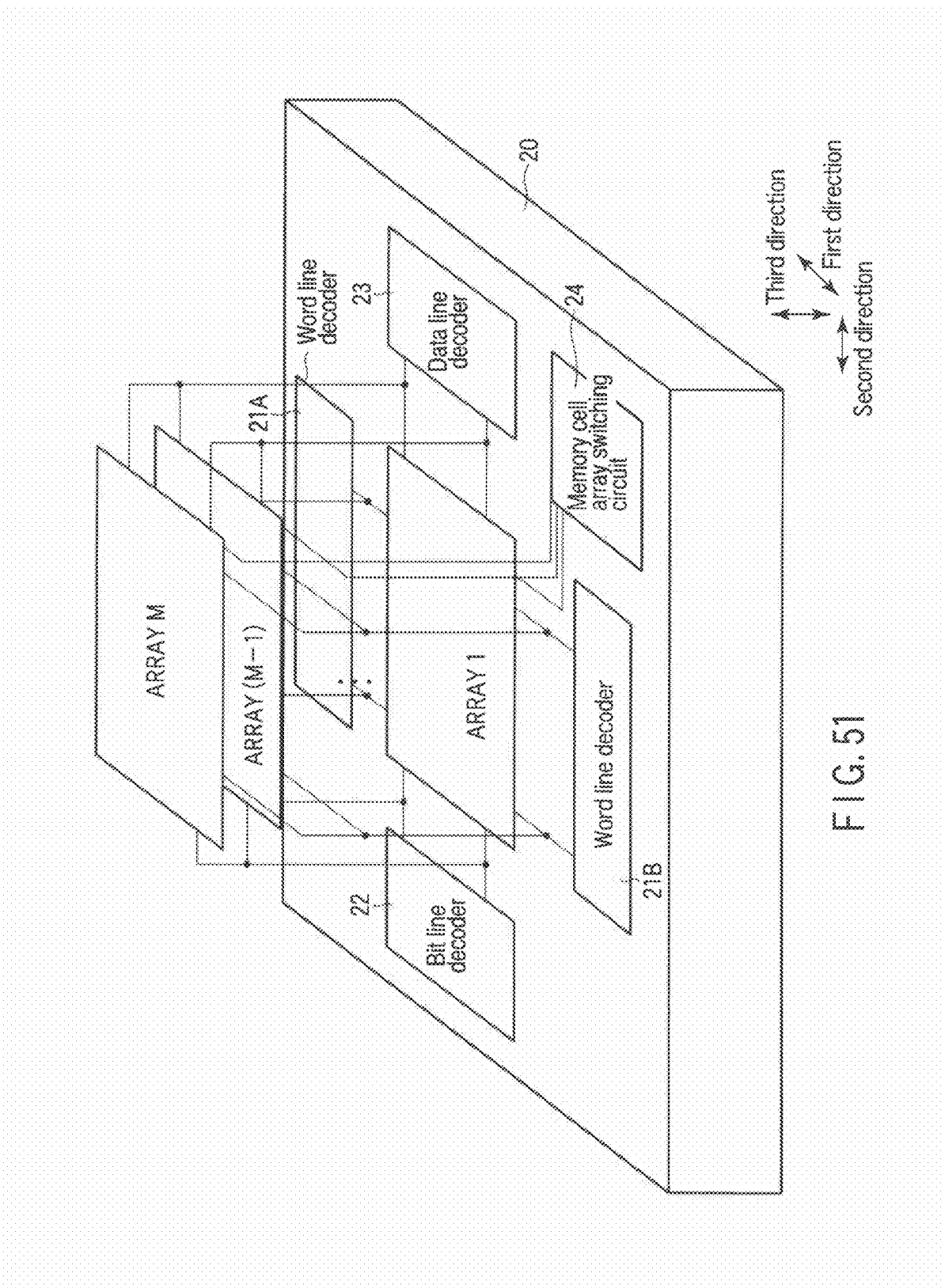

FIG. 51 shows an example of peripheral circuits which drive the memory shown in FIG. 50.

Stacked memory cell arrays ARRAY 1, . . . ARRAY M-1, and ARRAY M are arranged on semiconductor substrate (SOI substrate, for example) 20. The structure of memory cell arrays ARRAY 1, . . . ARRAY M-1, and ARRAY M is the same as that shown in FIG. 50.

In addition, as peripheral circuits, word line decoders 21A and 21B, bit line decoder 22, data line decoder 23, and memory cell array switching circuit (Layer Exchanger) 24 are arranged on semiconductor substrate 20.

Word line decoder 21A is arranged at one end of memory cell arrays ARRAY 1, . . . ARRAY M-1, and ARRAY M in a first direction, and word line decoder 21B is arranged on the other end of memory cell arrays ARRAY 1, . . . ARRAY M-1, and ARRAY M in the first direction. Word line decoders 21A and 21B drive the word line at the time of writing, erasing, and reading.

Bit line decoder 22 is arranged at one end of memory cell arrays ARRAY 1, . . . ARRAY M-1, and ARRAY M in a second direction, and data line decoder 23 is arranged on the other end of memory cell arrays ARRAY 1, . . . ARRAY M-1, and ARRAY M in the second direction.

Bit line decoder 22 drives the bit line at the time of writing/erasing. Data line decoder 23 drives the data line at the time of reading.

Memory cell array switching circuit 24 is connected to each of memory cell arrays ARRAY 1, . . . ARRAY M-1, and ARRAY M.

FIG. 52 shows one memory cell array shown in FIG. 51.

Layer select gate transistors LSG (Layer SG) to select memory cell array ARRAY j are connected between word lines WL in memory cell array ARRAY j and word line decoders 21A and 21B, between bit lines BL in memory cell array ARRAY j and bit line decoder 22, and between drain regions of a NAND string in memory cell array ARRAY j and data line decoder 23.

Layer select gate transistor LSG is turned on and off by memory cell array switching circuit 24.

When memory cell array ARRAY j is selected, layer select gate transistor LSG is turned on, and when memory cell array ARRAY j is not selected, layer select gate transistor LSG is turned off.

For example, one or more memory cell arrays of memory cell arrays ARRAY 1, . . . ARRAY M-1, and ARRAY M stacked on semiconductor substrate 20 shown in FIG. 51 are selected based on each mode of the writing, erasing, and reading.

Figure 53:
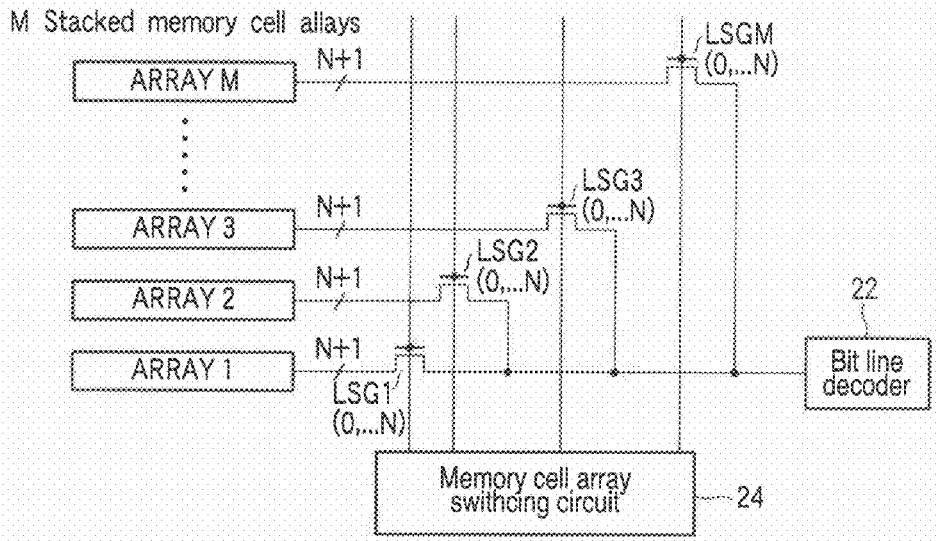

FIG. 53 shows the layer select gate transistor between the bit line decoder and the memory cell arrays.

Each of the memory cell arrays ARRAY 1, . . . ARRAY M-1, and ARRAY M has (N+1) bit line as shown in FIG. 52. LSG M (0, . . . N) means (N+1) layer select gate transistors in M-th memory cell array ARRAY M.

In addition, it is assumed that M is a natural number of 2 or more, and N is a natural number.

Figure 54:
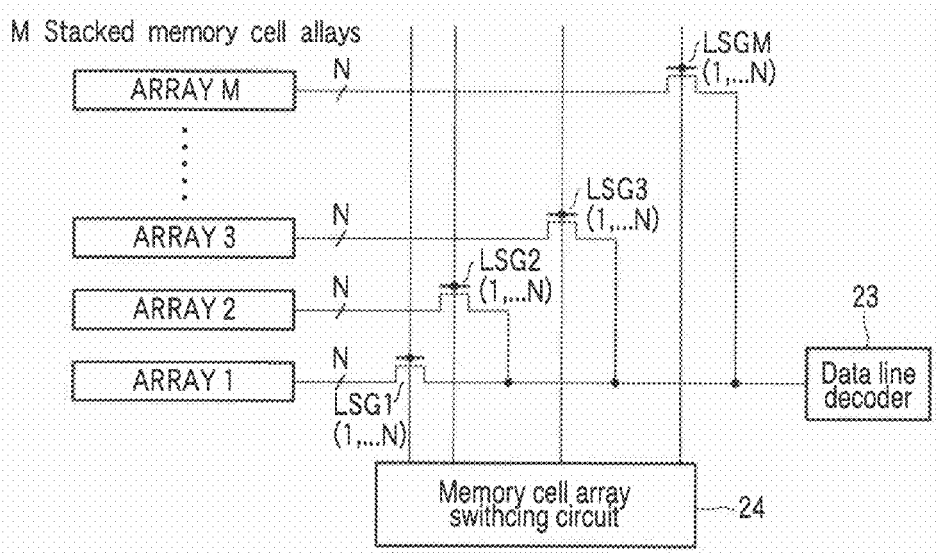

FIG. 54 shows the layer select gate transistors between the data line decoder and the memory cell arrays.

Each of memory cell arrays ARRAY 1, . . . ARRAY M-1, and ARRAY M has N data lines as shown in FIG. 52. LSG M (1, . . . N) means N layer select gate transistors in M-th memory cell array ARRAY M.

In addition, it is assumed that M is a natural number of 2 or more, and N is a natural number.

FIGS. 55 and 56 show the layer select gate transistors between the word line decoder and the memory cell arrays.

Each of memory cell arrays ARRAY 1, . . . ARRAY M-1, and ARRAY M has (N+1) word lines as shown in FIG. 52. In addition, the (N+1) word lines are divided into two as shown in FIG. 52, and one is connected to word line decoder 21A and the other is connected to word line decoder 21B.

LSG M (1, 3, . . . N) in FIG. 55 means [(N+1)/2] layer select gate transistors connected to word line decoder 21A, in M-th memory cell array ARRAY M. In addition, LSG M (0, 2, . . . N−1) in FIG. 56 means [(N+1)/2] layer select gate transistors connected to word line decoder 21B, in M-th memory cell array ARRAY M.

In addition, it is assumed that M is a natural number of 2 or more, and N is a natural number.

10. Manufacturing Method

A method of manufacturing the multi-dot flash memory according to the example of the present invention will be described.

The method of manufacturing that will be described here implements the layout shown in FIG. 45, that is, the structure in which the memory cell array is divided into the blocks and the select gate transistor is connected to the NAND string.

Figure 57:
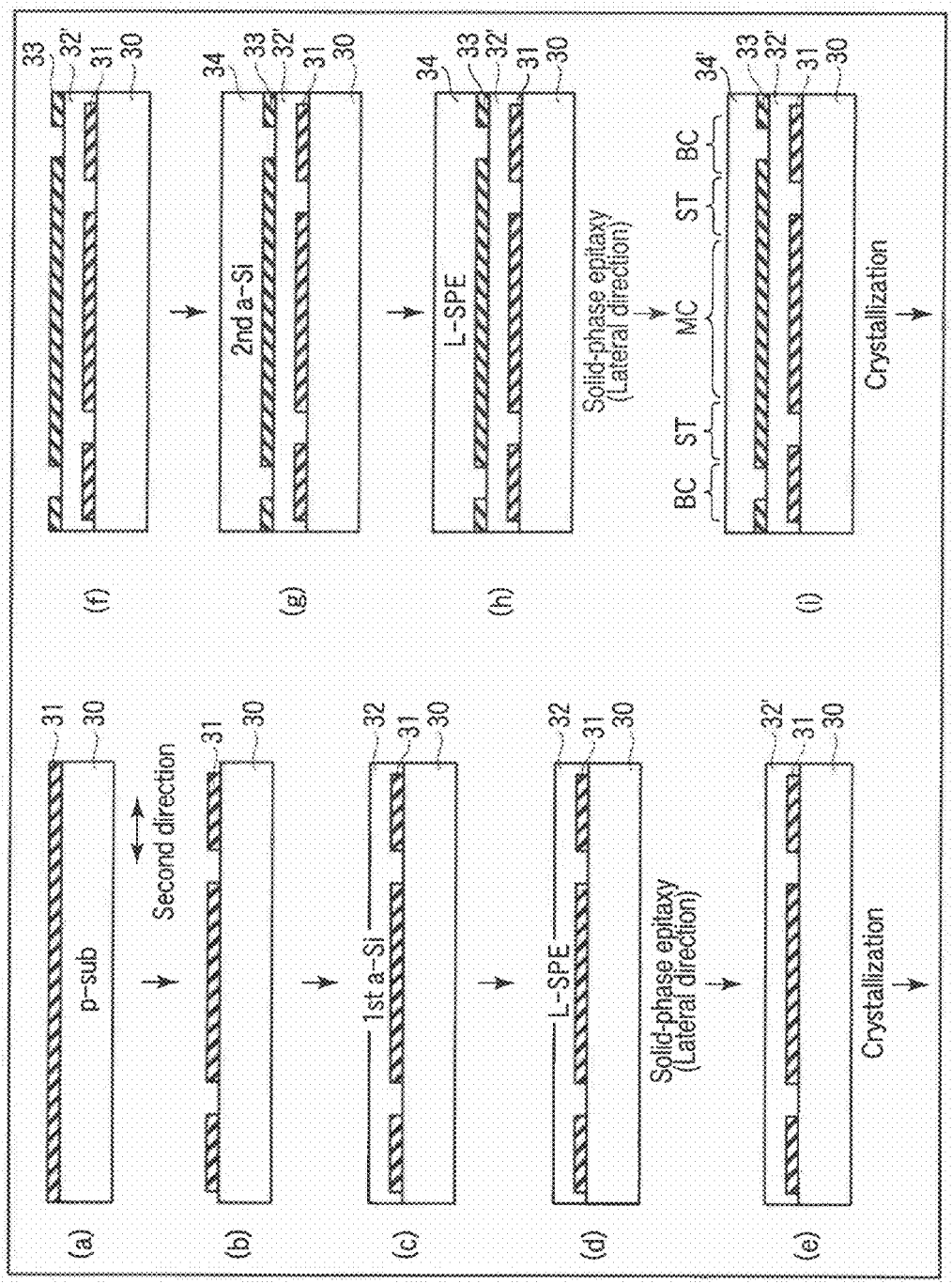
FIG. 57 is a diagram showing a method of manufacturing a double SOI substrate.

FIG. 57 shows a method of manufacturing the multi-dot flash memory.

First, as shown in Item (a) of FIG. 57, first oxide film 31 is formed on P-type silicon substrate (P-sub) 30. In addition, as shown in Item (b) of FIG. 57, an opening is formed in first oxide film 31 at a region in which a select gate transistor is formed.

Then, as shown in Item (c) of FIG. 57, first amorphous silicon (1th a-Si) 32 is deposited on P-type silicon substrate 30 and first oxide film 31, and as shown in Item (d) of FIG. 57, first amorphous silicon 32 is grown laterally by solid-phase epitaxy (L-SPE).

In addition, as shown in Item (e) of FIG. 57, first amorphous silicon 32 is crystallized and silicon film 32' is formed. As shown in Item (f) of FIG. 57, second oxide film 33 is formed on silicon film 32' and an opening is formed in second oxide film 33 at a region in which a bit line contact is formed.

Then, as shown in Item (g) of FIG. 57, second amorphous silicon (2nd a-Si) 34 is deposited on silicon film 32' and second oxide film 33, and as shown in Item (h) of FIG. 57, second amorphous silicon 34 is grown laterally by solid-phase epitaxy (L-SPE). In addition, as shown in Item (i) of FIG. 57, the second amorphous silicon is crystallized and silicon film 34' is formed.

Here, in Item (i) of FIG. 57, "BC" designates a region in which a bit line contact is formed, "ST" designates a region in which a select gate transistor is formed, and "MC" designates a region in which a memory cell is formed.

The structure (double SOI structure) in which two silicon films 32' and 34' are stacked with the insulating film interposed therebetween is completed through the above steps.

The multi-dot flash memory according to the present invention is formed using this double SOI structure.

Figure 58:
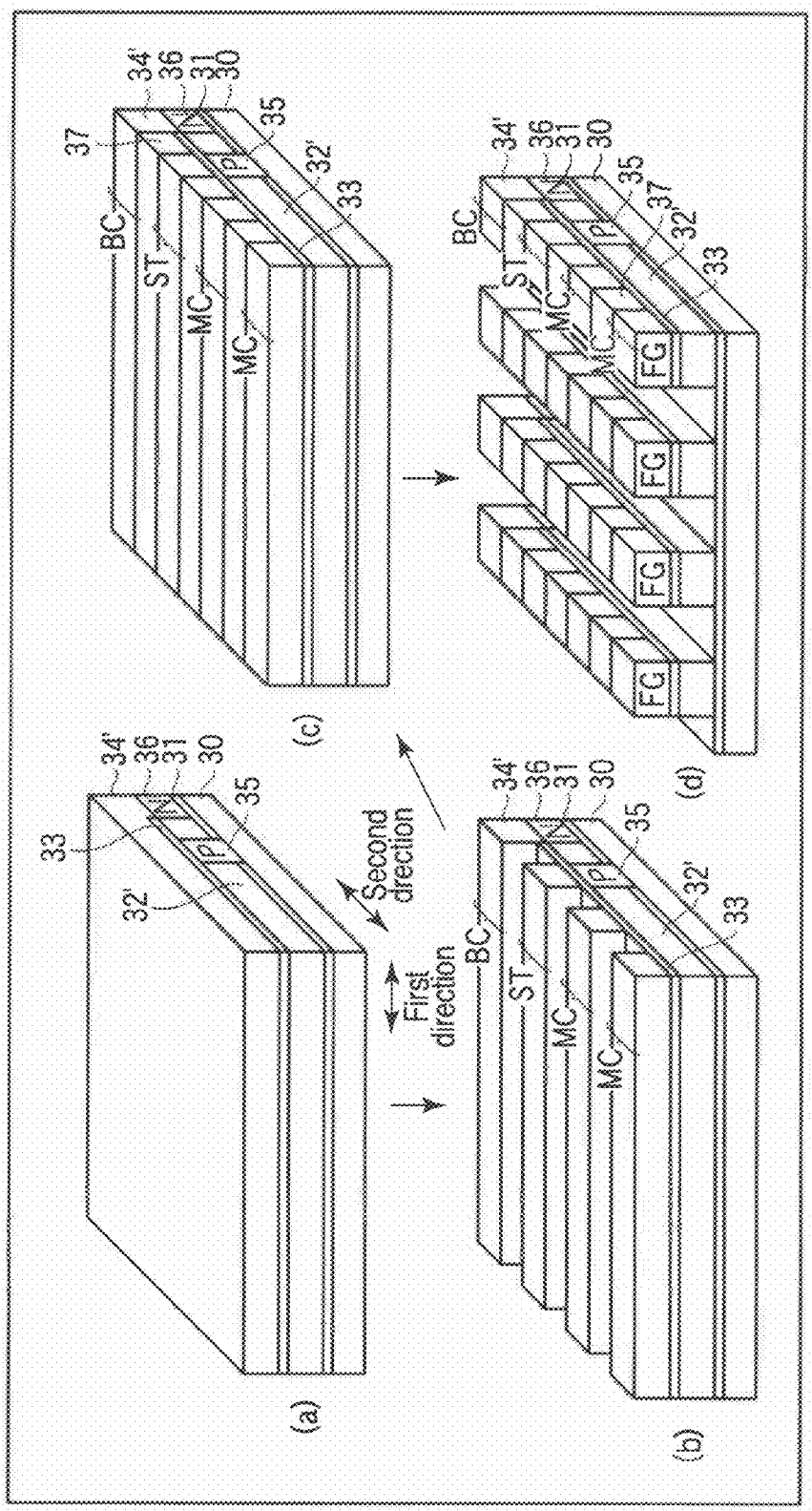
FIGS. 58 and 59 are diagrams, each showing a method of manufacturing a device of a present invention.

Item (a) of FIG. 58 is a birds-eye view showing a peripheral part of the bit line contact in the double SOI structure shown in Item (i) of FIG. 57.

Item (a) of FIG. 58 is different from Item (i) of FIG. 57 in that P-type diffusion layer 35 is provided in silicon film 32' at a region in which the select gate transistor is formed, and N-type diffusion layer 36 is provided in silicon film 32' at a region in which the bit line contact is formed.

P-type diffusion layer 35 becomes a channel region of the select gate transistor, and N-type diffusion layer 36 becomes a drain diffusion layer in a NAND string. P-type diffusion layer 35 and N-type diffusion layer 36 are formed by ion implantation after forming silicon film 32'.

Then, as shown in Item (b) of FIG. 58, a line-and-space patterned photoresist is formed and silicon film 34' is etched using the photoresist as a mask and line-and-space patterned silicon film 34' extending in a first direction is formed. Then, the photoresist is removed.

Then, as shown in Item (c) of FIG. 58, the space between line-and-space patterned silicon film 34' is filled with insulating film 37 by CVD method, and insulating film 37 is polished until the upper surface of insulating film 37 becomes the same level as the upper surface of silicon film 34' by CMP method.

In addition, as shown in Item (d) of FIG. 58, a fine line-and-space hard mask pattern is formed by the side-wall spacer lithography process, and insulating film 37, silicon film 34', second oxide film 33, and silicon film 32' are sequentially etched using the hard mask pattern as a mask.

As a result, line-and-space patterned active areas AA, . . . are composed of silicon film 32' and extend in a second direction. In addition, floating gates FG, . . . are formed above active areas AA, . . . with second oxide film (gate insulating film) 33 interposed therebetween.

N-type diffusion layer 36 in silicon film 32' is in contact with silicon film 34' in bit line contact region BC.

After the process in Item (d) of FIG. 58, an even-odd variation is generated in the shape of floating gate FG through the side-wall spacer lithography process.

However, the even-odd variation is not shown in the drawing to describe the method of manufacturing mainly and eliminate the complication in the drawing.

The actual shape of floating gate FG is as shown in FIGS. 4 to 6.

Figure 59:
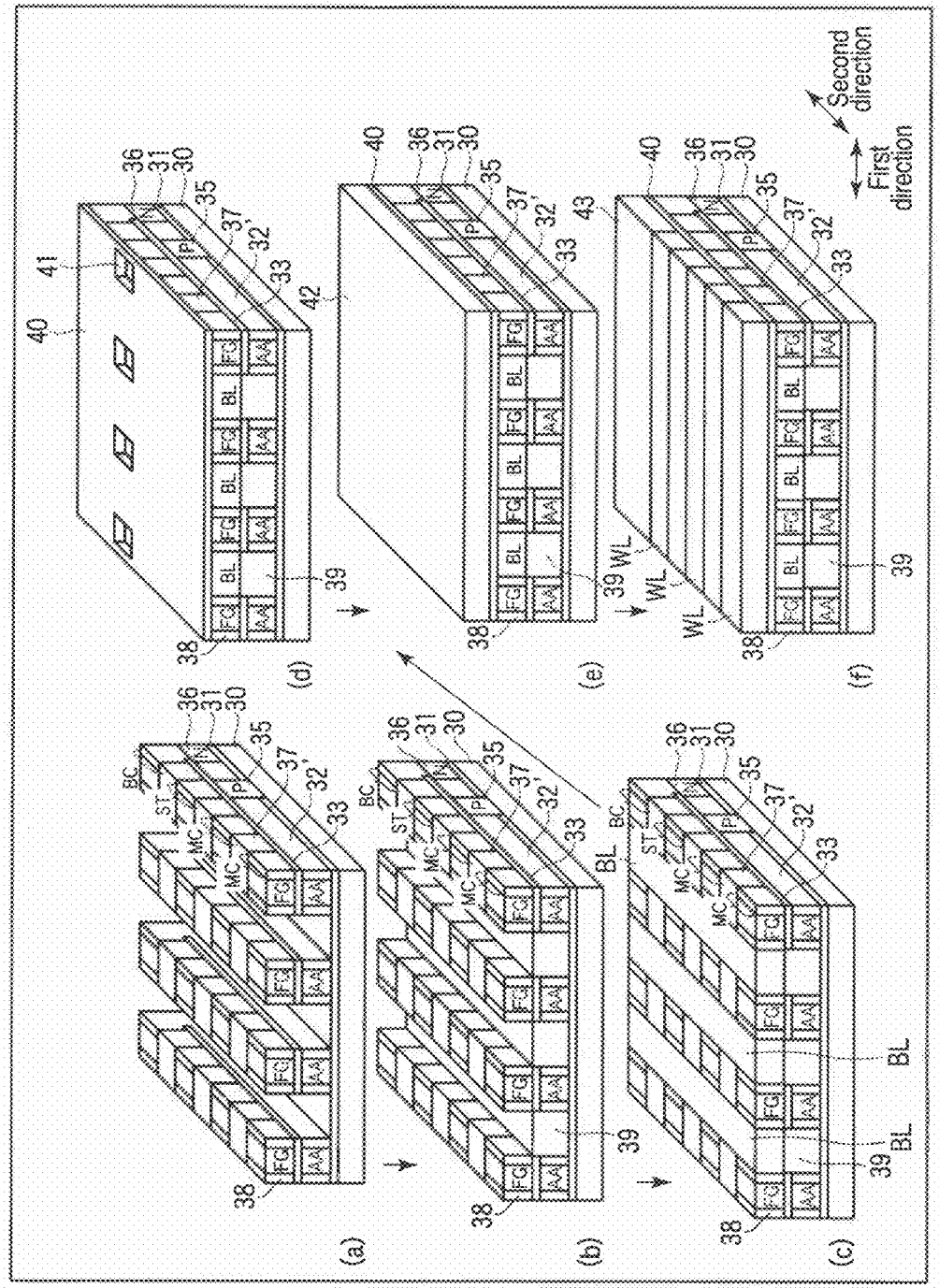

Then, as shown in Item (a) of FIG. 59, side-wall thermally-oxidized film 38 is formed on the side surfaces of active areas AA, . . . and floating gates FG, . . . by a thermal oxidization method. Side-wall oxide film 38 becomes a tunnel insulating film that is used at the time of writing or erasing.

In addition, as shown in Item (b) of FIG. 59, the spaces between active areas AA, . . . are filled with insulating film 39.

Then, as shown in Item (c) of FIG. 59, the spaces between floating gates FG, . . . are filled with a conductive material by CVD method, and the conductive material is polished until the upper surface of the conductive material becomes the same level as the upper surface of floating gates FG, . . . by CMP method.

As a result, bit lines BL extending in a second direction is formed between floating gates FG, . . . .

Then, as shown in Item (d) of FIG. 59, inter-electrode insulating film 40 is formed on floating gates FG, . . . and bit lines BL, . . . . In addition, a part of inter-electrode insulating film 40 is removed at a region in which a select gate transistor is formed and opening 41 is formed.

Then, as shown in Item (e) of FIG. 59, conductive material 42 is formed on inter-electrode insulating film 40 by CVD method.

In addition, as shown in Item (f) of FIG. 59, a line-and-space patterned photoresist is formed and conductive material 42 shown in Item (e) of FIG. 59 is etched using the photoresist as a mask, and line-and-space patterned word lines WL, . . . extending in a first direction is formed. Then, the photoresist is removed.

In addition, the spaces between word lines WL, . . . are filled with insulating film 43 by CVD method, and insulating film 43 is polished until the upper surface of insulating film 43 becomes the same level as the upper surface of word lines WL, . . . by CMP method.

Finally, as shown in FIG. 60, an interlayer insulating film (not shown) is formed on word lines WL, . . . and insulating film 43, and bit line contact 44 that is electrically connected to N-type diffusion layer (drain diffusion layer) 36 through silicon film 34' is formed.

Here, bit line contact 44 is electrically connected to conductive line CL shown in FIG. 45, for example. The term "bit line contact" is for the NAND flash memory, and not for the bit line of the multi-dot flash memory according to the present invention.

FIG. 61 shows a cross-sectional view of a device structure completed by the above-described method of manufacturing.

As is clear from this drawing, the cross section along a second direction (direction of the bit line) of the multi-dot flash memory in the present invention is almost the same as that of the NAND flash memory. That is, development cost can be lowered by applying the technology of manufacturing the NAND flash memory thereto.

In addition, the materials of the insulating film and conductive film can be appropriately selected in the above-described method of manufacturing based on a device specification. In addition, a nitride film and an oxynitride film may be used instead of the oxide film.

In addition, the structure can be modified such that a polysilicon layer serving as the control gate is formed just under the word line, or the word lines are formed into a three-dimensional houndstooth check.

In addition, the floating gate may not be the silicon dot. The floating gate may be formed into a dot shape with silicide, metal, and nonmetal. As for the size of the dot, as long as it is 30 nm×30 nm×30 nm or less, the multi-dot flash memory according to the principle of the present invention can be implemented.

Furthermore, the size of the floating gate is preferably 20 nm×20 nm×20 nm or less when the mono-electron effect is used. With the mono-electron effect, the multi-dot flash memory can have high variation resistance.

However, even when the size is larger than 20 nm×20 nm×20 nm and the mono-electron effect cannot be used, the new architecture (FIGS. 56 and 65) proposed by the present invention can be implemented.

The select gate transistor can be omitted, in which case it is preferable that the SOI structure is employed and the thickness of the semiconductor layer on the insulating film is thinner than the depth of the source/drain diffusion layer.

11. Conclusion

According to the present invention, a low power consumption in a writing/erasing is realized by a new memory cell array architecture of the multi-dot flash memory.

The present invention has excellent merits in industries such as a high-speed random writable file memory, a digital video camera recorder requiring high-speed random writing, a high-speed downloadable mobile terminal, a high-speed downloadable mobile player, a semiconductor memory for a broadcasting device, a drive recorder, a home video, a large-capacity communicating buffer memory, a semiconductor memory for a security camera and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A multi-dot flash memory comprising:
active areas arranged in a first direction, which extend to a second direction crossed to the first direction, the first and second direction being parallel to a surface of a semiconductor substrate;

floating gates arranged in the first direction, which are provided above the active areas;

a word line provided above the floating gates, which extends to the first direction;

bit lines provided between the floating gates, which extend to the second direction; and a control circuit which controls potentials of the bit lines in a writing/erasing, wherein the control circuit sets a potential $V_{n+1}$ of (n+1)-th bit line from a selected floating gate as a target of the writing/erasing to a value within a range of $$\max \begin{pmatrix} C_n V_n + C_{pg} V_{pg} + C_{AA} V_{AA} + Q_{min} - \\ \dfrac{d_{n+1} Eth_{n+1}(C_n + C_{n+1} + C_{pg} + C_{AA})}{C_n + C_{pg} + C_{AA}}, \\ (C_{n+1} + C_{pg} + C_{AA}) V_n - C_{pg} V_{pg} - C_{AA} V_{AA} - \\ \dfrac{Q_{max} - d_n Eth_n(C_n + C_{n+1} + C_{pg} + C_{AA})}{C_{n+1}}, \\ (C_{n+1} + C_n + C_{AA}) V_{pg} - C_n V_n - C_{AA} V_{AA} - \\ \dfrac{Q_{max} - d_{pg} Eth_{pg}(C_n + C_{n+1} + C_{pg} + C_{AA})}{C_{n+1}}, \\ (C_{n+1} + C_{pg} + C_n) V_{AA} - C_{pg} V_{pg} - C_n V_n - \\ \dfrac{Q_{max} - d_{AA} Eth_{AA}(C_n + C_{n+1} + C_{pg} + C_{AA})}{C_{n+1}} \end{pmatrix} < V_{n+1} < V_n$$

when a potential $V_n$ of n-th bit line from the selected floating gate is $V_n>0$, where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA, where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG, where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

2. The memory according to claim 1, wherein each of the floating gates has two side surfaces in the first direction, shapes of the two side surfaces are different from each other, and shapes of the facing surfaces of the floating gates which are adjacent to each other in the first direction are symmetrical.

3. The memory according to claim 1, further comprising source/drain diffusion layers disposed at ends in the second direction of the active areas; and data lines above the word line, which are connected to the source/drain diffusion layers and which extend to the second direction.

4. The memory according to claim 1, wherein an injection and an emission of the charges of the floating gates are executed in unit of one or more charges.

5. A multi-dot flash memory comprising:

active areas arranged in a first direction, which extend to a second direction crossed to the first direction, the first and second direction being parallel to a surface of a semiconductor substrate;

floating gates arranged in the first direction, which are provided above the active areas;

a word line provided above the floating gates, which extends to the first direction;

bit lines provided between the floating gates, which extend to the second direction; and a control circuit which controls potentials of the bit lines in a writing/erasing, wherein the control circuit sets a potential $V_{n+1}$ of (n+1)-th bit line from a selected floating gate as a target of the writing/erasing to a value within a range of $$V_n < V_{n+1} < \min \begin{pmatrix} C_n V_n + C_{pg} V_{pg} + C_{AA} V_{AA} + Q_{max} + \\ \dfrac{d_{n+1} Eth_{n+1}(C_n + C_{n+1} + C_{pg} + C_{AA})}{C_n + C_{pg} + C_{AA}}, \\ (C_{n+1} + C_{pg} + C_{AA}) V_n - C_{pg} V_{pg} - C_{AA} V_{AA} - \\ \dfrac{Q_{min} + d_n Eth_n(C_n + C_{n+1} + C_{pg} + C_{AA})}{C_{n+1}}, \\ (C_{n+1} + C_n + C_{AA}) V_{pg} - C_n V_n - C_{AA} V_{AA} - \\ \dfrac{Q_{min} + d_{pg} Eth_{pg}(C_n + C_{n+1} + C_{pg} + C_{AA})}{C_{n+1}}, \\ (C_{n+1} + C_{pg} + C_n) V_{AA} - C_{pg} V_{pg} - C_n V_n - \\ \dfrac{Q_{min} + d_{AA} Eth_{AA}(C_n + C_{n+1} + C_{pg} + C_{AA})}{C_{n+1}} \end{pmatrix}$$

when a potential $V_n$ of n-th bit line from the selected floating gate is $V_n<0$, where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA, where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG, where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG.

6. The memory according to claim 5,
wherein each of the floating gates has two side surfaces in the first direction, shapes of the two side surfaces are different from each other, and shapes of the facing surfaces of the floating gates which are adjacent to each other in the first direction are symmetrical.

7. The memory according to claim 5, further comprising source/drain diffusion layers disposed at ends in the second direction of the active areas; and
data lines above the word line, which are connected to the source/drain diffusion layers and which extend to the second direction.

8. The memory according to claim 5,
wherein an injection and an emission of the charges of the floating gates are executed in unit of one or more charges.

9. A multi-dot flash memory comprising:
active areas arranged in a first direction, which extend to a second direction crossed to the first direction, the first and second direction being parallel to a surface of a semiconductor substrate;
floating gates arranged in the first direction, which are provided above the active areas;
a word line provided above the floating gates, which extends to the first direction;
bit lines provided between the floating gates, which extend to the second direction; and
a control circuit which controls potentials of the bit lines in a writing/erasing,
wherein the control circuit sets a potential $V_{n+1}$ of (n+1)-th bit line from one side of a selected floating gate as a target of the writing/erasing to a value within a range of $$V_{n+1} = \max \begin{pmatrix} \dfrac{C_n V_n + C_{pg} V_{pg} + C_{AA} V_{AA} + Q_{min} - d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA}) V_n - C_{pg} V_{pg} - C_{AA} V_{AA} - Q_{max} - d_n Eth_n(C_n + C_{n+1} + C_{pg} + C_{AA})}{C_{n+1}}, \\ \dfrac{(C_{n+1} + C_n + C_{AA}) V_{pg} - C_n V_n - C_{AA} V_{AA} - Q_{max} - d_{pg} Eth_{pg}(C_n + C_{n+1} + C_{pg} + C_{AA})}{C_{n+1}}, \\ \dfrac{(C_{n+1} + C_{pg} + C_n) V_{AA} - C_{pg} V_{pg} - C_n V_n - Q_{max} - d_{AA} Eth_{AA}(C_n + C_{n+1} + C_{pg} + C_{AA})}{C_{n+1}}, \\ 0 \end{pmatrix} + \Delta$$

when a potential $V_n$ of n-th bit line from one side of the selected floating gate is $V_n > 0$, wherein the control circuit set a potential $V_{n+1}$ of (n+1)-th bit line from the other side of the selected floating gate to a value within a range of $$V_{n+1} = \min \begin{pmatrix} \dfrac{C_n V_n + C_{pg} V_{pg} + C_{AA} V_{AA} + Q_{max} + d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA}) V_n - C_{pg} V_{pg} - C_{AA} V_{AA} - Q_{min} + d_n Eth_n(C_n + C_{n+1} + C_{pg} + C_{AA})}{C_{n+1}}, \\ \dfrac{(C_{n+1} + C_n + C_{AA}) V_{pg} - C_n V_n - C_{AA} V_{AA} - Q_{min} + d_{pg} Eth_{pg}(C_n + C_{n+1} + C_{pg} + C_{AA})}{C_{n+1}}, \\ \dfrac{(C_{n+1} + C_{pg} + C_n) V_{AA} - C_{pg} V_{pg} - C_n V_n - Q_{min} + d_{AA} Eth_{AA}(C_n + C_{n+1} + C_{pg} + C_{AA})}{C_{n+1}}, \\ 0 \end{pmatrix} - \Delta$$

when a potential $V_n$ of n-th bit line from the other side of the selected floating gate is $V_n < 0$,
wherein the control circuit decides potentials of the bit lines sequentially from the bit line which is closest to the selected floating gate toward the bit line which is farthest from the selected floating gate,
where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA,
where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG,
where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG,
where $\Delta$ is a adjusting value which set a potential Vbit being applied to the bit lines to Vbit=K×Vmin (K is a natural number), and $0 \leq \Delta \leq$ Vmin.

10. The memory according to claim 9,
wherein each of the floating gates has two side surfaces in the first direction, shapes of the two side surfaces are different from each other, and shapes of the facing surfaces of the floating gates which are adjacent to each other in the first direction are symmetrical.

11. The memory according to claim 9, further comprising source/drain diffusion layers disposed at ends in the second direction of the active areas; and data lines above the word line, which are connected to the source/drain diffusion layers and which extend to the second direction.

12. The memory according to claim 9, wherein an injection and an emission of the charges of the floating gates are executed in unit of one or more charges.

13. A multi-dot flash memory comprising:

active areas arranged in a first direction, which extend to a second direction crossed to the first direction, the first and second direction being parallel to a surface of a semiconductor substrate;

floating gates arranged in the first direction, which are provided above the active areas;

a word line provided above the floating gates, which extends to the first direction;

bit lines provided between the floating gates, which extend to the second direction; and a control circuit which controls potentials of the bit lines in a writing/erasing, and which set the potentials of the bit lines to $V_{pass}$ in a verification after the writing/erasing, wherein the control circuit sets a potential $V_{n+1}$ of (n+1)-th bit line from one side of a selected floating gate as a target of the writing/erasing to a value within a range of $$V_{n+1} = \max \begin{Bmatrix} \dfrac{C_n V_n + C_{pg} V_{pg} + C_{AA} V_{AA} + Q_{min} - d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{max} - d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{max} - d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{max} - d_{AA} Eth_{AA}(C_n + C_{n+1} + C_{pg} + C_{AA})}{C_{n+1}}, \\ V_{pass} \end{Bmatrix} + \Delta$$

when a potential $V_n$ of n-th bit line from one side of the selected floating gate is $V_n > V_{pass}$, wherein the control circuit set a potential $V_{n+1}$ of (n+1)-th bit line from the other side of the selected floating gate to a value within a range of $$V_{n+1} = \min \begin{Bmatrix} \dfrac{C_n V_n + C_{pg} V_{pg} + C_{AA} V_{AA} + Q_{max} + d_{n+1} Eth_{n+1}(C_n + C_{n+1} + C_{pg} + C_{AA})}{C_n + C_{pg} + C_{AA}}, \\ \dfrac{(C_{n+1} + C_{pg} + C_{AA})V_n - C_{pg} V_{pg} - C_{AA} V_{AA} - Q_{min} + d_n Eth_n(C_n + C_{n+1} + C_{pg} + C_{AA})}{C_{n+1}}, \\ \dfrac{(C_{n+1} + C_n + C_{AA})V_{pg} - C_n V_n - C_{AA} V_{AA} - Q_{min} + d_{pg} Eth_{pg}(C_n + C_{n+1} + C_{pg} + C_{AA})}{C_{n+1}}, \\ \dfrac{(C_{n+1} + C_{pg} + C_n)V_{AA} - C_{pg} V_{pg} - C_n V_n - Q_{min} + d_{AA} Eth_{AA}(C_n + C_{n+1} + C_{pg} + C_{AA})}{C_{n+1}}, \\ V_{pass} \end{Bmatrix} - \Delta$$

when a potential $V_n$ of n-th bit line from the other side of the selected floating gate is $V_n < V_{pass}$, wherein the control circuit decides potentials of the bit lines sequentially from the bit line which is closest to the selected floating gate toward the bit line which is farthest from the selected floating gate, where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA, where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG, where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG, where $\Delta$ is a adjusting value which set a potential Vbit being applied to the bit lines to Vbit=K×Vmin (K is a natural number), and $0 \leq \Delta \leq$ Vmin.

14. The memory according to claim 13, wherein each of the floating gates has two side surfaces in the first direction, shapes of the two side surfaces are different from each other, and shapes of the facing surfaces of the floating gates which are adjacent to each other in the first direction are symmetrical.

15. The memory according to claim 13, further comprising source/drain diffusion layers disposed at ends in the second direction of the active areas; and data lines above the word line, which are connected to the source/drain diffusion layers and which extend to the second direction.

16. The memory according to claim 13, wherein an injection and an emission of the charges of the floating gates are executed in unit of one or more charges.

17. A multi-dot flash memory comprising:
active areas arranged in a first direction, which extend to a second direction crossed to the first direction, the first and second direction being parallel to a surface of a semiconductor substrate;
floating gates arranged in the first direction, which are provided above the active areas;
a word line provided above the floating gates, which extends to the first direction;
bit lines provided between the floating gates, which extend to the second direction; and
a control circuit which controls potentials of the bit lines in a writing/erasing, and which set the potentials of the bit lines to $V_{pass}$ in a verification after the writing/erasing,
wherein the control circuit sets a potential $V_{n+1}$ of (n+1)-th bit line from a first or second floating gate as a target of the writing/erasing to a value within a range of $$V_{n+1} = \max \left( \begin{array}{c} \frac{C_n V_n + C_{pg} V_{pg} + C_{AA} V_{AA} + Q_{min} - d_{n+1} Eth_{n+1}(C_n + C_{n+1} + C_{pg} + C_{AA})}{C_n + C_{pg} + C_{AA}}, \\ \frac{(C_{n+1} + C_{pg} + C_{AA})V_n - C_{pg}V_{pg} - C_{AA}V_{AA} - Q_{max} - d_n Eth_n(C_n + C_{n+1} + C_{pg} + C_{AA})}{C_{n+1}}, \\ \frac{(C_{n+1} + C_n + C_{AA})V_{pg} - C_n V_n - C_{AA}V_{AA} - Q_{max} - d_{pg} Eth_{pg}(C_n + C_{n+1} + C_{pg} + C_{AA})}{C_{n+1}}, \\ \frac{(C_{n+1} + C_{pg} + C_n)V_{AA} - C_{pg}V_{pg} - C_n V_n - Q_{max} - d_{AA} Eth_{AA}(C_n + C_{n+1} + C_{pg} + C_{AA})}{C_{n+1}}, \\ \frac{C_{n+2} V_{n+2} + C_{pg} V_{pg} + C_{AA} V_{AA} + Q_{min} - d_{n+1} Eth_{n+1}(C_{n+2} + C_{n+1} + C_{pg} + C_{AA})}{C_n + C_{pg} + C_{AA}}, \\ \frac{(C_{n+1} + C_{pg} + C_{AA})V_{n+2} - C_{pg}V_{pg} - C_{AA}V_{AA} - Q_{max} - d_{n+2} Eth_{n+2}(C_{n+2} + C_{n+1} + C_{pg} + C_{AA})}{C_{n+1}}, \\ \frac{(C_{n+1} + C_{n+2} + C_{AA})V_{pg} - C_{n+2}V_{n+2} - C_{AA}V_{AA} - Q_{max} - d_{pg} Eth_{pg}(C_{n+2} + C_{n+1} + C_{pg} + C_{AA})}{C_{n+1}}, \\ \frac{(C_{n+1} + C_{pg} + C_{n+2})V_{AA} - C_{pg}V_{pg} - C_{n+2}V_{n+2} - Q_{max} - d_{AA} Eth_{AA}(C_{n+2} + C_{n+1} + C_{pg} + C_{AA})}{C_{n+1}}, \\ V_{pass} \end{array} \right) + \Delta$$

when a potential $V_n$ of n-th bit line from the first floating gate among a half of the first floating gate side of the bit lines which is disposed between the first and second floating gates is $V_n > V_{pass}$, and a potential $V_n$ of n-th bit line from the second floating gate among a half of the second floating gate side of the bit lines which is disposed between the first and second floating gates is $V_n > V_{pass}$;

wherein the control circuit set a potential $V_{n+1}$ of (n+1)-th bit line from a first or second floating gate as a target of the writing/erasing to a value within a range of $$V_{n+1} = \min \left( \begin{array}{c} \frac{C_2 V_n + C_3 V_{pg} + C_4 V_C + Q_{max} + d_1(Eth_1 + Em_1)(C_1 + C_2 + C_3 + C_4)}{C_2 + C_3 + C_4}, \\ \frac{(C_1 + C_3 + C_4)V_n - C_3 V_{pg} - C_4 V_C - Q_{min} + d_2(Eth_2 + Em_2)(C_1 + C_2 + C_3 + C_4)}{C_1}, \\ \frac{C_2 V_{n+2} + C_3 V_{pg} + C_4 V_C + Q_{max} + d_1(Eth_1 + Em_1)(C_1 + C_2 + C_3 + C_4)}{C_2 + C_3 + C_4}, \\ \frac{(C_1 + C_3 + C_4)V_{n+2} - C_3 V_{pg} - C_4 V_C - Q_{min} + d_2(Eth_2 + Em_2)(C_1 + C_2 + C_3 + C_4)}{C_1}, \\ \frac{C_{n+2} V_{n+2} + C_{pg} V_{pg} + C_{AA} V_{AA} + Q_{max} + d_{n+1} Eth_{n+1}(C_{n+2} + C_{n+1} + C_{pg} + C_{AA})}{C_n + C_{pg} + C_{AA}}, \\ \frac{(C_{n+1} + C_{pg} + C_{AA})V_{n+2} - C_{pg}V_{pg} - C_{AA}V_{AA} - Q_{min} - d_{n+2} Eth_{n+2}(C_{n+2} + C_{n+1} + C_{pg} + C_{AA})}{C_{n+1}}, \\ \frac{(C_{n+1} + C_{n+2} + C_{AA})V_{pg} - C_{n+2}V_{n+2} - C_{AA}V_{AA} - Q_{min} - d_{pg} Eth_{pg}(C_{n+2} + C_{n+1} + C_{pg} + C_{AA})}{C_{n+1}}, \\ \frac{(C_{n+1} + C_{pg} + C_{n+2})V_{AA} - C_{pg}V_{pg} - C_{n+2}V_{n+2} - Q_{min} - d_{AA} Eth_{AA}(C_{n+2} + C_{n+1} + C_{pg} + C_{AA})}{C_{n+1}}, \\ V_{pass} \end{array} \right) - \Delta$$

when a potential $V_n$ of n-th bit line from the first floating gate among a half of the first floating gate side of the bit lines which is disposed between the first and second floating gates is $V_n < V_{pass}$, and a potential $V_n$ of n-th bit line from the second floating gate among a half of the second floating gate side of the bit lines which is disposed between the first and second floating gates is $V_n < V_{pass}$;

wherein the control circuit decides potentials of the bit lines between the first and second floating gates sequentially from the bit line which is closest to the first or second floating gate, and $|V_{center} - V_{pass}|$ among absolute values which is obtained by subtracting $V_{pass}$ from the potentials of the bit lines between the first and second floating gates is a minimum value when the potential of the bit line which is disposed at a center of the bit lines between the first and second floating gates is $V_{center}$;

where n is a natural number, $C_n$ is a capacitance between $BL_n$ and FG, $C_{n+1}$ is a capacitance between $BL_{n+1}$ and FG, $C_{pg}$ is a capacitance between CG and FG, $C_{AA}$ is a capacitance between AA and FG, $V_{pg}$ is a potential of CG, and $V_{AA}$ is a potential of AA, where $BL_n$ is the n-th bit line, $BL_{n+1}$ is the (n+1)-th bit line, FG is a floating gate between the $BL_n$ and $BL_{n+1}$, CG is a control gate above FG, and AA is an active area under FG, where $Q_{min}$ is a minimum electric charge quantity, $Q_{max}$ is a maximum electric charge quantity, $Eth_n$ is a threshold value of electric field intensity in which a transfer of electric charges is generated by a tunneling phenomenon between $BL_n$ and FG, $d_n$ is a thickness of an insulating film between $BL_n$ and FG, $Eth_{n+1}$ is a threshold value of electric field intensity in which a transfer of electric charges is generated by a tunneling phenomenon between $BL_{n+1}$ and FG, $d_{n+1}$ is a thickness of an insulating film between $BL_{n+1}$ and FG, $Eth_{pg}$ is a threshold value of electric field intensity in which a transfer of electric charges is generated by a tunneling phenomenon between CG and FG, $d_{pg}$ is a thickness of an insulating film between CG and FG, $Eth_{AA}$ is a threshold value of electric field intensity in which a transfer of electric charges is generated by a tunneling phenomenon between AA and FG, and $d_{AA}$ is a thickness of an insulating film between AA and FG, where $\Delta$ is a adjusting value which set a potential Vbit being applied to the bit lines to Vbit=K×Vmin (K is a natural number), and $0 \leqq \Delta \leqq Vmin$.

18. The memory according to claim 17,
wherein each of the floating gates has two side surfaces in the first direction, shapes of the two side surfaces are different from each other, and shapes of the facing surfaces of the floating gates which are adjacent to each other in the first direction are symmetrical.

19. The memory according to claim 17, further comprising source/drain diffusion layers disposed at ends in the second direction of the active areas; and data lines above the word line, which are connected to the source/drain diffusion layers and which extend to the second direction.

20. The memory according to claim 17,
wherein an injection and an emission of the charges of the floating gates are executed in unit of one or more charges.

* * * * *

UNITED STATES PATENT AND TRADEMARK OFFICE
CERTIFICATE OF CORRECTION

PATENT NO. : 8,295,093 B2
APPLICATION NO. : 12/765478
DATED : October 23, 2012
INVENTOR(S) : Takashi Ichikawa et al.

Page 1 of 1

It is certified that error appears in the above-identified patent and that said Letters Patent is hereby corrected as shown below:

On the title page, Item 73, the Assignee's information is incorrect. Item 73 should read as follows:

--(73) Assignee: Kabushiki Kaisha Toshiba, Tokyo (JP)--

Signed and Sealed this
Thirteenth Day of August, 2013

Teresa Stanek Rea
*Acting Director of the United States Patent and Trademark Office*